(12) United States Patent  
Kurokawa

(10) Patent No.: US 10,079,253 B2  
(45) Date of Patent: Sep. 18, 2018

(54) IMAGING DEVICE AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/456,773

(22) Filed: Mar. 13, 2017

(65) Prior Publication Data

US 2017/0186787 A1 Jun. 29, 2017

Related U.S. Application Data

(63) Continuation of application No. 15/078,741, filed on Mar. 23, 2016, now Pat. No. 9,634,048.

(30) Foreign Application Priority Data

Mar. 24, 2015 (JP) .................................. 2015-060317

(51) Int. Cl.
*G09G 3/32* (2016.01)
*G06F 3/038* (2013.01)
(Continued)

(52) U.S. Cl.
CPC .. *H01L 27/14603* (2013.01); *H01L 27/14616* (2013.01); *H01L 27/14623* (2013.01); *H01L 27/14636* (2013.01); *H01L 27/14665* (2013.01)

(58) Field of Classification Search
CPC ........ H01L 27/14612; H01L 27/14692; H04N 5/378; H04N 5/3696; H04N 5/37452
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Kimberly Rizkallah
*Assistant Examiner* — Brian Turner
(74) *Attorney, Agent, or Firm* — Fish & Richardson P.C.

(57) ABSTRACT

An imaging device with excellent imaging performance is provided. The imaging device has a first circuit including a first photoelectric conversion element and a second circuit including a second photoelectric conversion element. The second circuit is shielded from light. In the imaging device, a current mirror circuit in which a transistor connected to the second photoelectric conversion element serves as an input transistor and a transistor connected to the first photoelectric conversion element serves as an output transistor is formed. With such a configuration, the amount of photocurrent in the first circuit from which the contribution of the dark current of the first photoelectric conversion element has been excluded can be detected.

16 Claims, 47 Drawing Sheets

(51) Int. Cl.
  *G09G 3/30* (2006.01)
  *G09G 3/20* (2006.01)
  *H01L 27/146* (2006.01)

(58) Field of Classification Search
  USPC .............................. 257/229, 292, 43; 345/82
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,687 B2 | 3/2009 | Kimura |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,378,391 B2 | 2/2013 | Koyama et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 8,916,869 B2 | 12/2014 | Koyama et al. |
| 8,928,644 B2 | 1/2015 | Kurokawa et al. |
| 9,099,562 B2 | 8/2015 | Akimoto et al. |
| 9,331,112 B2 | 5/2016 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0017162 A1* | 1/2004 | Sato .................... H01L 27/3276 315/169.3 |
| 2004/0038446 A1 | 2/2004 | Takeda et al. |
| 2004/0127038 A1 | 7/2004 | Carcia et al. |
| 2004/0245532 A1* | 12/2004 | Maeda ................ C09K 11/7734 257/89 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0104851 A1 | 5/2011 | Akimoto et al. |
| 2011/0121290 A1 | 5/2011 | Akimoto et al. |
| 2012/0021345 A1* | 1/2012 | Nukada ................ G03G 5/0614 430/56 |
| 2013/0015326 A1 | 1/2013 | Tamura |
| 2013/0048958 A1* | 2/2013 | Lim .................... H01L 51/0062 257/40 |
| 2013/0088474 A1* | 4/2013 | Wang .................. G09G 3/3258 345/211 |
| 2013/0221856 A1* | 8/2013 | Soto ...................... G06F 3/0412 315/152 |
| 2013/0257288 A1* | 10/2013 | Aurongzeb ........ H05B 33/0896 315/152 |
| 2015/0102207 A1 | 4/2015 | Kurokawa et al. |
| 2015/0145850 A1* | 5/2015 | Rohatgi ................ G09G 3/3233 345/212 |
| 2015/0340513 A1 | 11/2015 | Akimoto et al. |
| 2016/0093652 A1 | 3/2016 | Ikeda et al. |
| 2016/0126275 A1 | 5/2016 | Kurokawa |
| 2016/0133660 A1 | 5/2016 | Inoue et al. |
| 2016/0134789 A1 | 5/2016 | Inoue et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-119711 A | 6/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest Of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., P-9:Numerical Analysis on Temperature Dependence of Characteristics of Amorphous In—Ga—Zn-Oxide TFT—, SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW'06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW'08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 31  32  30

31  35  32

32
31

FIG. 35A1
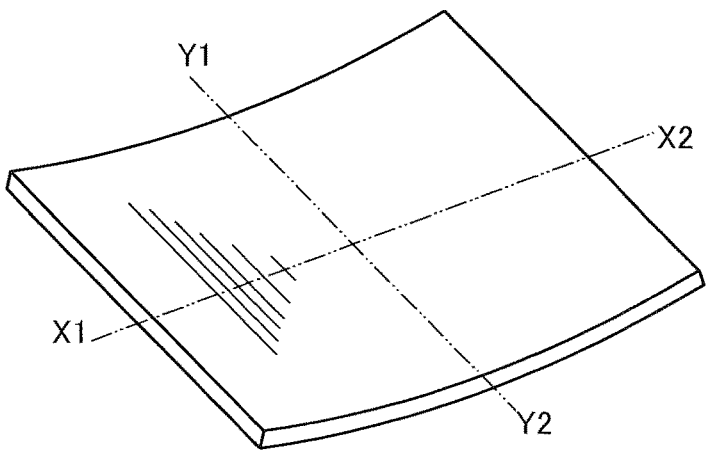
FIG. 35A2
FIG. 35A3
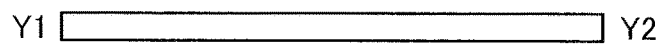
FIG. 35B1
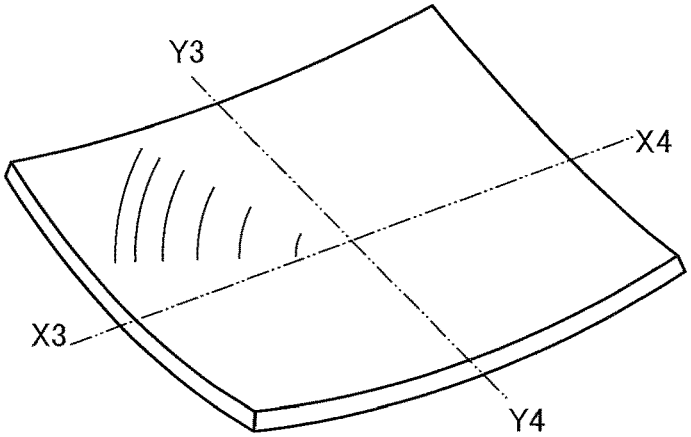
FIG. 35B2
FIG. 35B3
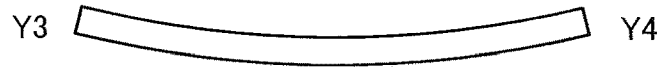

FIG. 36A
FIG. 36B
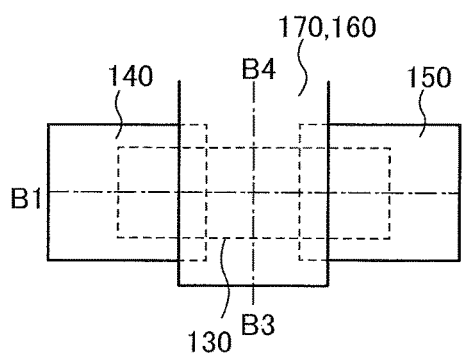
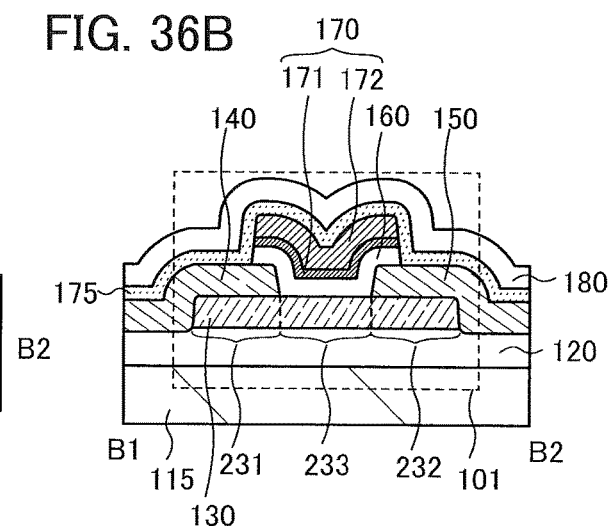
FIG. 36C
FIG. 36D
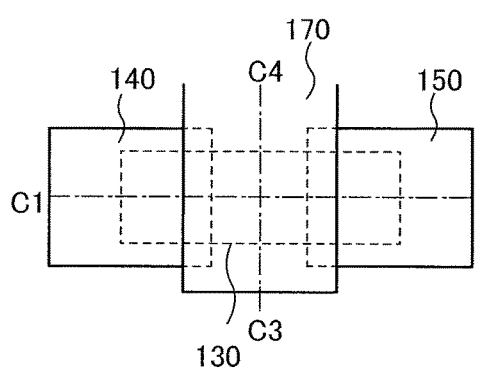
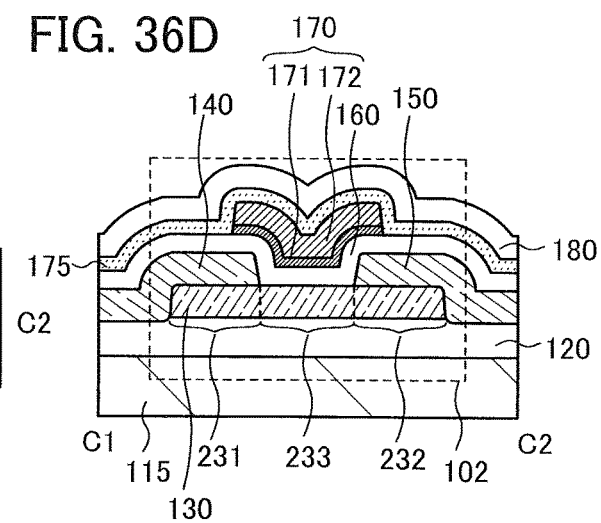
FIG. 36E
FIG. 36F
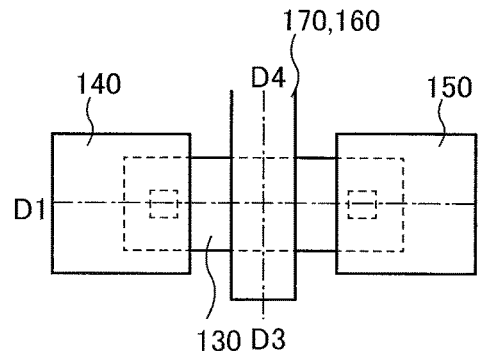
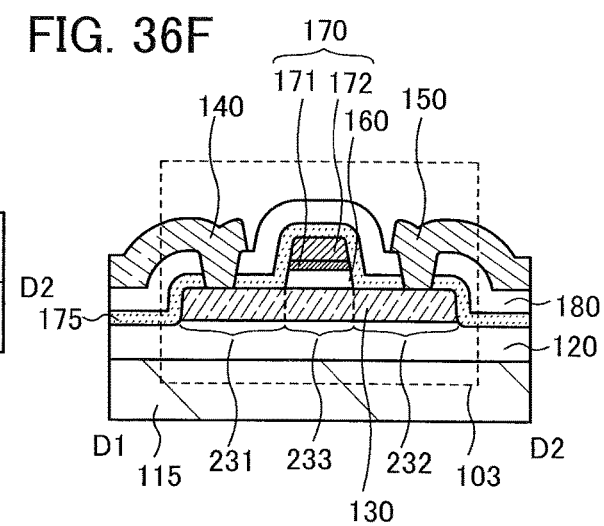

IMAGING DEVICE AND ELECTRONIC DEVICE

CROSS-REFERENCE TO RELATED APPLICATIONS

This application is a continuation of U.S. application Ser. No. 15/078,741, filed Mar. 23, 2016, now allowed, which claims the benefit of a foreign priority application filed in Japan as Serial No. 2015-060317 on Mar. 24, 2015, both of which are incorporated by reference.

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) and a display device. A silicon-based semiconductor is widely known as a semiconductor material applicable to the transistor. As another material, an oxide semiconductor has been attracting attention.

For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor and having extremely low off-state current is used in part of a pixel circuit and a transistor including silicon with which a complementary metal oxide semiconductor (CMOS) circuit can be formed is used in a peripheral circuit.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119711

SUMMARY OF THE INVENTION

To obtain a high-definition image, an image sensor that includes a highly integrated pixel array is needed. To highly integrate pixels, the area per pixel needs to be reduced.

In the case where the area of a pixel is reduced, the light-receiving area of a photoelectric conversion element included in the pixel also needs to be reduced. When the light-receiving area of the photoelectric conversion element is reduced, it might be difficult to perform imaging under a low illuminance condition because of the decrease in sensitivity to light.

In order to solve such a problem, a photoelectric conversion element utilizing avalanche charge multiplication can be effectively used. However, such a photoelectric conversion element has a relatively large dark current, which might cause a deterioration in imaging quality.

In view of the above, an object of one embodiment of the present invention is to provide an imaging device with excellent imaging performance. Another object is to provide an imaging device with a wide dynamic range. Another object is to provide an imaging device that easily performs imaging under a low illuminance condition. Another object is to provide an imaging device with low power consumption. Another object is to provide an imaging device that is suitable for high-speed operation. Another object is to provide an imaging device with high resolution. Another object is to provide a highly integrated imaging device. Another object is to provide an imaging device that can be used in a wide temperature range. Another object is to provide an imaging device with a high aperture ratio. Another object is to provide an imaging device with high reliability. Another object is to provide a novel imaging device or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an imaging device including a first circuit and a second circuit. The first circuit includes a first transistor, a second transistor, a third transistor, a fourth transistor, and a first photoelectric conversion element. One of electrodes of the first photoelectric conversion element is electrically connected to one of a source electrode and a drain electrode of the first transistor. The one of the electrodes of the first photoelectric conversion element is electrically connected to one of a source electrode and a drain electrode of the second transistor. The other of the source electrode and the drain electrode of the second transistor is electrically connected to a gate electrode of the third transistor. One of a source electrode and a drain electrode of the third transistor is electrically connected to one of a source electrode and a drain electrode of the fourth transistor. The second circuit includes a fifth transistor, a sixth transistor, a seventh transistor, an eighth transistor, and a second photoelectric conversion element. One of electrodes of the second photoelectric conversion element is electrically connected to one of a source electrode and a drain electrode of the fifth transistor. The one of the electrodes of the second photoelectric conversion element is electrically connected to one of a source electrode and a drain electrode of the sixth transistor. The one of the source electrode and the drain electrode of the fifth transistor is electrically connected to a gate electrode of the fifth transistor. The other of the source electrode and the drain electrode of the sixth transistor is electrically connected to a gate electrode of the seventh transistor. One of a source electrode and a drain electrode of the seventh transistor is electrically connected to one of a source electrode and a drain electrode of the eighth transistor. A gate electrode of the first transistor is electrically connected to the gate electrode of the fifth transistor.

Another embodiment of the present invention is an imaging device including a first circuit and a second circuit. The first circuit includes a first transistor, a second transistor, a third transistor, a fourth transistor, and a first photoelectric conversion element. One of electrodes of the first photoelectric conversion element is electrically connected to one of a source electrode and a drain electrode of the first transistor. The one of the electrodes of the first photoelectric conversion element is electrically connected to one of a source electrode and a drain electrode of the second transistor. The other of the source electrode and the drain electrode of the second transistor is electrically connected to a gate electrode of the third transistor. One of a source electrode and a drain electrode of the third transistor is electrically connected to one of a source electrode and a drain electrode of the fourth transistor. The second circuit includes a fifth transistor and a second photoelectric conversion element. One of electrodes of the second photoelectric conversion element is electrically connected to one of a source electrode and a drain electrode of the fifth transistor. The one of the source electrode and the drain electrode of the fifth transistor is electrically connected to a gate electrode of the fifth transistor. A gate electrode of the first transistor is electrically connected to the gate electrode of the fifth transistor.

The first and second circuits can be arranged in a matrix of m rows and n columns (m is a natural number greater than or equal to 1, and n is a natural number greater than or equal to 3). The second circuits can be positioned in the first column and the n-th column.

The second circuit can be shielded from light.

The first transistor, the second transistor, and the fifth transistor can each include an oxide semiconductor in an active layer. The oxide semiconductor preferably contains In, Zn, and M (M is Al, Ti, Ga, Sn, Y, Zr, La, Ce, Nd, or Hf).

The first photoelectric conversion element and the second photoelectric conversion element preferably each include a material containing selenium.

According to one embodiment of the present invention, an imaging device with excellent imaging performance can be provided. An imaging device with a wide dynamic range can be provided. An imaging device that easily performs imaging under a low illuminance condition can be provided. An imaging device with low power consumption can be provided. An imaging device that is suitable for high-speed operation can be provided. An imaging device with high resolution can be provided. A highly integrated imaging device can be provided. An imaging device that can be used in a wide temperature range can be provided. An imaging device with a high aperture ratio can be provided. An imaging device with high reliability can be provided. A novel imaging device or the like can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce the above effects.

BRIEF DESCRIPTION OF THE DRAWINGS

FIGS. 35A1, 35A2, 35A3, 35B1, 35B2, and 35B3 illustrate bent imaging devices.
FIGS. 36A to 36F are top views and cross-sectional views illustrating transistors.

DETAILED DESCRIPTION OF THE INVENTION

Figure 1A:
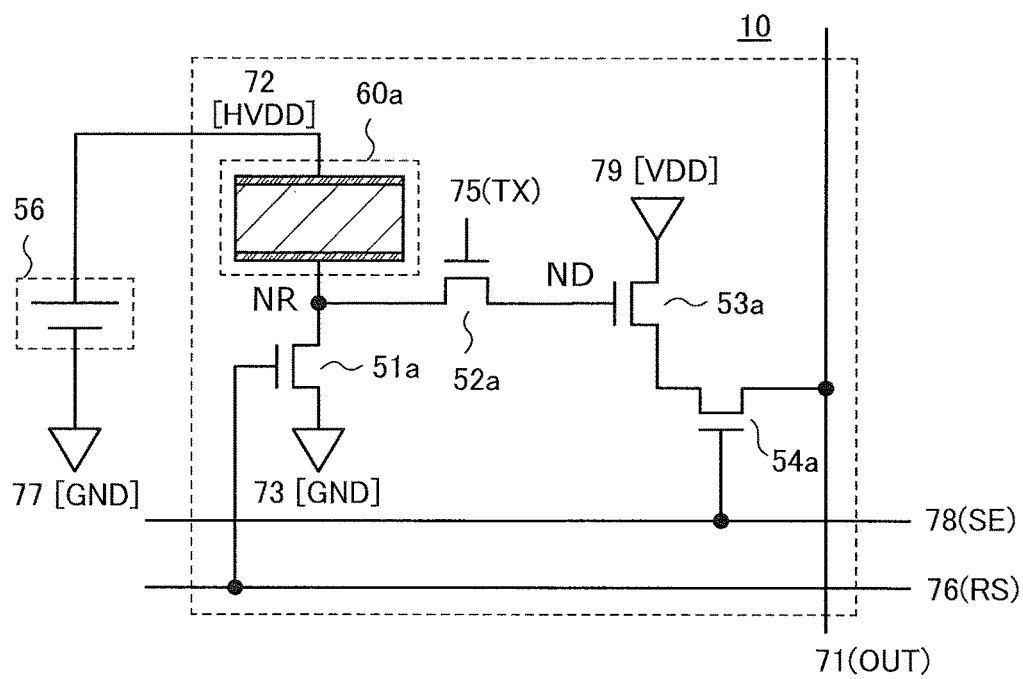
FIGS. 1A and 1B each illustrate a pixel circuit.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention will be described with reference to drawings.

Figure 1B:
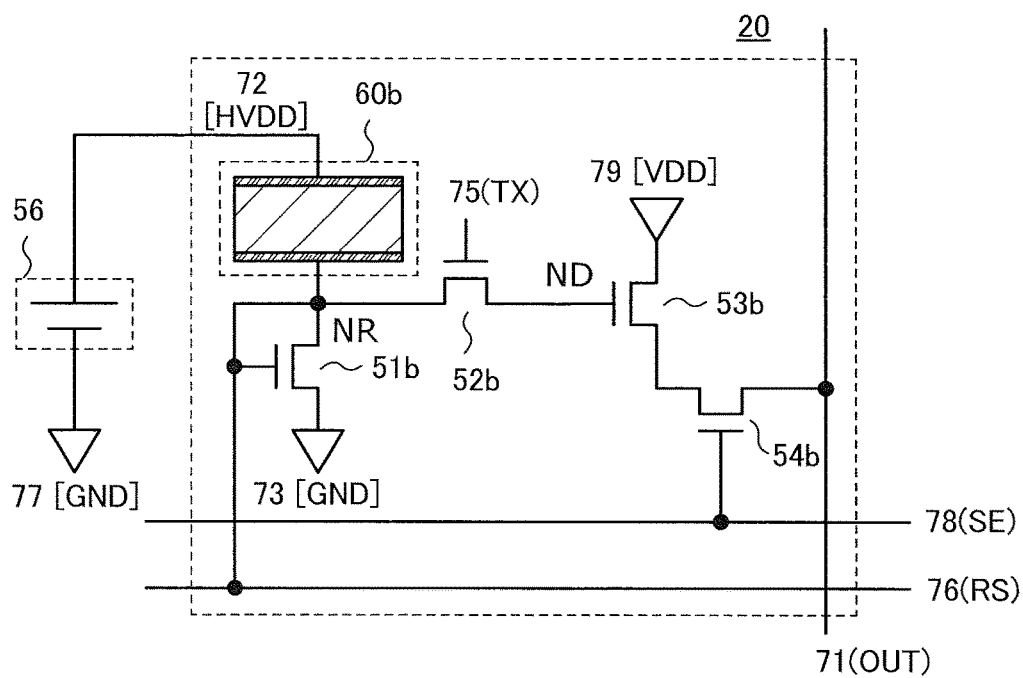

FIGS. 1A and 1B illustrate pixel circuits that can be used for an imaging device of one embodiment of the present invention. A circuit 10 illustrated in FIG. 1A includes a transistor 51$a$, a transistor 52$a$, a transistor 53$a$, a transistor 54$a$, and a photoelectric conversion element 60$a$. A circuit 20 illustrated in FIG. 1B includes a transistor 51$b$, a transistor 52$b$, a transistor 53$b$, a transistor 54$b$, and a photoelectric conversion element 60$b$.

In one embodiment of the present invention, the circuit 10 can function as a pixel circuit, while the circuit 20 can function as a pseudo pixel circuit. The circuit 20 has the same configuration as the circuit 10, except that one of the transistors is a diode-connected transistor (in which one of a source electrode and a drain electrode is electrically connected to a gate electrode).

Therefore, components of the circuit 10 and connection between the components are described below in detail. As for the circuit 20, in the following description, the photoelectric conversion element 60$a$ can be replaced with the photoelectric conversion element 60$b$, and the transistors 51$a$ to 54$a$ can be replaced with the transistors 51$b$ to 54$b$ respectively.

In the circuit 10, one electrode of the photoelectric conversion element 60$a$ is electrically connected to one of a source electrode and a drain electrode of the transistor 51$a$. The one electrode of the photoelectric conversion element 60$a$ is also electrically connected to one of a source electrode and a drain electrode of the transistor 52$a$. The other of the source electrode and the drain electrode of the transistor 52$a$ is electrically connected to a gate electrode of the transistor 53$a$. One of a source electrode and a drain electrode of the transistor 53$a$ is electrically connected to one of a source electrode and a drain electrode of the transistor 54$a$.

In the circuit 20, connection between components is similar to the above, and in addition, one of a source electrode and a drain electrode of the transistor 51$b$ is electrically connected to a gate electrode of the transistor 51$b$ (i.e., the transistor 51$b$ is a diode-connected transistor).

The other electrode of the photoelectric conversion element 60$a$ is electrically connected to a wiring 72[HVDD]. A gate electrode of the transistor 52$a$ is electrically connected to a wiring 75 (TX). The other of the source electrode and the drain electrode of the transistor 53$a$ is electrically connected to a wiring 79[VDD]. A gate electrode of the transistor 51$a$ is electrically connected to a wiring 76 (RS). The other of the source electrode and the drain electrode of the transistor 51$a$ is electrically connected to a wiring 73[GND]. The other of the source electrode and the drain electrode of the transistor 54$a$ is electrically connected to a wiring 71 (OUT). A gate electrode of the transistor 54$a$ is electrically connected to a wiring 78 (SE). The wiring 72[HVDD] is electrically connected to one terminal of a high voltage power source 56. The other terminal of the high voltage power source 56 is electrically connected to a wiring 77[GND].

Here, the wiring 71 (OUT) can function as an output line that outputs a signal from a pixel. The wiring 73[GND], the wiring 77[GND], and the wiring 79[VDD] can function as power supply lines. For example, the wiring 73[GND] and the wiring 77[GND] can function as low potential power supply lines, and the wiring 79[VDD] can function as a high potential power supply line. The wiring 75 (TX), the wiring 76 (RS), and the wiring 78 (SE) can function as signal lines that control the on/off states of the transistors.

Note that the wiring 73[GND] and the wiring 77[GND] may be provided as one wiring. In addition, the potentials of the two wirings are not limited to GND, and may be any potential as long as they are sufficiently lower than a potential supplied to the wiring 79[VDD].

The photoelectric conversion element 60a exhibits significant photoelectric conversion characteristics when a potential HVDD, which is high voltage, is applied. Note that in this embodiment, the potential HVDD is higher than a potential VDD that is supplied to the wiring 79 [VDD]. To increase light detection sensitivity under a low illuminance condition, it is preferable to use a photoelectric conversion element formed using a material that causes avalanche charge multiplication as the photoelectric conversion element 60a. To cause avalanche charge multiplication, comparatively high voltage [HVDD] is needed. Thus, the high voltage power source 56 is capable of supplying HVDD, and HVDD is supplied to the other electrode of the photoelectric conversion element 60a through the wiring 72[HVDD].

The transistor 51a can function as a reset transistor that initializes the potentials of a charge accumulation portion (NR) and a charge detection portion (ND). The transistor 52a can function as a transfer transistor for transferring the potential of the charge accumulation portion (NR) that changes in response to output of the photoelectric conversion element 60a to the charge detection portion (ND). The transistor 53a can function as an amplifying transistor that outputs a signal based on the potential of the charge detection portion (ND). The transistor 54a can function as a selection transistor that selects a pixel from which a signal is read.

In the case where high voltage is applied to the photoelectric conversion element 60a, a transistor to be connected to the photoelectric conversion element 60a needs to withstand the high voltage. As the transistor that can withstand high voltage, for example, a transistor including an oxide semiconductor in an active layer (hereinafter referred to as an OS transistor) can be used. Specifically, OS transistors are preferably used as the transistors 51a and 52a.

Since the OS transistor has a wide bandgap (>3.0 eV) semiconductor, drain breakdown voltage depends not on junction breakdown voltage but on the gate insulating film thickness. The OS transistor is less likely to generate a short channel effect, so that the drain breakdown voltage is increased by making the gate insulating film thicker and normally-off transistor characteristics are easily obtained. The OS transistor with the thick gate insulating film can withstand a bias of higher than 20 V that is necessary for avalanche charge multiplication of the photoelectric conversion element.

Note that in this specification, a transistor having high breakdown voltage refers to a transistor to which desired high voltage can be applied without causing electrical breakdown. For example, desired high voltage can be applied to a gate electrode of the transistor having high breakdown voltage without causing breakdown when GND is applied to a source electrode and a drain electrode of the transistor. Alternatively, desired high voltage can be applied to the drain electrode without causing breakdown when GND is applied to the source electrode and the gate electrode. Alternatively, desired high voltage can be applied to the drain electrode without causing breakdown when GND and VDD are applied to the source electrode and the gate electrode respectively.

The transistor 51a and the transistor 52a preferably have excellent switching characteristics, and the transistor 53a preferably has excellent amplifying characteristics and thus preferably has high on-state current. Therefore, a transistor including silicon in an active layer or an active region (hereinafter referred to as a Si transistor) is preferably used as the transistor 53a. In this case, a Si transistor is preferably used also as the transistor 54a.

Note that the highest potential of the charge accumulation portion (NR) can be HVDD. However, in the case where an n-channel transistor is used as the transistor 52a, the potential of the charge detection portion (ND) is not higher than the highest potential that is applied to the gate electrode of the transistor 52a. More properly, the potential of the charge detection portion (ND) is not higher than a potential obtained by subtracting the threshold voltage ($V_{th}$) of the transistor 52a from the highest potential that is applied to the gate electrode of the transistor 52a. For example, even if the potential of the charge accumulation portion (NR) is HVDD, the highest potential of the charge detection portion (ND) is VDD when the highest potential that is applied to the wiring 75 (TX) is VDD. More properly, the potential of the charge detection portion (ND) is VDD-$V_{th}$. Note that in the following description, $V_{th}$ of the transistor 52a is regarded as low voltage, and the description of $V_{th}$ of the transistor 52a is omitted when the potential of the charge detection portion (ND) is described.

In other words, when the transistor 52a is normally off, the potential VDD that is lower than the potential HVDD is power supply voltage for reading. Therefore, high voltage is not applied to the gate electrode of the transistor 53a, so that the use of a Si transistor that includes a thin gate insulating film and has comparatively not so high breakdown voltage as the transistor 53a does not easily pose a problem.

When the transistors 51a to 54a have the above structures, it is possible to manufacture an imaging device that has high light detection sensitivity under a low illuminance condition and can output a signal with little noise. Since the imaging device has high light detection sensitivity, light capturing time can be shortened and imaging can be performed at high speed.

Figure 2A:
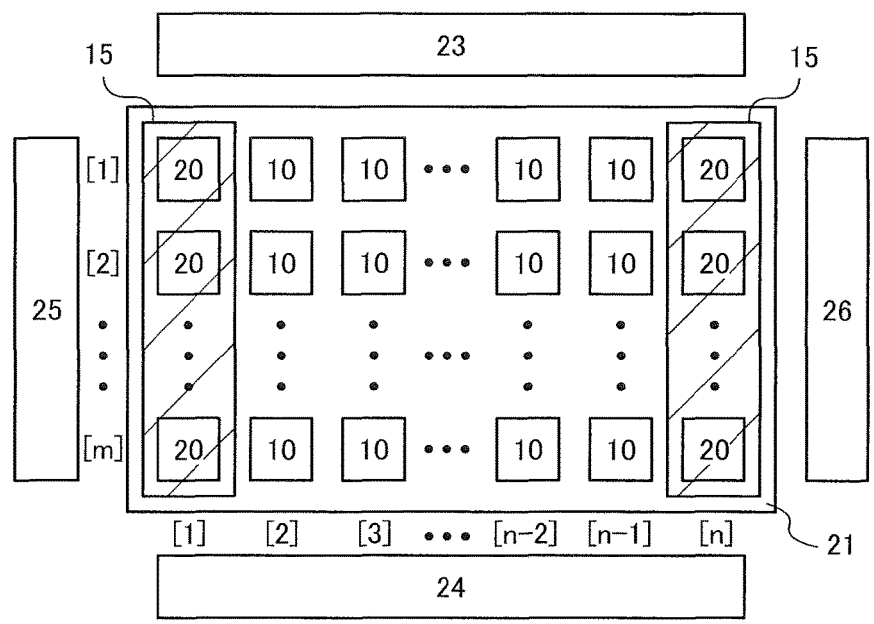
FIGS. 2A and 2B illustrate an imaging device and a pixel circuit.

An imaging device of one embodiment of the present invention can have a configuration illustrated in FIG. 2A, for example. In FIG. 2A, an imaging device includes a pixel portion 21, column drivers 23 and 24, and row drivers 25 and 26. Although not illustrated, the column drivers 23 and 24 and the row drivers 25 and 26 are electrically connected to the circuits 10 and 20 provided in the pixel portion 21 through wirings.

In the pixel portion 21, the circuits 10 and 20 are arranged in a matrix of m rows and n columns. In the configuration of FIG. 2A, m is a natural number greater than or equal to 1, and n is a natural number greater than or equal to 3.

Here, the circuits 20 can be provided in the first and n-th columns. At this time, the circuits 10 are provided in the second to (n−1)-th columns. Light-blocking layers 15 are provided so as to overlap with the circuits 20. The light-blocking layers 15 are provided in positions at which the photoelectric conversion elements 60b in the circuits 20 can be shielded from external light. Therefore, although the light-blocking layers 15 each cover a plurality of circuits 20 in FIG. 2A, the light-blocking layers 15 may each cover one circuit 20 or may cover only the photoelectric conversion elements 60b.

Figure 2B:
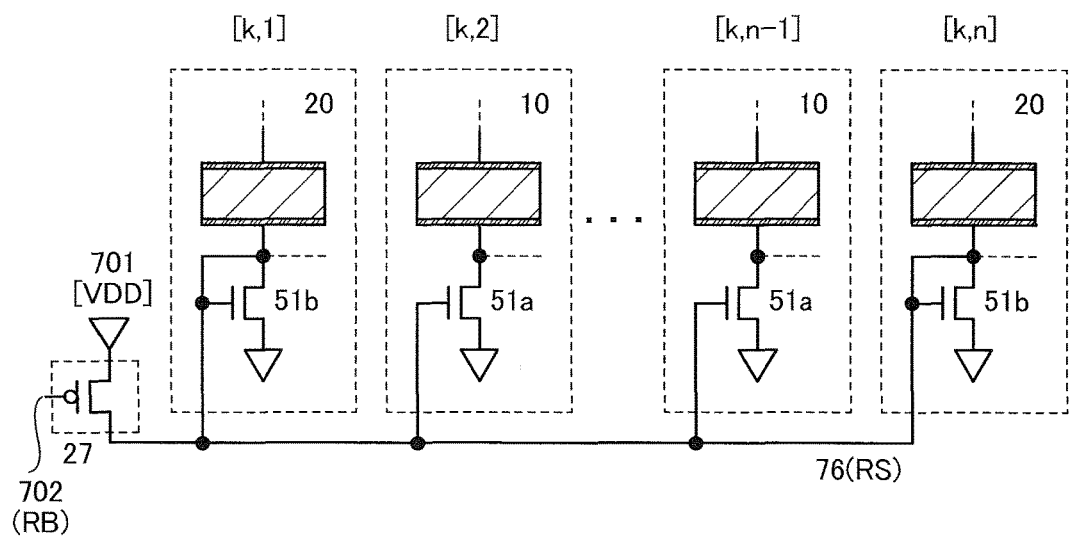

In the case where the imaging device has the configuration of FIG. 2A, for example, pixels in the k-th row are electrically connected to each other as illustrated in FIG. 2B. Here, the gate electrodes of the transistors 51a and the transistors 51b in the circuits are electrically connected to each other; thus, a current mirror circuit in which the two transistors 51b serve as input transistors and the other transistors 51a serve as output transistors is formed.

Figure 3A:
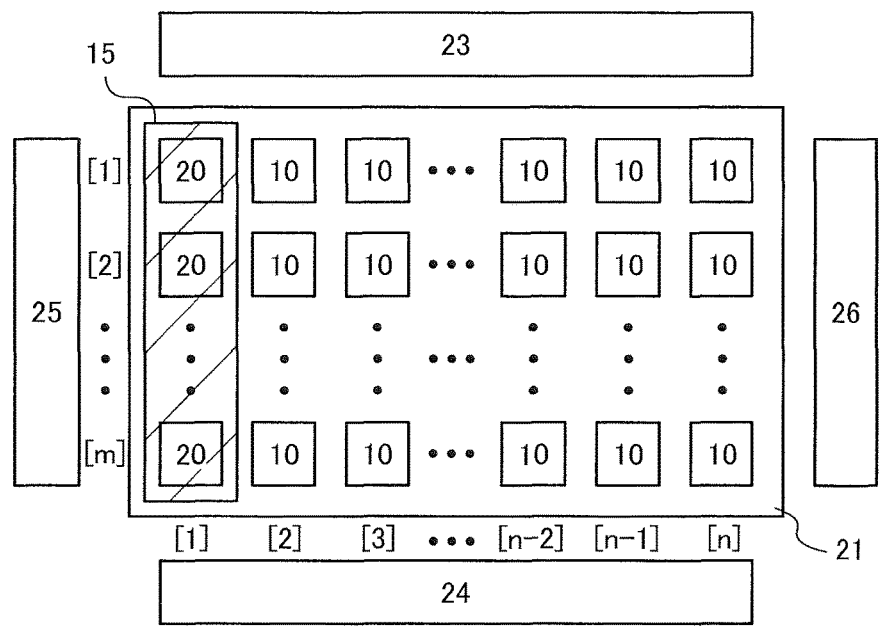
FIGS. 3A and 3B illustrate an imaging device and a pixel circuit.

An imaging device of one embodiment of the present invention can also have a configuration illustrated in FIG. 3A. In the imaging device having the configuration of FIG. 3A, the circuits 20 are provided in the first column, and the circuits 10 are provided in the second to n-th columns In the configuration of FIG. 3A, m is a natural number greater than or equal to 1, and n is a natural number greater than or equal to 2.

Figure 3B:
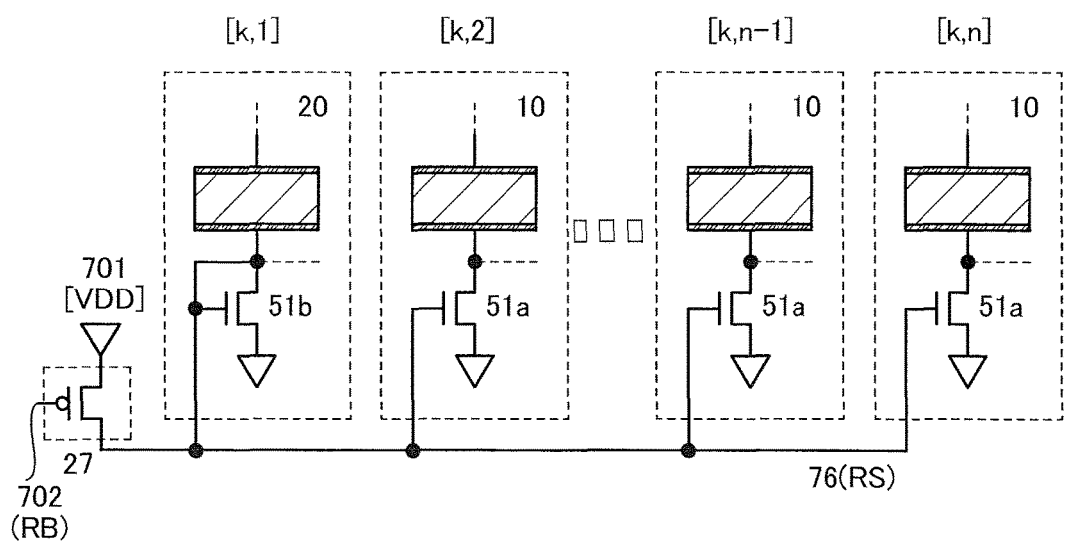

In the case where the imaging device has the configuration of FIG. 3A, the circuits in the k-th row are electrically connected to each other as illustrated in FIG. 3B. The transistors 51a and the transistor 51b in the circuits form a current mirror circuit. The configuration of the imaging device illustrated in FIG. 3B is different from that illustrated in FIG. 2B in that there is one transistor 51b as an input transistor. Note that the circuits 20 may be provided not in the first column but in the n-th column.

As illustrated in FIG. 2B or FIG. 3B, the wiring 76 (RS) connected to the gate electrodes of the transistors 51a and 51b is electrically connected to a circuit 27. For example, the circuit 27 includes a p-channel transistor; one of a source electrode and a drain electrode of the transistor is electrically connected to a wiring 701[VDD], and a gate electrode thereof is electrically connected to a wiring 702 (RB).

Here, when the potential of the wiring 702 (RB) is "L", the gate electrodes of the transistors 51a and 51b are supplied with "H". This operation corresponds to a reset operation described later.

When the potential of the wiring 702 (RB) is "H", the diode-connected transistor 51b in the circuit 20 functions as a current source for supplying a current flowing through the photoelectric conversion element 60b that is shielded from light, i.e., a current corresponding to the dark current of the photoelectric conversion element 60b.

At this time, when the gate potential of the transistor 51b in the circuit 20 is VDD2, the gate potential of the transistor 51a in the circuit 10 is also VDD2 because the above current mirror circuit is formed; thus, a current corresponding to the dark current of the photoelectric conversion element 60a flows through the transistor 51a.

Therefore, the potential of the charge accumulation portion (NR) or the charge detection portion (ND) in the circuit 10 changes according to the difference between the photocurrent flowing through the photoelectric conversion element 60a that depends on the intensity of light entering the photoelectric conversion element 60a and the current flowing through the transistor 51a (the current corresponding to the dark current of the photoelectric conversion element 60a). That is, it is possible to detect the net amount of photocurrent by excluding the contribution of the dark current.

With such a structure, it is possible to detect the net amount of photocurrent by excluding the current corresponding to the dark current of the photoelectric conversion element. As a result, imaging quality can be improved.

Figure 4:
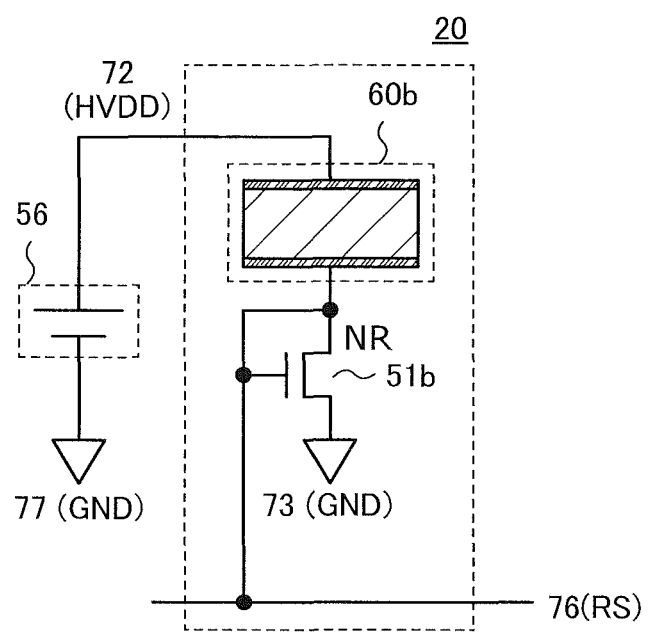
FIG. 4 illustrates a pixel circuit.

In the circuit 20, the transistor 52b and components electrically connected to the transistor 52b are not necessarily provided as illustrated in FIG. 4.

Figure 5A:
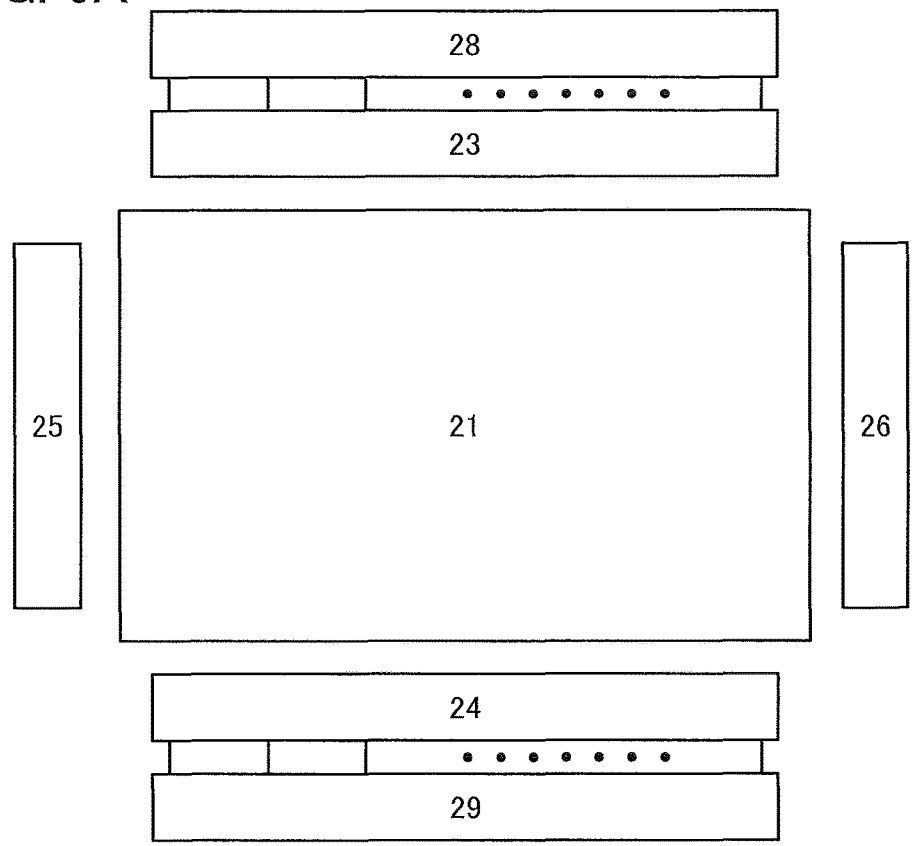
FIGS. 5A and 5B each illustrate an imaging device.
Figure 5B:
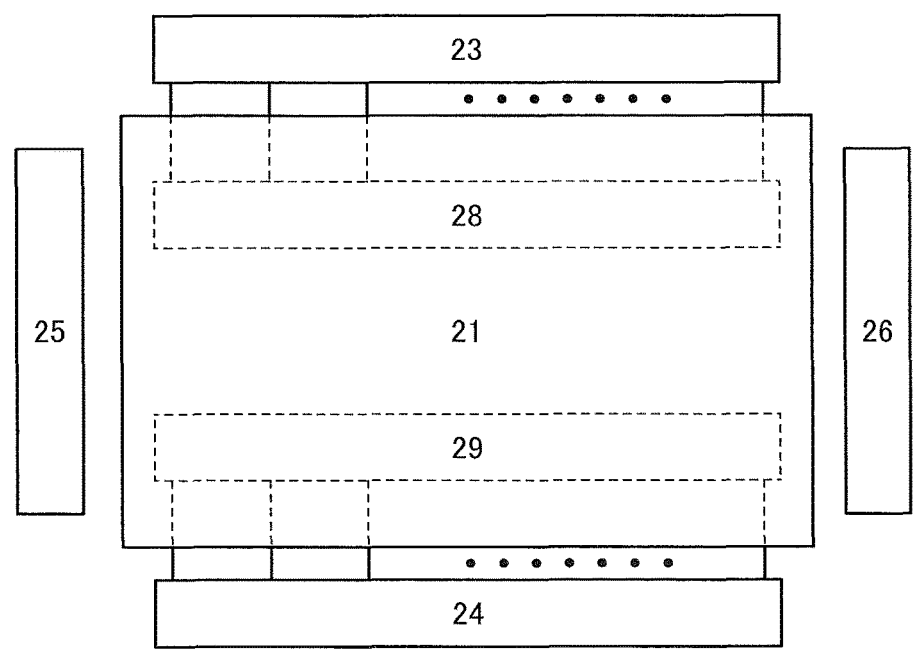

As illustrated in FIG. 5A, the column drivers 23 and 24 in FIG. 2A and FIG. 3A can be electrically connected to circuits 28 and 29 respectively. For example, the circuits 28 and 29 can have a function of performing image processing or the like. Note that the circuits 28 and 29 may be provided so as to overlap with the pixel portion 21 as illustrated in FIG. 5B.

Such a structure is effective in forming the pixel portion 21 and the circuits 28 and 29 with different design rules. In general, the circuits 28 and 29 are digital circuits, and can be often improved in performance by being formed with a minute design rule for higher integration. In contrast, the pixel portion 21, an A/D conversion circuit, or the like is an analog circuit, and thus miniaturization is not necessarily effective because of a variation among elements, noise, or the like. Therefore, forming the pixel portion 21 and the circuits 28 and 29 with different design rules is effective in order to improve the performance of a semiconductor device.

Next, the operation of the pixel will be described with reference to a timing chart of FIG. 6. For the operation of an imaging device of one embodiment of the present invention, a low potential "L", a high potential "H", and a potential "M" that is a potential between "L" and "H" are used.

Note that in the following description of an operation example, potentials VDD and VDD2 are supplied as "H" and "M" respectively to the wiring 76 (RS) connected to the gate electrode of the transistor 51a. In addition, potentials VDD and GND are supplied as "H" and "L" respectively to the wiring 75 (TX) connected to the gate electrode of the transistor 52a. Furthermore, VDD is supplied to the wiring 79[VDD] connected to the source electrode of the transistor 53a. Other potentials also can be supplied to the wirings.

Note that VDD2 corresponds to a bias voltage at which the transistor 51a can function as a current source for supplying a current corresponding to the dark current of the photoelectric conversion element 60a, and can be obtained from the above current mirror circuit.

First, the wiring 76 (RS) is set at "H" and the wiring 75 (TX) is set at "H", whereby the potentials of the charge accumulation portion (NR) and the charge detection portion (ND) are each set to a reset potential [GND] (that is, a reset operation). In the case where the configuration of the circuit 27 is the one illustrated in FIG. 2B or FIG. 3B, the wiring 702 (RB) is set at "L", and thus the wiring 76 (RS) can be set at "H".

Next, the wiring 76 (RS) is set at "M" and the wiring 75 (TX) is set at "L", whereby the potential of the charge accumulation portion (NR) changes (that is, an accumulation operation). The potential of the charge accumulation portion (NR) is changed from GND to HVDD at the maximum depending on the intensity of light entering the photoelectric conversion element 60a. In the case where the configuration of the circuit 27 is the one illustrated in FIG. 2B or FIG. 3B, the wiring 702 (RB) is set at "H", and thus the wiring 76 (RS) can be set at "M".

The wiring 75 (TX) is set at "H" subsequent to the accumulation operation, whereby charge in the charge accumulation portion (NR) is transferred to the charge detection portion (ND) (that is, a transfer operation).

Although the potential of the charge detection portion (ND) is changed depending on the intensity of light entering the photoelectric conversion element 60a, VDD is supplied to the gate electrode of the transistor 52a; thus, when the potential of the charge detection portion (ND) reaches VDD, the transistor 52a is turned off. Therefore, the potential of the charge detection portion (ND) is changed from the reset potential [GND] to VDD at the maximum. In other words, VDD is applied to the gate electrode of the transistor 53a at the maximum.

Figure 6:
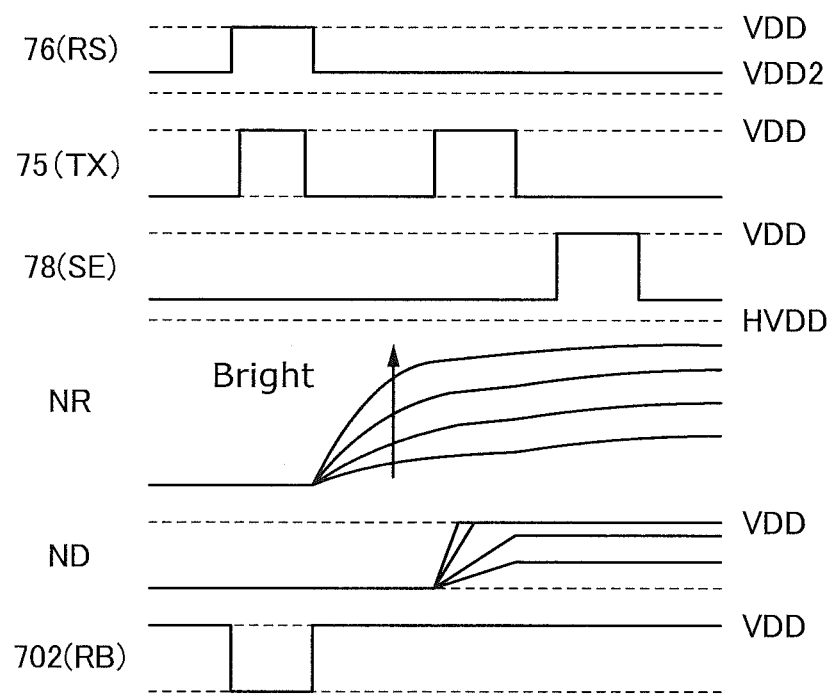
FIG. 6 is a timing chart illustrating operation of imaging.

Note that although the wiring 75 (TX) is set at "L" in the accumulation operation in FIG. 6, the wiring 75 (TX) may be set at "H". In that case, the potential of the charge detection portion (ND) is changed in accordance with the potential change of the charge accumulation portion (NR); however, VDD is supplied to the gate electrode of the transistor 52a. Therefore, when the potential of the charge detection portion (ND) reaches VDD, the transistor 52a is turned off. Therefore, the potential of the charge detection portion (ND) is changed from the reset potential [GND] to VDD at the maximum. In other words, also in such a case, VDD is applied to the gate electrode of the transistor 53a at the maximum.

Note that the wiring 75 (TX) is set at "L" in the accumulation operation, whereby the influence of noise caused by the transistor 52a can be reduced. In contrast, when the wiring 75 (TX) is set at "H", the influence of noise caused by switching of the transistor 52a can be reduced.

The wiring 76 (RS) is set at "L", the wiring 75 (TX) is set at "L", and the wiring 78 (SE) is set at "H" subsequent to the transfer operation, whereby a signal based on the potential of the charge detection portion (ND) can be output to the wiring 71 (OUT). In other words, an output signal based on the intensity of light entering the photoelectric conversion element 60a in the accumulation operation can be obtained.

In the above operation, the highest voltages applied to the terminals of the transistors are as follows. In some cases, HVDD is applied to the gate electrode and the drain electrode of the transistor 51a, and GND is applied to the source electrode of the transistor 51a. In some cases, HVDD is applied to the source electrode of the transistor 52a, and VDD is applied to the gate electrode and the drain electrode of the transistor 52a. In some cases, VDD is applied to the source electrode, the drain electrode, and the gate electrode of the transistor 53a. In some cases, VDD is applied to the source electrode, the drain electrode, and the gate electrode of the transistor 54a. Therefore, the transistors 51a and 52a need to withstand the high voltage HVDD. In contrast, it is enough for the transistors 53a and 54a to withstand VDD.

With the above structure, the pixels of the imaging device using the photoelectric conversion element to which high voltage is applied can be miniaturized, and imaging data of the pixels can be read out at high speed. Furthermore, a reduction in imaging quality due to the dark current of the photoelectric conversion element can be inhibited.

Figure 7A:
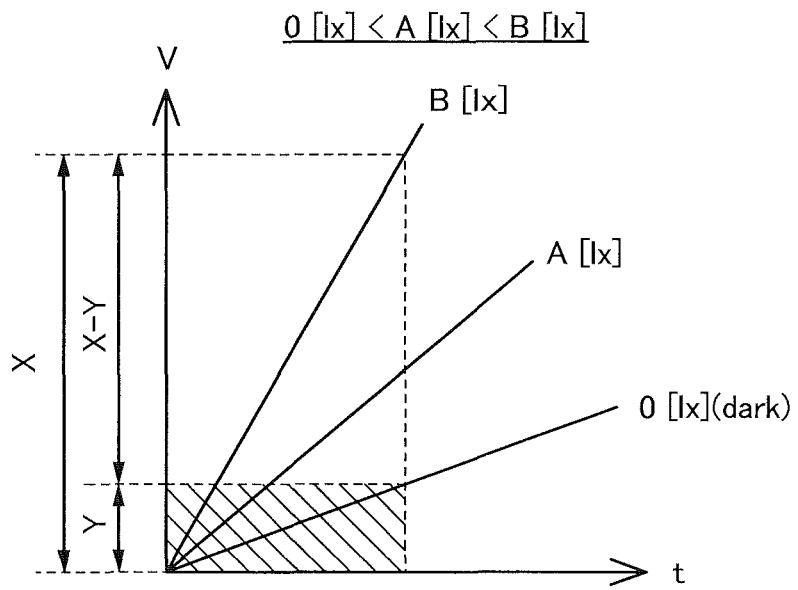
FIGS. 7A and 7B each show a change in the voltage of a charge accumulation portion.

An advantageous effect of one embodiment of the present invention will be described with reference to FIGS. 7A and 7B. FIG. 7A is a graph schematically showing a change in the voltage of the charge accumulation portion (NR) in the circuit 10 having a configuration for which one embodiment of the present invention is not used. The horizontal axis of FIG. 7A represents time, and changes in the voltage of the charge accumulation portion (NR) at an illuminance of 0[lx] (dark state), an illuminance of A[lx], and an illuminance of B[lx] are shown in the graph. Note that 0[lx]<A[lx]<B[lx] is satisfied.

In the configuration for which one embodiment of the present invention is not used, a voltage rise corresponding to a dark current is generated even at an illuminance of 0[lx], and thus the voltage of the charge accumulation portion (NR) in the circuit 10 is Y[V]. Therefore, when the voltage for detecting the illuminance B[lx] is X[V], the voltage of the charge accumulation portion (NR) that can be used for detecting the illuminances 0[lx] to B[lx] is Y[V] to X[V] obtained by excluding the voltage corresponding to the dark current. That is, in the configuration for which one embodiment of the present invention is not used, the voltage Y[V] that does not contribute to a dynamic range is needed.

Figure 7B:
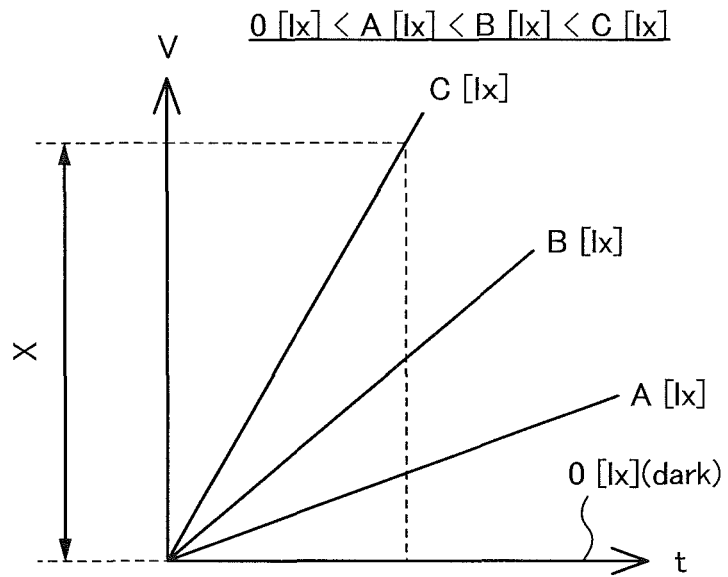

FIG. 7B is a graph schematically showing a change in the voltage of the charge accumulation portion (NR) in the circuit 10 having a configuration for which one embodiment of the present invention is used. In FIG. 7B, changes in the voltage of the charge accumulation portion (NR) at an illuminance of 0[lx] (dark state), an illuminance of A[lx], an illuminance of B[lx], and an illuminance of C[lx] are shown. Note that 0[lx]<A[lx]<B[lx]<C[lx] is satisfied.

In the configuration for which one embodiment of the present invention is used, a voltage rise corresponding to a dark current is not generated at an illuminance of 0[lx]. Therefore, the illuminance C[lx], which is higher than the illuminance B[lx], can be detected at a voltage of X [V]. In other words, in the configuration for which one embodiment of the present invention is used, a voltage Y[V] corresponding to the dark current is not generated and thus the voltage X can be effectively utilized; therefore, the dynamic range of imaging can be improved.

Figure 8:
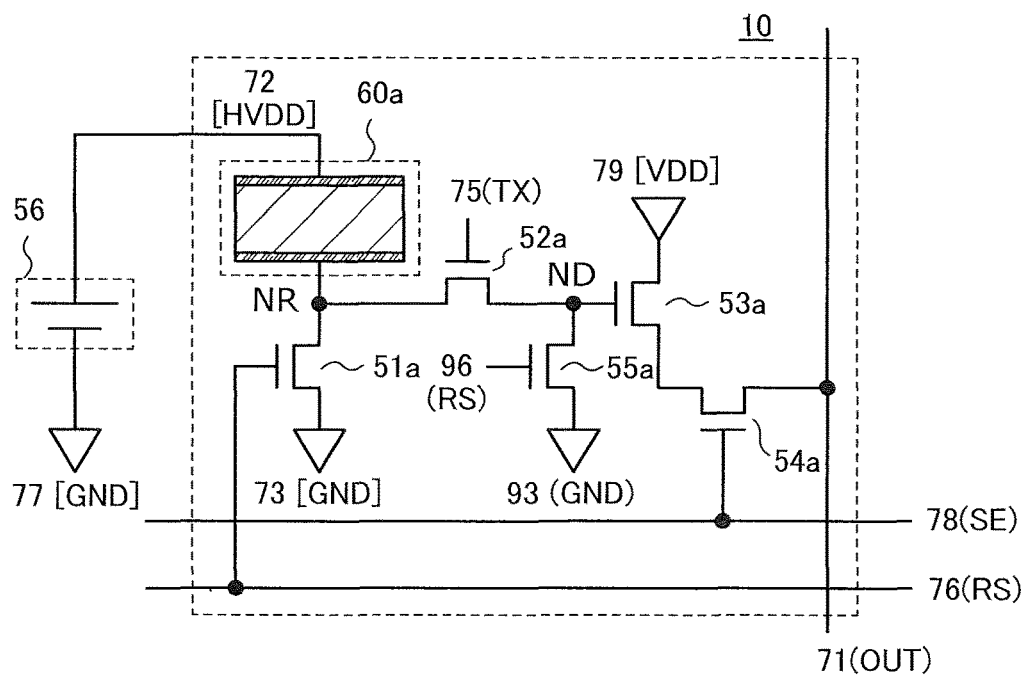
FIG. 8 illustrates a pixel circuit.

Note that the circuit 10 used for the imaging device of one embodiment of the present invention may have a configuration illustrated in FIG. 8. In the circuit 10 in FIG. 8, one of a source electrode and a drain electrode of a transistor 55a is connected to the charge detection portion (ND) in FIG. 1A. The other of the source electrode and the drain electrode of the transistor 55a is connected to a wiring 93[GND]. A gate electrode of the transistor 55a is connected to a wiring 96 (RS). The wiring 93[GND] can have the same potential as the wiring 73[GND]. The wiring 96 (RS) is a signal line for controlling the transistor 55a and can be supplied with a potential similar to that of the wiring 76 (RS). Alternatively, the wiring 76 (RS) and the wiring 96 (RS) may be supplied with different potentials, or the wiring 76 (RS) and the wiring 96 (RS) may be electrically connected to each other.

In the configuration of the circuit 10 in FIG. 1A, the reset operation of the charge detection portion (ND) is performed by turning on the transistors 51a and 52a. However, in the structure in FIG. 8, the charge detection portion (ND) can be reset without operation of the transistor 52a; thus, imaging noise can be reduced. Note that the circuit 20 can also have such a configuration.

Figure 9:
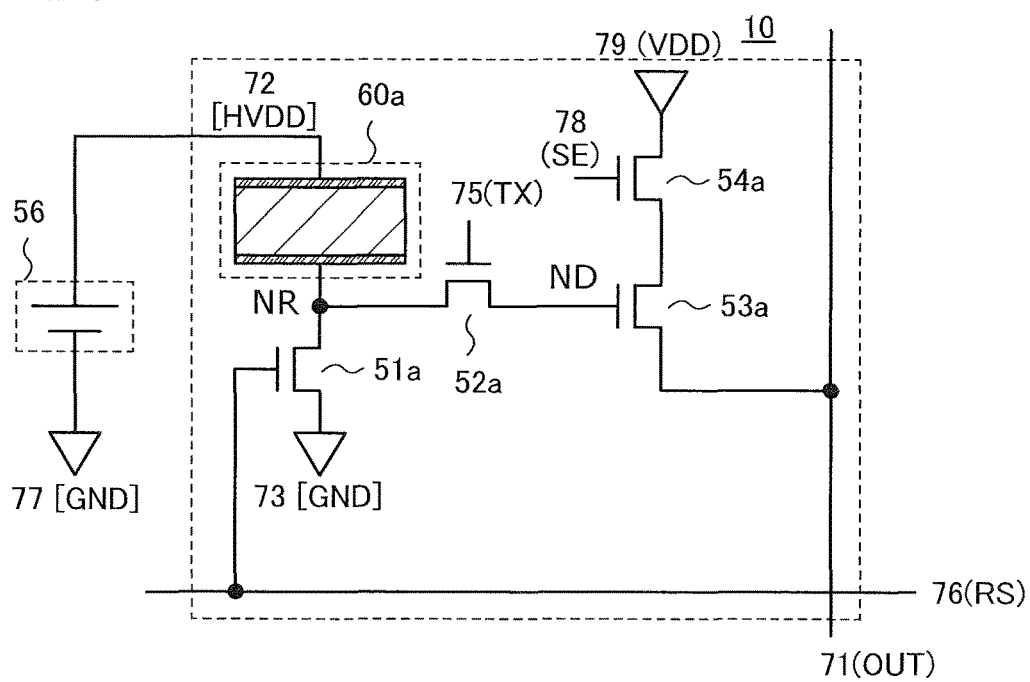
FIG. 9 illustrates a pixel circuit.

In the configuration of the circuit 10 in FIG. 1A, the transistor 54a is provided between the transistor 53a and the wiring 71 (OUT). However, as illustrated in FIG. 9, the transistor 54a may be provided between the transistor 53a and the wiring 79[VDD]. Note that the circuit 20 can also have such a configuration.

Figure 10A:
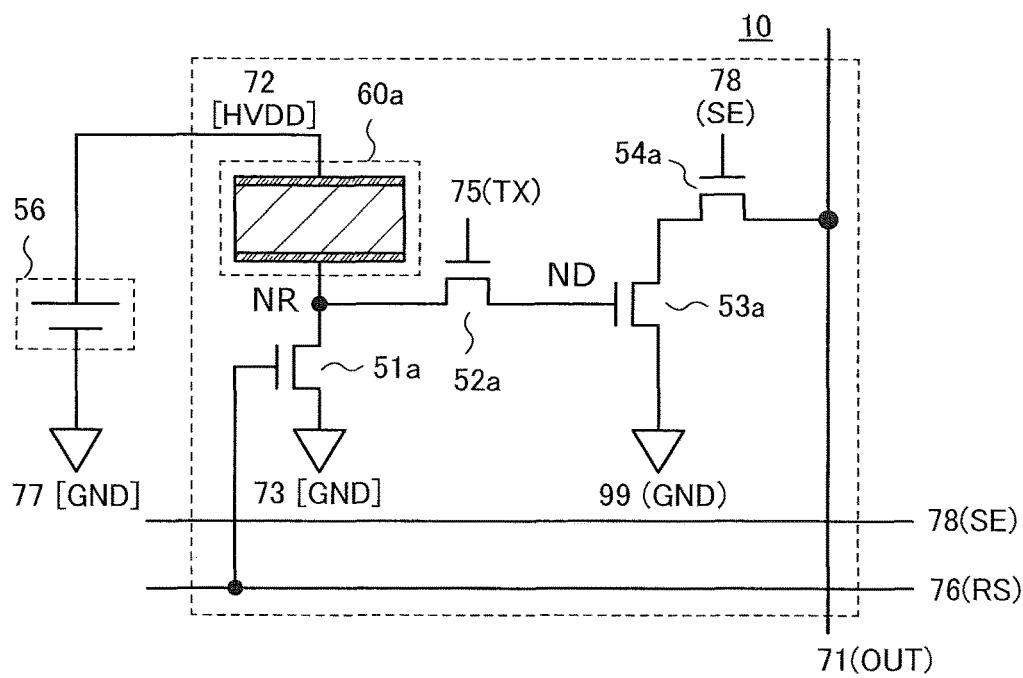
FIGS. 10A and 10B each illustrate a pixel circuit.
Figure 10B:
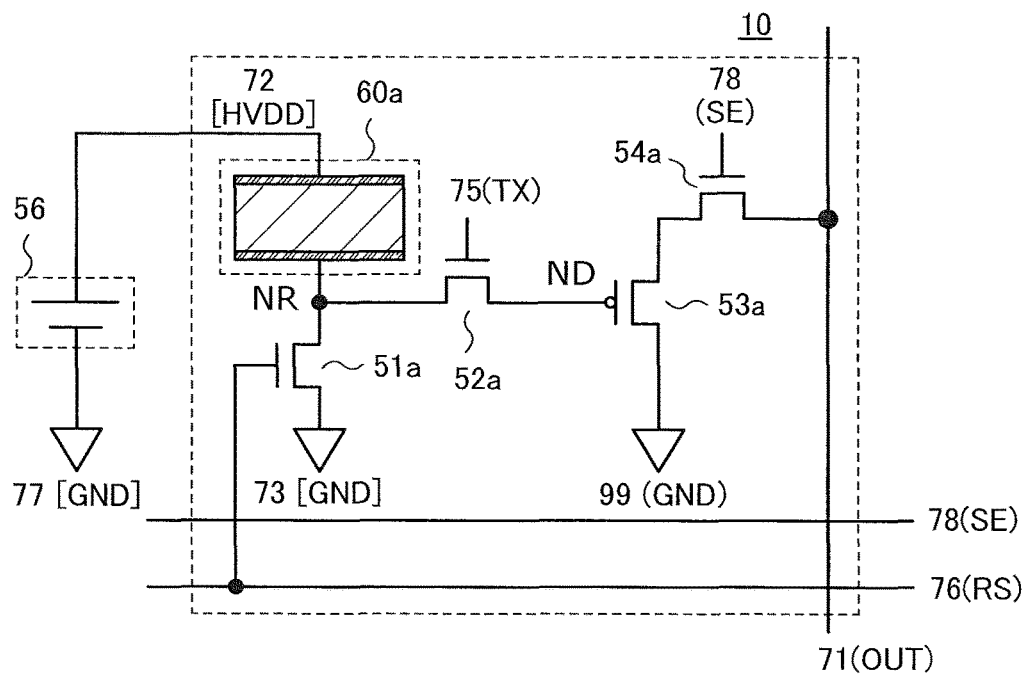

In the circuit 10 in FIG. 1A, the other of the source electrode and the drain electrode of the transistor 53a is connected to the high potential power supply line (the wiring 79[VDD]). However, as illustrated in FIG. 10A, the other of the source electrode and the drain electrode of the transistor 53a may be connected to a low potential power supply line (a wiring 99[GND]). As illustrated in FIG. 10B, the transistor 53a may be replaced with a p-channel transistor. Note that the circuit 20 can also have such a configuration.

Figure 11A:
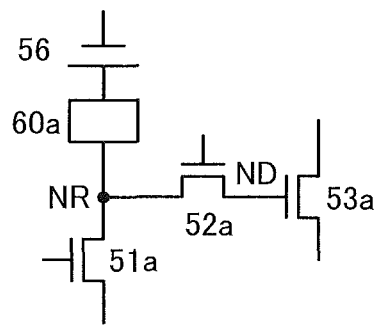
FIGS. 11A to 11D each illustrate a pixel circuit.
Figure 11B:
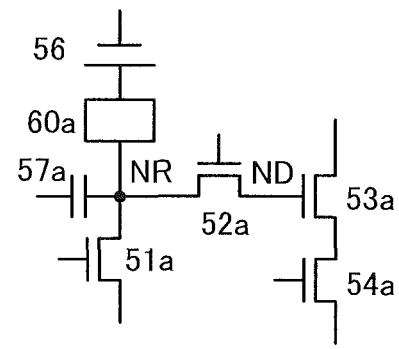
Figure 11C:
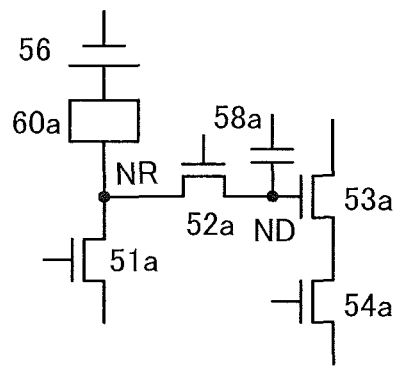
Figure 11D:
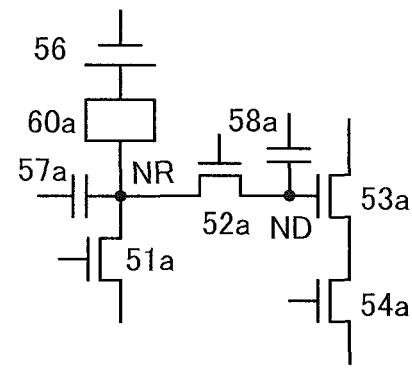

As another configuration of the circuit 10 of one embodiment of the present invention, the transistor 54a may be omitted as illustrated in FIG. 11A. As illustrated in FIG. 11B, a capacitor 57a may be provided for the charge accumulation portion (NR). As illustrated in FIG. 11C, a capacitor 58a may be provided for the charge detection portion (ND). As illustrated in FIG. 11D, the capacitors 57a and 58a may be provided. Note that any of the configurations in FIGS. 11A to 11D can be optionally combined with any of the configurations in FIG. 8, FIG. 9, and FIGS. 10A and 10B. Note that the circuit 20 can also have any of such configurations.

Figure 12A:
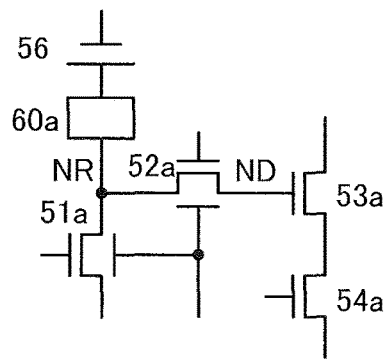
FIGS. 12A to 12F each illustrate a pixel circuit.
Figure 12B:
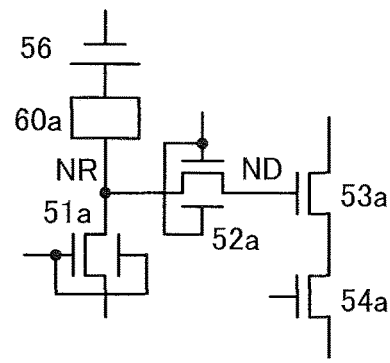
Figure 12C:
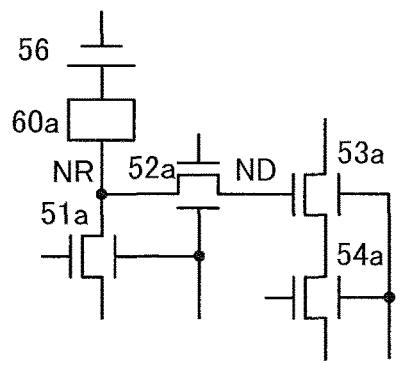
Figure 12D:
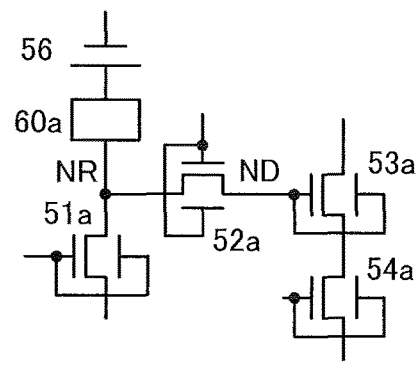

The transistor 51a and the transistor 52a in the circuit 10 may each have a back gate as illustrated in FIGS. 12A and 12B. FIG. 12A illustrates a configuration in which a constant potential is applied to the back gates, which enables control of the threshold voltages. FIG. 12B illustrates a configuration in which the same potential is applied to the front gate and the back gate, which enables an increase in on-state current. The transistors 51a to 54a may each have a back gate as illustrated in FIGS. 12C and 12D.

Figure 12E:
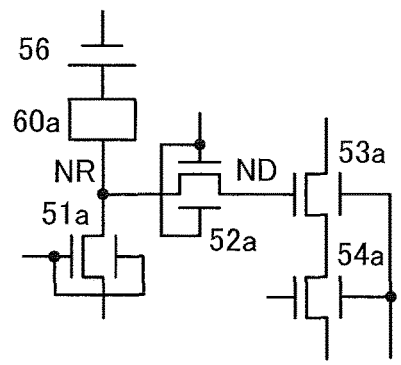
Figure 12F:
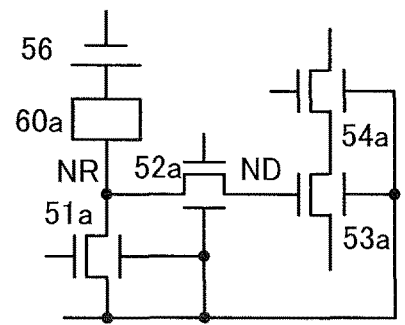

Moreover, as illustrated in FIG. 12E, a configuration in which the same potential is applied to a front gate and a back gate and a configuration in which a constant potential is applied to a back gate may be arbitrarily combined as necessary for the transistors in one circuit. Furthermore, a circuit configuration in which a back gate is not provided may be arbitrarily combined with any of the above configurations. As the configuration in which a constant potential is applied to a back gate, for example, a configuration in which the same potential is applied to all the back gates can be employed as illustrated in FIG. 12F, for example.

The circuits in FIG. 1A, FIG. 8, FIG. 9, FIGS. 10A and 10B, and FIGS. 11A to 11D can also have a configuration in which the transistors have back gates. Note that the circuit 20 can also have such a configuration.

Figure 13:
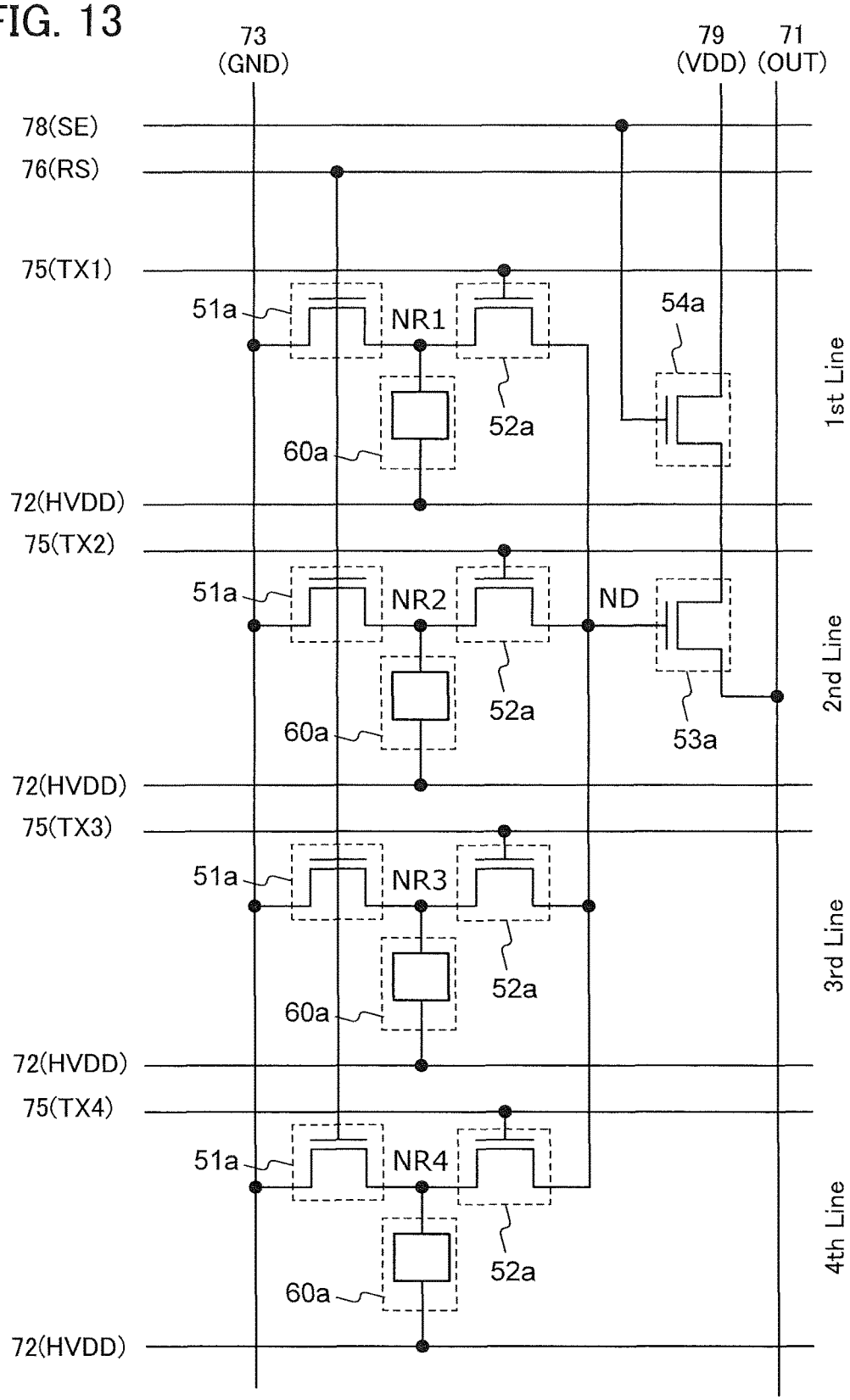
FIG. 13 illustrates a pixel circuit.
Figure 14:
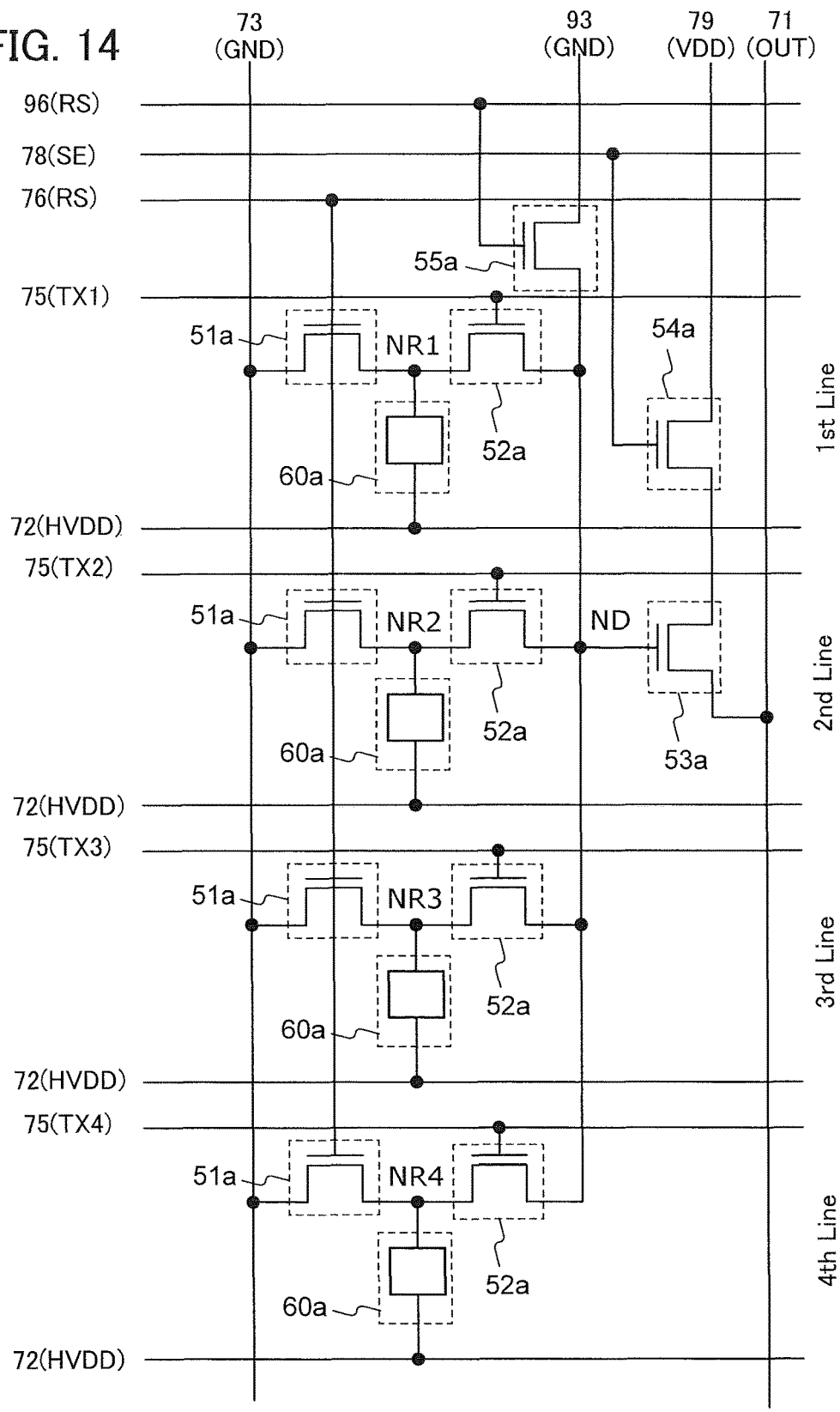
FIG. 14 illustrates a pixel circuit.

Note that the circuit 10 may have a configuration in which the transistors 53a and 54a are shared among a plurality of pixels as illustrated in FIG. 13. FIG. 13 illustrates a configuration in which the transistors 53a and 54a are shared among a plurality of pixels in the perpendicular direction; however, the transistors 53a and 54a may be shared among a plurality of pixels in the horizontal direction or in the horizontal and perpendicular direction. With such a configuration, the number of transistors included in one pixel can be reduced. As illustrated in FIG. 14, the reset transistor 55a may be provided for the charge detection portion (ND).

Although FIG. 13 and FIG. 14 each illustrate a configuration in which the transistors 53a and 54a are shared among four pixels, the transistors 53a and 54a may be shared among two pixels, three pixels, or five or more pixels. Note that the configuration in FIG. 13 or FIG. 14 can be optionally combined with any of the configurations in FIGS. 10A and 10B, FIGS. 11A to 11D, and FIGS. 12A to 12F. The same applies to the circuit 20.

With such a configuration, an imaging device that includes a highly integrated pixel array can be provided. Furthermore, an imaging device that easily performs imaging under a low illuminance condition can be provided.

Figure 15A:
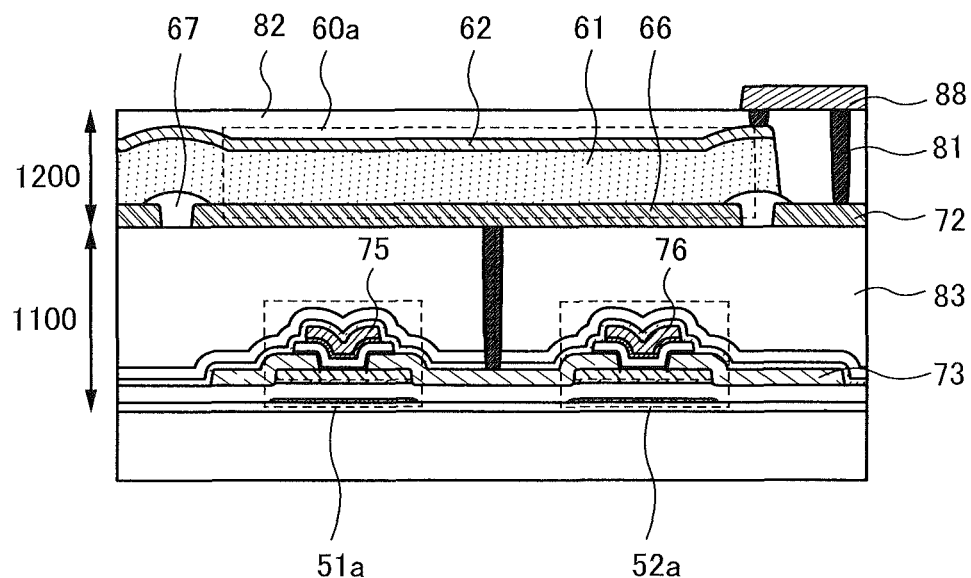
FIGS. 15A to 15C are cross-sectional views each illustrating the structure of an imaging device.

Next, specific structure examples of an imaging device of one embodiment of the present invention are described below with reference to drawings. FIG. 15A is an example of a cross-sectional view of an imaging device of one embodiment of the present invention and illustrates an example of specific connection between the photoelectric conversion element 60a and the transistors 51a and 52a which are included in the circuit 10 in FIG. 1A. Note that the transistors 53a and 54a are not illustrated in FIG. 15A. The imaging device includes a layer 1100 including the transistors 51a to 54a and a layer 1200 including the photoelectric conversion element 60a.

Although the wirings, the electrodes, and conductors 81 are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor 81 is only an example, and the gate electrode, the source electrode, and the drain electrode of the transistor might each function as a wiring.

In addition, insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included. Furthermore, one or more of the layers illustrated in the drawing are not included in some cases.

It is particularly preferable to use transistors including an oxide semiconductor (OS transistors) as the transistors 51a and 52a.

Extremely low off-state current of the OS transistor can widen the dynamic range of imaging. In the configuration of the circuit 10, a decrease in the intensity of light entering the photoelectric conversion element 60a reduces the potential of the charge detection portion (ND). Since the OS transistor has extremely low off-state current, a current based on a gate potential can be accurately output even when the gate potential is extremely low. Thus, it is possible to widen the detection range of illuminance, i.e., the dynamic range.

A period during which charge can be held in the charge detection portion (ND) and the charge accumulation portion (NR) can be extremely long owing to the low off-state current of the transistors 51a and 52a. Therefore, a global shutter system in which accumulation operation is performed in all the pixels at the same time can be used without a complicated circuit structure and operation method.

Figure 16A:
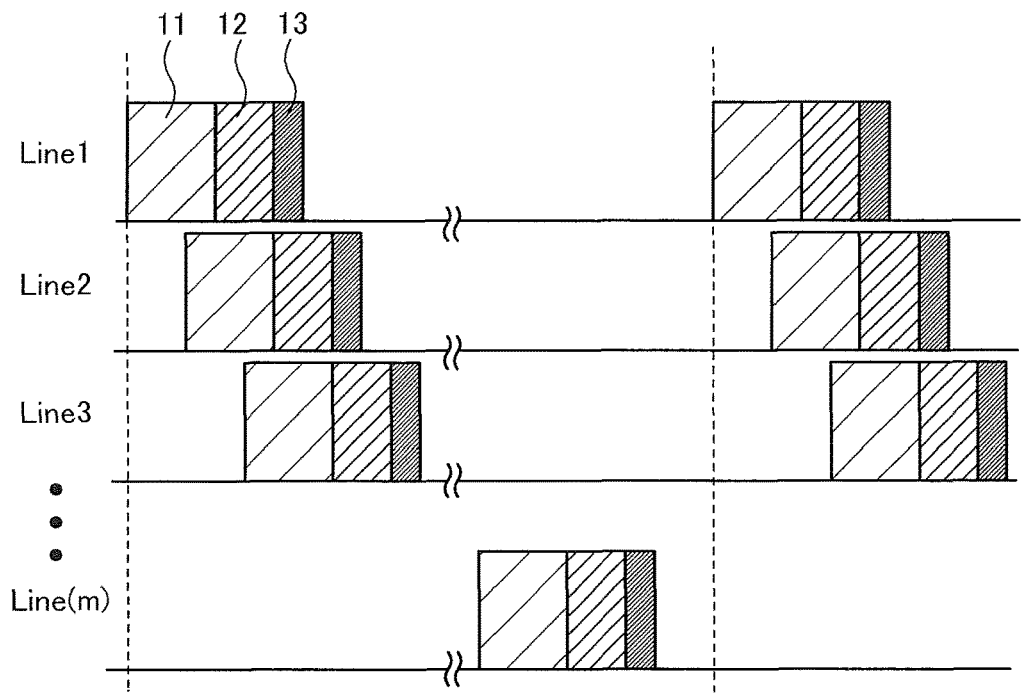
FIGS. 16A and 16B show operations of a rolling shutter system and a global shutter system, respectively.

In general, in an imaging device where pixels are arranged in a matrix, a rolling shutter system is employed in which imaging operation 11, retention operation 12, and read operation 13 are performed row by row as illustrated in FIG. 16A. In the case of employing the rolling shutter system, simultaneousness of imaging is lost. Therefore, when an object moves, an image is distorted.

Figure 16B:
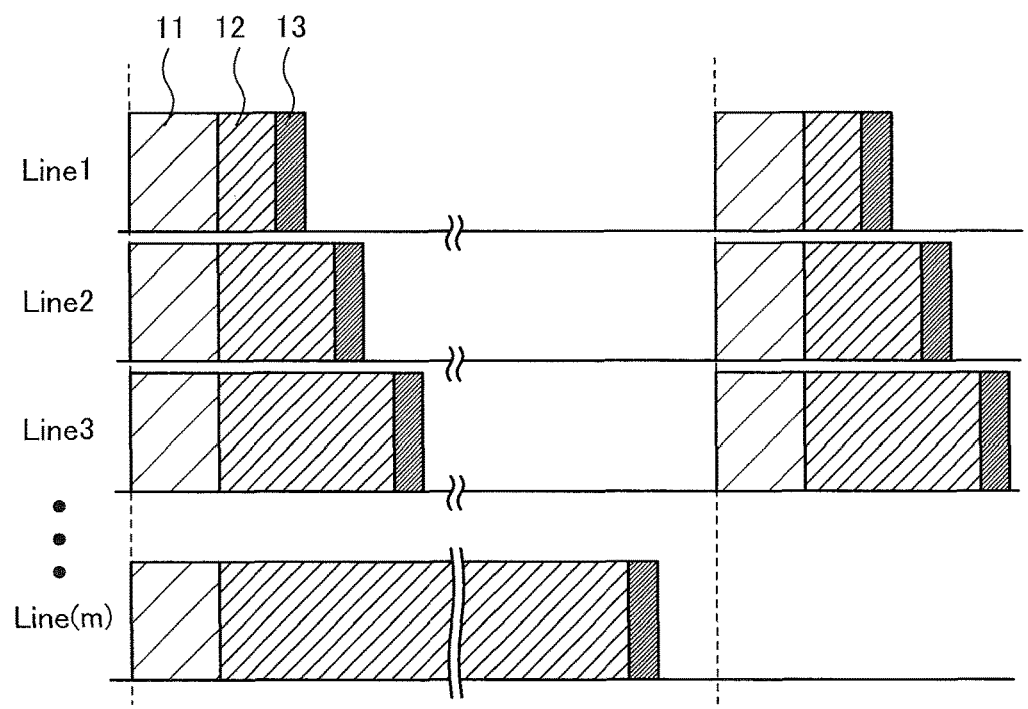

As a result, in one embodiment of the present invention, it is preferable to employ a global shutter system in which the imaging operation 11 can be performed simultaneously in all the rows and the read operation 13 can be sequentially performed row by row as illustrated in FIG. 16B. By employing the global shutter system, simultaneousness of imaging in all the pixels in the imaging device can be secured, and an image with little distortion can be easily obtained even when an object moves. Furthermore, exposure time (a period for conducting charge accumulation operation) can be long in a global shutter system; thus, the imaging device is suitable for imaging even in a low illuminance environment.

In addition, the OS transistor has lower temperature dependence of change in electrical characteristics than a Si transistor, and thus can be used in an extremely wide range of temperatures. Therefore, an imaging device and a semiconductor device that include OS transistors are suitable for use in automobiles, aircrafts, and spacecrafts.

Moreover, the OS transistor has higher drain breakdown voltage than the Si transistor. In a photoelectric conversion element including a selenium-based material in a photoelectric conversion layer, a relatively high voltage (e.g., 10 V or more) is preferably applied to easily cause an avalanche phenomenon. Therefore, by combination of the OS transistor and the photoelectric conversion element including a selenium-based material in the photoelectric conversion layer, a highly reliable imaging device can be obtained.

Figure 15B:
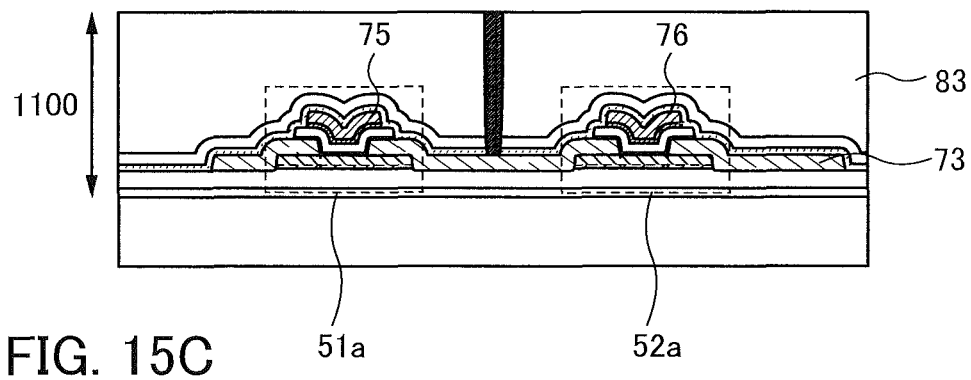
Figure 15C:
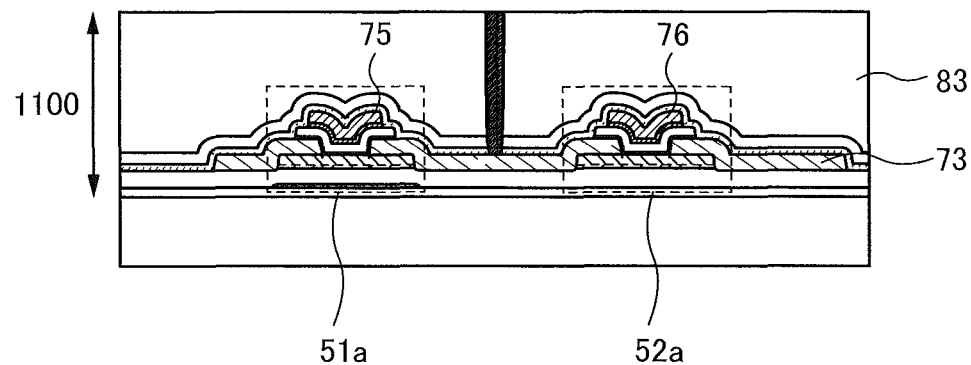

Note that although each transistor includes a back gate in FIG. 15A, each transistor does not necessarily include a back gate as illustrated in FIG. 15B. Alternatively, as illustrated in FIG. 15C, one or more transistors, for example, only the transistor 51a may include a back gate. The back gate might be electrically connected to a front gate of the transistor, which is provided to face the back gate. Alternatively, different fixed potentials might be supplied to the back gate and the front gate. Note that the presence or absence of the back gate can also be applied to another imaging device described in this embodiment.

A variety of elements can be used as the photoelectric conversion element 60a provided in the layer 1200. FIG. 15A illustrates the photoelectric conversion element 60a including a selenium-based material in a photoelectric conversion layer 61. The photoelectric conversion element 60a including a selenium-based material has high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, making the photoelectric conversion layer 61 thin easily.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to and a higher absorption coefficient for visible light than amorphous selenium.

Furthermore, the photoelectric conversion layer 61 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize an avalanche phenomenon like the photoelectric conversion element including selenium alone.

In the photoelectric conversion element 60a using the selenium-based material, for example, the photoelectric conversion layer 61 can be provided between a light-transmitting conductive layer 62 and the electrode 66 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, by combination of the OS transistor having high drain breakdown voltage and the photoelectric conversion element including the selenium-based material in the photoelectric conversion layer, a highly sensitive and highly reliable imaging device can be obtained.

Figure 17A:
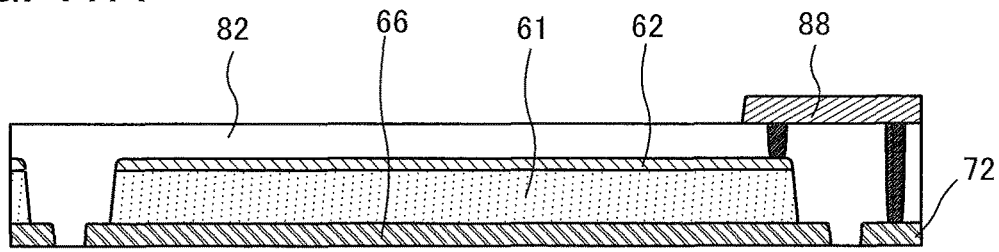
FIGS. 17A to 17D are cross-sectional views each illustrating connection of a photoelectric conversion element.
Figure 17B:
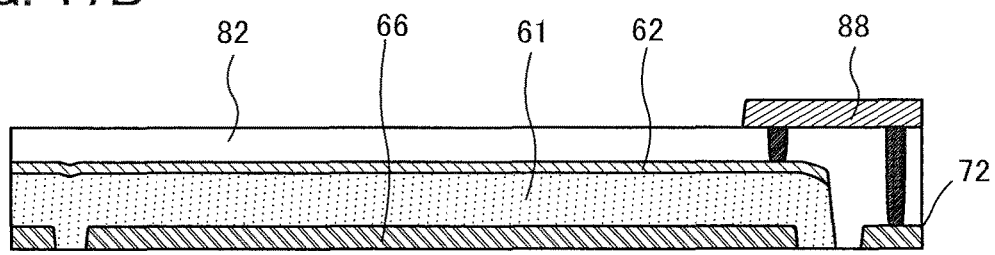
Figure 17C:
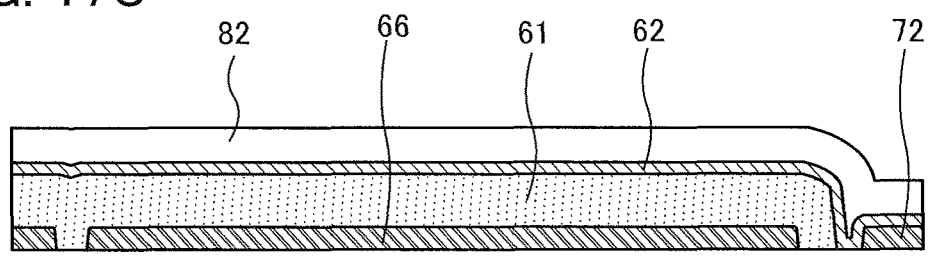
Figure 17D:
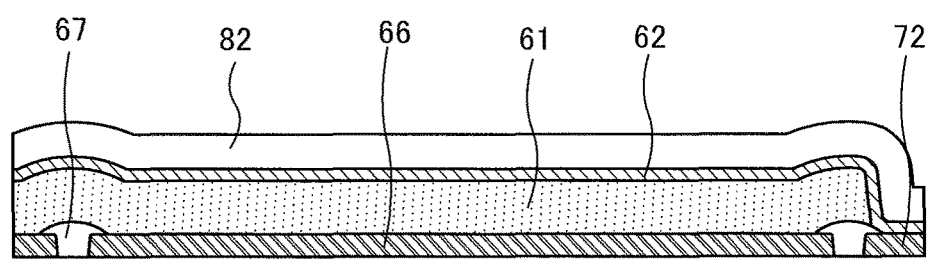

Although the photoelectric conversion layer 61 and the light-transmitting conductive layer 62 are not divided between circuits in FIG. 15A, they may be divided between circuits as illustrated in FIG. 17A. In a region between pixels where the electrode 66 is not provided, a partition wall 67 formed of an insulator is preferably provided, thereby preventing generation of a crack in the photoelectric conversion layer 61 and the light-transmitting conductive layer 62. However, the partition wall 67 is not necessarily provided as illustrated in FIG. 17B. Although the light-transmitting conductive layer 62 and the wiring 72 are connected to each other through a wiring 88 and the conductor 81 in FIG. 15A, the light-transmitting conductive layer 62 and the wiring 72 may be in direct contact with each other as in FIGS. 17C and 17D.

Figure 18A:
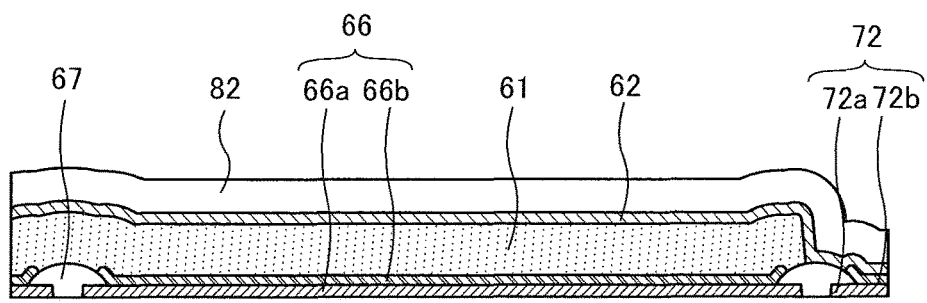
FIGS. 18A and 18B are cross-sectional views each illustrating connection of a photoelectric conversion element.

The electrode 66, the wiring 72, and the like may each be a multilayer. For example, as illustrated in FIG. 18A, the electrode 66 can include two conductive layers 66a and 66b and the wiring 72 can include two conductive layers 72a and 72b. In the structure in FIG. 18A, for example, the conductive layers 66a and 72a may be made of a low-resistance metal or the like, and the conductive layers 66b and 72b may be made of a metal or the like that exhibits an excellent contact property with the photoelectric conversion layer 61. Such a structure improves the electrical properties of the photoelectric conversion element. Furthermore, even when the conductive layer 72a contains a metal that causes electrolytic corrosion, which occurs when some kinds of metal are in contact with the light-transmitting conductive layer 62, the electrolytic corrosion can be prevented because the conductive layer 72b is between the conductive layer 72a and the light-transmitting conductive layer 62.

The conductive layers 66b and 72b can be formed using, for example, molybdenum, tungsten, or the like. The conductive layers 66a and 72a can be formed using, for example, aluminum, titanium, or a stack of titanium, aluminum, and titanium that are layered in that order.

Figure 18B:
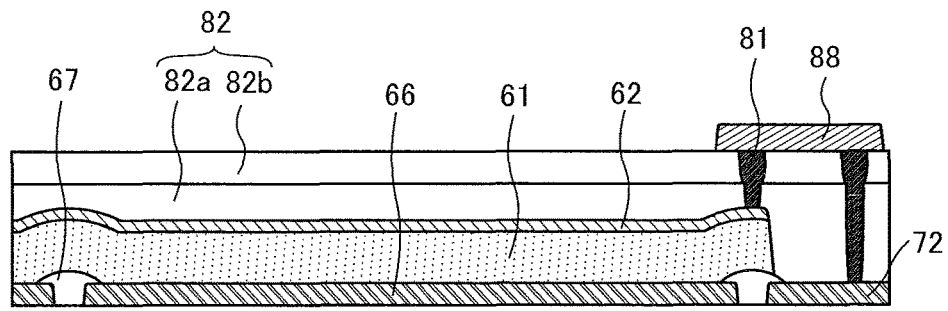

The insulating layer 82 and the like may each be a multilayer. For example, as illustrated in FIG. 18B, the conductor 81 has a difference in level in the case where the insulating layer 82 includes insulating layers 82a and 82b that have different etching rates. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

Note that the electrode 66 illustrated in FIG. 15A, FIGS. 17A to 17D, and FIG. 18B and the conductive layer 66b illustrated in FIG. 18A preferably have high planarity in order to prevent a short circuit with the light-transmitting conductive layer 62 caused by, for example, poor coverage with the photoelectric conversion layer 61. When the electrode 66 and the conductive layer 66b described above have high planarity, adhesion to the photoelectric conversion layer 61 is improved in some cases.

As an example of a conductive film having high planarity, an indium tin oxide film containing silicon at 1% to 20% can be given. The high planarity of an indium tin oxide film containing silicon has been confirmed by the measurement using an atomic force microscope. A region of 2 μm×2 μm in an indium tin oxide film which has been subjected to heat treatment at 350° C. for 1 hour and a region of 2 μm×2 μm in an indium tin oxide film containing silicon at 10% which has been subjected to the same heat treatment were observed by an atomic force microscope; the peak-to-valley height (P-V) of the former was 23.3 nm, and that of the latter was 7.9 nm.

Since the indium tin oxide film is crystallized at a relatively low temperature even when it is amorphous at the time of its deposition, surface roughness due to the growth of crystal grains is easily caused. In contrast, when the indium tin oxide film containing silicon is analyzed by an X-ray diffraction, a peak does not appear even in the case where the film has been subjected to heat treatment at a temperature higher than 400° C. In other words, the indium tin oxide film containing silicon keeps its amorphous state even after heat treatment at a relatively high temperature. Therefore, the surface roughness of the indium tin oxide film containing silicon is less likely to occur.

Note that the partition wall 67 can be formed using an inorganic insulator, an insulating organic resin, or the like. The partition wall 67 may be colored black or the like in order to shield the transistors and the like from light and/or to determine the area of a light-receiving portion in each pixel.

Alternatively, a PIN diode element formed using an amorphous silicon film, a microcrystalline silicon film, or the like may be used as the photoelectric conversion element 60a.

Figure 19:
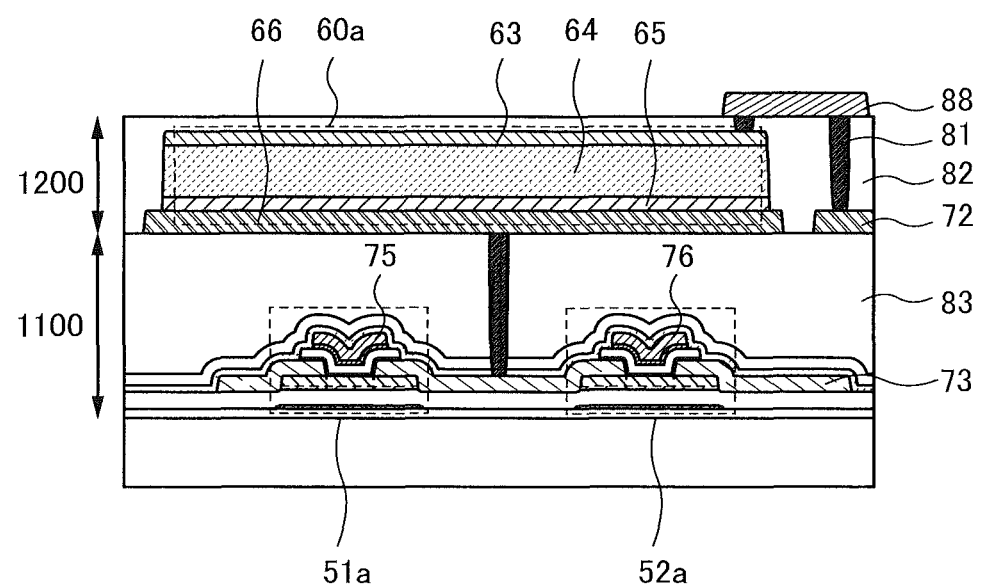
FIG. 19 is a cross-sectional view illustrating the structure of an imaging device.

FIG. 19 illustrates an example in which a thin film PIN photodiode is used as the photoelectric conversion element 60a. In the photodiode, a p-type semiconductor layer 65, an i-type semiconductor layer 64, and an n-type semiconductor layer 63 are stacked in that order. The i-type semiconductor layer 64 is preferably formed using amorphous silicon. The n-type semiconductor layer 63 and the p-type semiconductor layer 65 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element 60a in FIG. 19, the p-type semiconductor layer 65 is electrically connected to the electrode 66 that is electrically connected to the transistors 51a and 53a. Furthermore, the n-type semiconductor layer 63 is electrically connected to the wiring 72 through the conductor 81.

FIGS. 20A to 20F show other examples of the structure of the photoelectric conversion element 60a having a configuration of a PIN thin film photodiode and the connection between the photoelectric conversion element 60a and the wirings. Note that the structure of the photoelectric conversion element 60a and the connection between the photoelectric conversion element 60a and the wirings are not limited thereto, and other configurations may be applied.

Figure 20A:
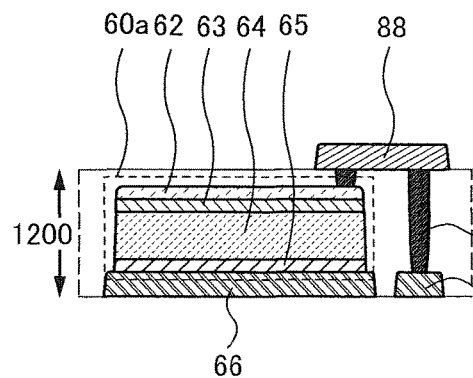
FIGS. 20A to 20F are cross-sectional views each illustrating connection of a photoelectric conversion element.

FIG. 20A illustrates a structure of the photoelectric conversion element 60a that includes the light-transmitting conductive layer 62 in contact with the p-type semiconductor layer 63. The light-transmitting conductive layer 62 serves as an electrode and can increase the output current of the photoelectric conversion element 60a.

For the light-transmitting conductive layer 62, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 62 is not limited to a single layer, and may be a stacked layer of different films.

Figure 20B:
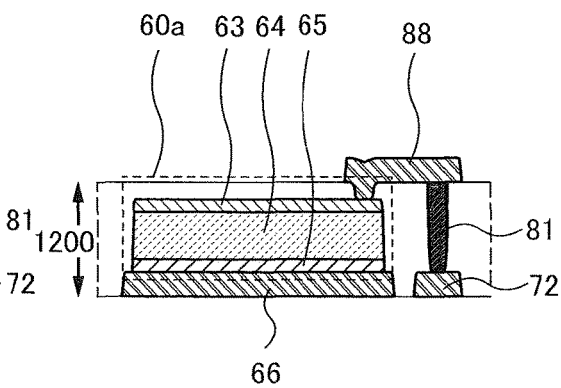

FIG. 20B illustrates a structure of the photoelectric conversion element 60a in which the n-type semiconductor layer 63 is electrically connected directly to the wiring 88.

Figure 20C:
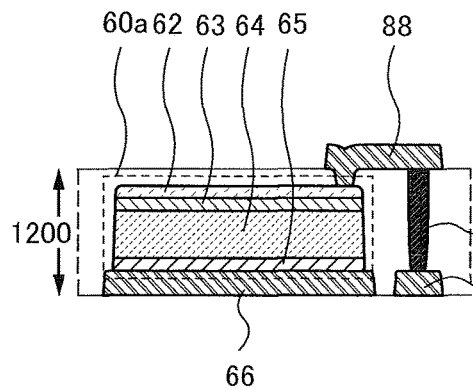

FIG. 20C illustrates a structure of the photoelectric conversion element 60a which includes the light-transmitting conductive layer 62 in contact with the n-type semiconductor layer 63 and in which the wiring 88 is electrically connected to the light-transmitting conductive layer 62.

Figure 20D:
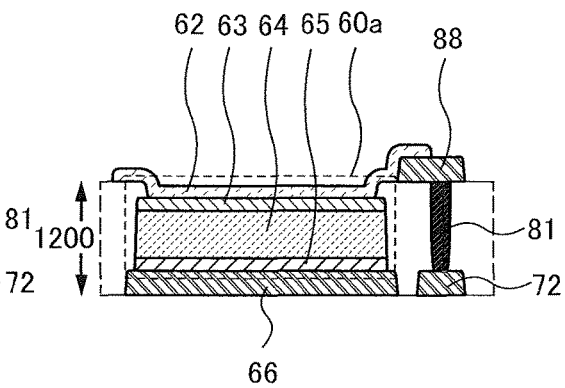

FIG. 20D illustrates a structure in which an opening exposing the n-type semiconductor layer 63 is provided in an insulating layer covering the photoelectric conversion element 60a, and the light-transmitting conductive layer 62 that covers the opening is electrically connected to the wiring 88.

Figure 20E:
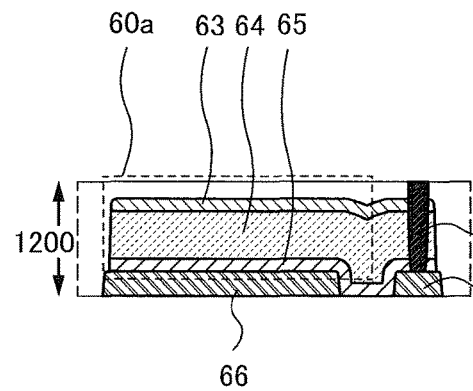

FIG. 20E illustrates a structure including the conductor 81 which penetrates the photoelectric conversion element 60a. In the structure, the wiring 72 is electrically connected to the n-type semiconductor layer 63 through the conductor 81. Note that in the drawing, the wiring 72 appears to be electrically connected to the electrode 66 through the p-type semiconductor layer 65. However, because of a high resistance in the lateral direction of the p-type semiconductor layer 65, the resistance between the wiring 72 and the electrode 66 is extremely high when there is an appropriate distance therebetween. Thus, the photoelectric conversion element 60a can have diode characteristics without a short circuit between the anode and the cathode. Note that two or more conductors 81 that are electrically connected to the n-type semiconductor layer 63 may be provided.

Figure 20F:
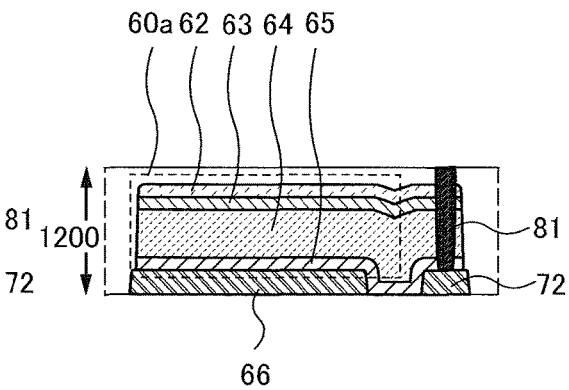

FIG. 20F illustrates a structure in which the photoelectric conversion element 60a in FIG. 20E is provided with the light-transmitting conductive layer 62 in contact with the n-type semiconductor layer 63.

Note that each of the photoelectric conversion elements 60a illustrated in FIGS. 20D to 20F has an advantage of having a large light-receiving area because wirings and the like do not overlap with a light-receiving region.

Figure 21:
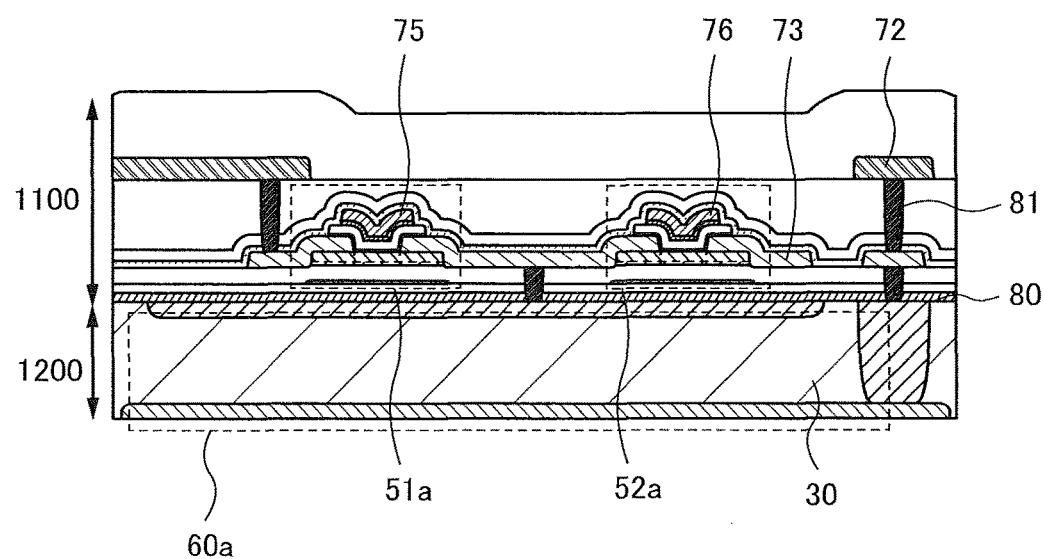
FIG. 21 is a cross-sectional view illustrating the structure of an imaging device.

Alternatively, as illustrated in FIG. 21, the photoelectric conversion element 60a may be a photodiode including a silicon substrate 30 as a photoelectric conversion layer.

The photoelectric conversion element 60a formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 61 does not need to be divided between circuits as illustrated in FIG. 15A. Therefore, the imaging device of one embodiment of the present invention can be manufactured with a high yield at low cost. In contrast, a photodiode including the silicon substrate 30 as the photoelectric conversion layer requires difficult processes such as a polishing process and a bonding process.

Figure 22A:
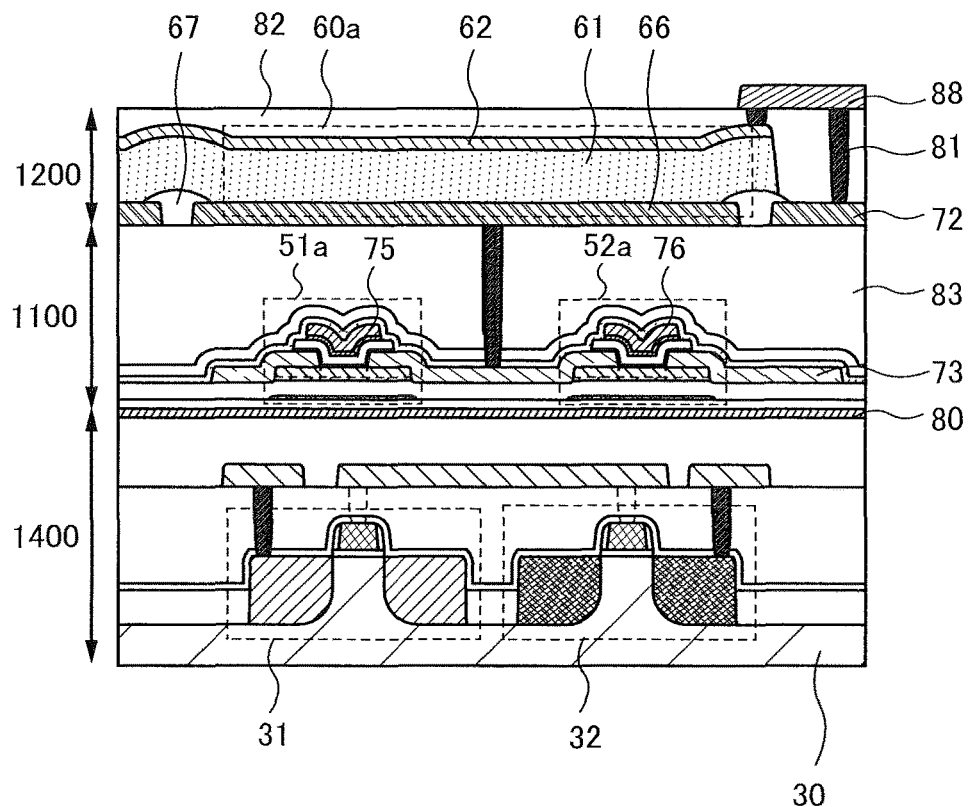
FIGS. 22A and 22B are cross-sectional views illustrating the structure of an imaging device.
Figure 22B:
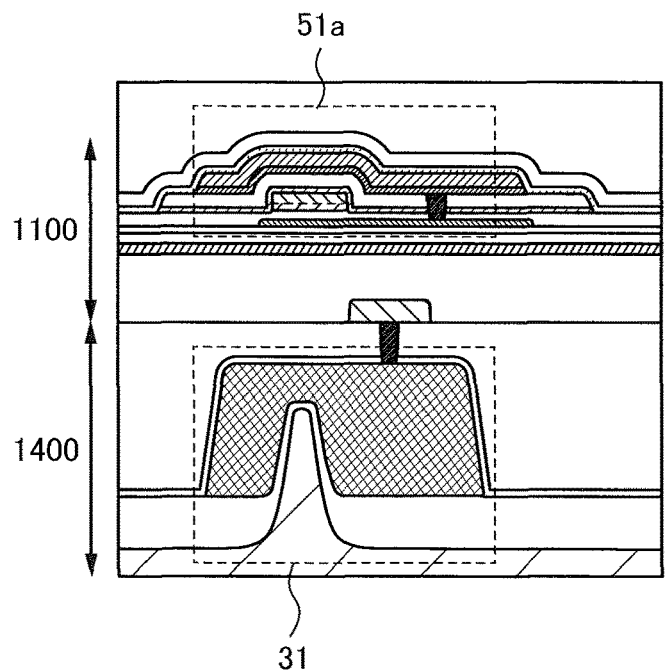

Furthermore, the imaging device of one embodiment of the present invention may be stacked over the silicon substrate 30 including circuits. For example, as illustrated in FIG. 22A, the pixel circuit may overlap with a layer 1400 that includes transistors 31 and 32 whose active regions are formed in the silicon substrate 30. FIG. 22B is a cross-sectional view illustrating the transistors in the channel width direction.

Figure 23A:
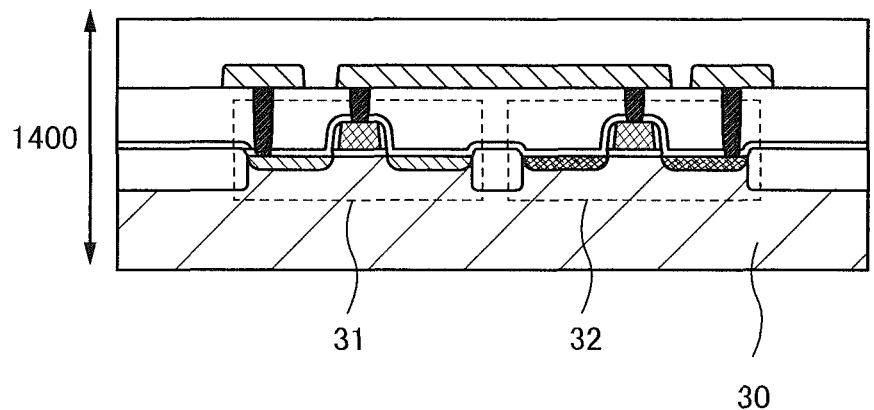
FIGS. 23A to 23C are cross-sectional views and a circuit diagram illustrating the structures of imaging devices.
Figure 23B:
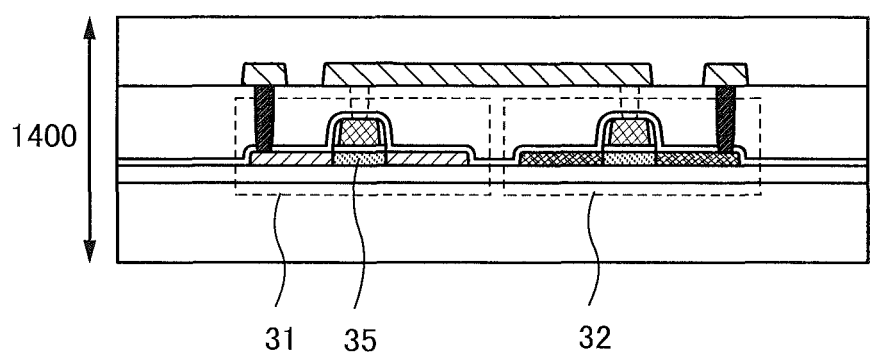

Although FIGS. 22A and 22B show the Si transistors of a fin type, the transistors may be of a planar type as illustrated in FIG. 23A. Alternatively, as illustrated in FIG. 23B, they may be transistors each including an active layer 35 formed using a silicon thin film. The active layer 35 can be formed using polycrystalline silicon or single crystal silicon of a silicon-on-insulator (SOI) structure.

Figure 23C:
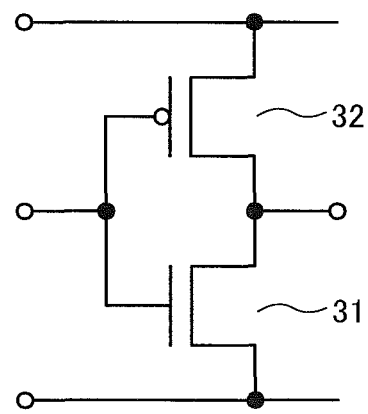

The circuit formed on the silicon substrate 30 is capable of reading a signal output from the pixel circuit and converting the signal; for example, the circuit may include a CMOS inverter as illustrated in the circuit diagram in FIG. 23C. Note that the circuit corresponds to each of the circuits 28 and 29 illustrated in FIG. 5B. A gate of the transistor 31 (n-channel transistor) is electrically connected to a gate of the transistor 32 (p-channel transistor). One of a source and a drain of one of the transistors 31 and 32 is electrically connected to one of a source and a drain of the other transistor. The other of the source and the drain of the one transistor is electrically connected to a wiring and the other of the source and the drain of the other transistor is electrically connected to another wiring.

The silicon substrate 30 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 21 and FIG. 22A, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 31 and 32. Therefore, hydrogen has an effect of improving the reliability of the transistors 31 and 32. Meanwhile, hydrogen in insulating layers provided in the vicinity of the oxide semiconductor layer that is the active layer of the transistor 51a or the like causes generation of carriers in the oxide semiconductor layer, and therefore may reduce the reliability of the transistor 51a or the like. Thus, the insulating layer 80 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 80, so that the reliability of the transistors 31 and 32 can be improved. Furthermore, diffusion of hydrogen from the one layer to the other layer is inhibited, so that the reliability of the transistor 51a or the like can also be improved.

The insulating layer 80 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 22A, a circuit (e.g., a driver circuit) formed on the silicon substrate 30, the transistor 51a or the like, and the photoelectric conversion element 60a can overlap with each other; thus, the integration degree of pixels can be increased. In other words, the resolution of the imaging device can be increased. Such a structure is suitable for an imaging device with, for example, 4K2K, 8K4K, or 16K8K pixels. Note that a structure may be employed in which Si transistors are formed as the transistor 53a, the transistor 54a, and the like included in the circuit 10 so as to overlap with the transistor 51a or the like and the photoelectric conversion element 60a.

In the imaging device in FIG. 22A, the silicon substrate 30 is not provided with a photoelectric conversion element. Therefore, an optical path for the photoelectric conversion element 60a can be secured without being influenced by the transistors or wirings, and a pixel with a high aperture ratio can be formed.

Figure 24:
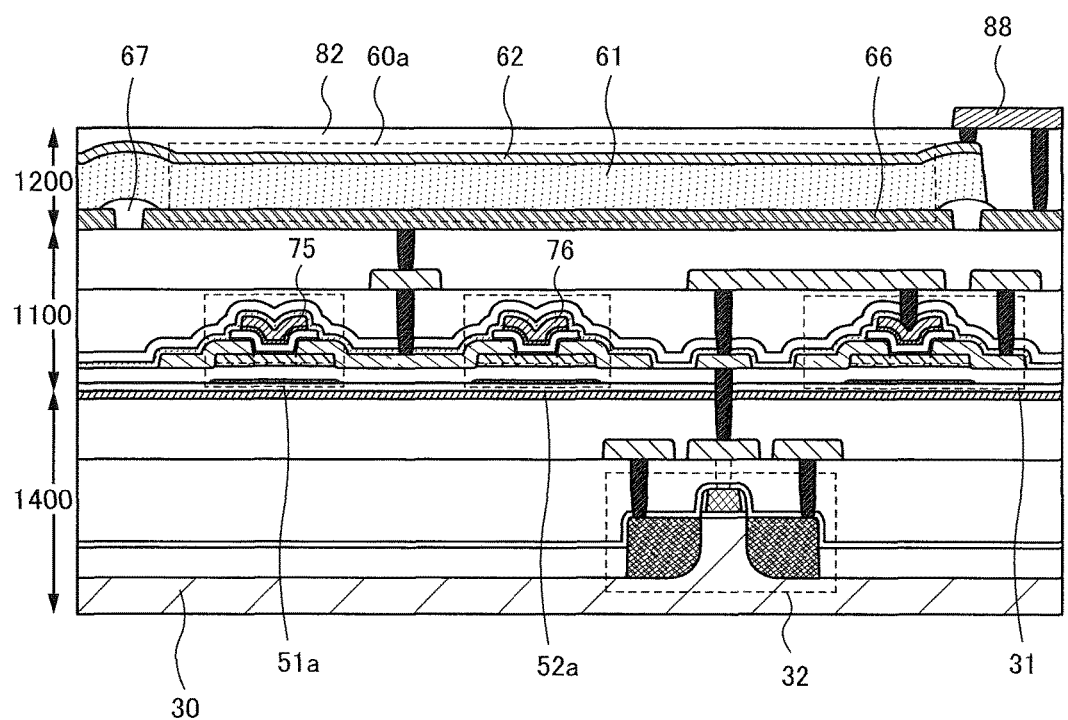
FIG. 24 is a cross-sectional view illustrating the structure of an imaging device.

An imaging device of one embodiment of the present invention can also have a structure in FIG. 24.

The imaging device in FIG. 24 is a modification example of the imaging device in FIG. 22A. A CMOS inverter is formed using an OS transistor and a Si transistor.

Here, the transistor 32 is a p-channel Si transistor provided in the layer 1400, and the transistor 31 is an n-channel OS transistor provided in the layer 1100. When only the p-channel transistor is provided on the silicon substrate 30, a step of forming a well, an n-type impurity layer, or the like can be skipped.

Although selenium is used for the photoelectric conversion element 60a in the imaging device in FIG. 24, a PIN thin film photodiode may be used as in FIG. 19.

In the imaging device in FIG. 24, the transistor 31 can be formed through the same process as the transistors 51a and 52a formed in the layer 1100. Thus, the manufacturing process of the imaging device can be simplified.

Figure 25:
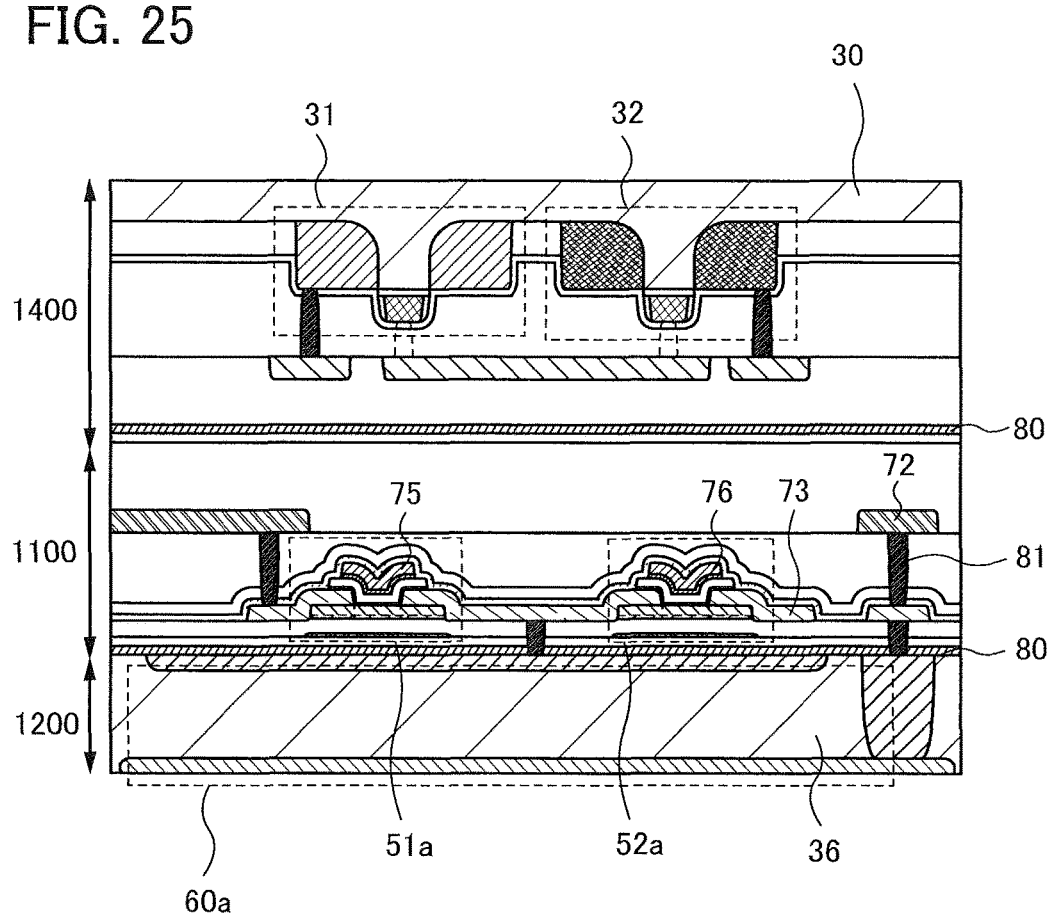
FIG. 25 is a cross-sectional view illustrating the structure of an imaging device.

As illustrated in FIG. 25, an imaging device of one embodiment of the present invention may have a structure where a pixel includes a photodiode formed on a silicon substrate 36 and OS transistors formed over the photodiode and the pixel and the silicon substrate 30 on which the circuit is formed are attached to each other. Such a structure is suitable for increasing the effective area of the photodiode formed on the silicon substrate 36. Furthermore, the integration degree of the circuit formed on the silicon substrate 30 can be improved using miniaturized Si transistors; thus, a high-performance semiconductor device can be provided.

Figure 26:
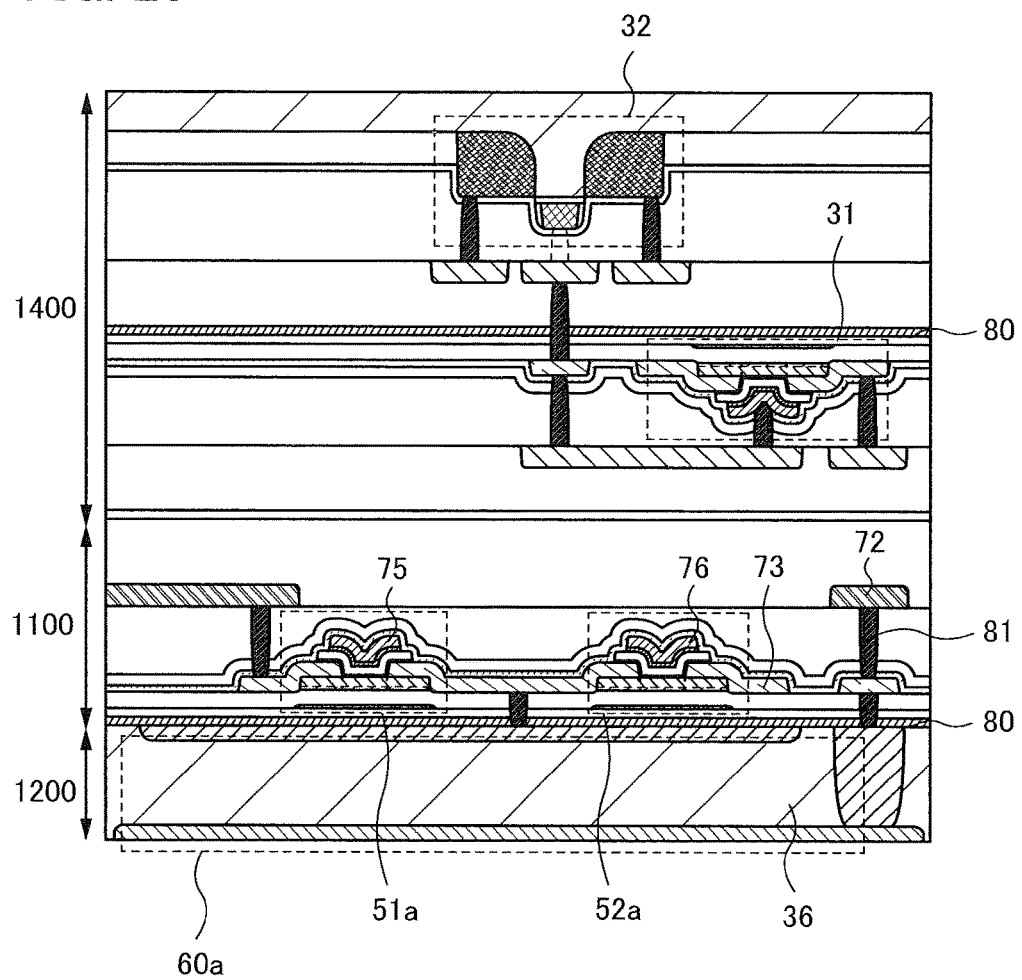
FIG. 26 is a cross-sectional view illustrating the structure of an imaging device.
Figure 27:
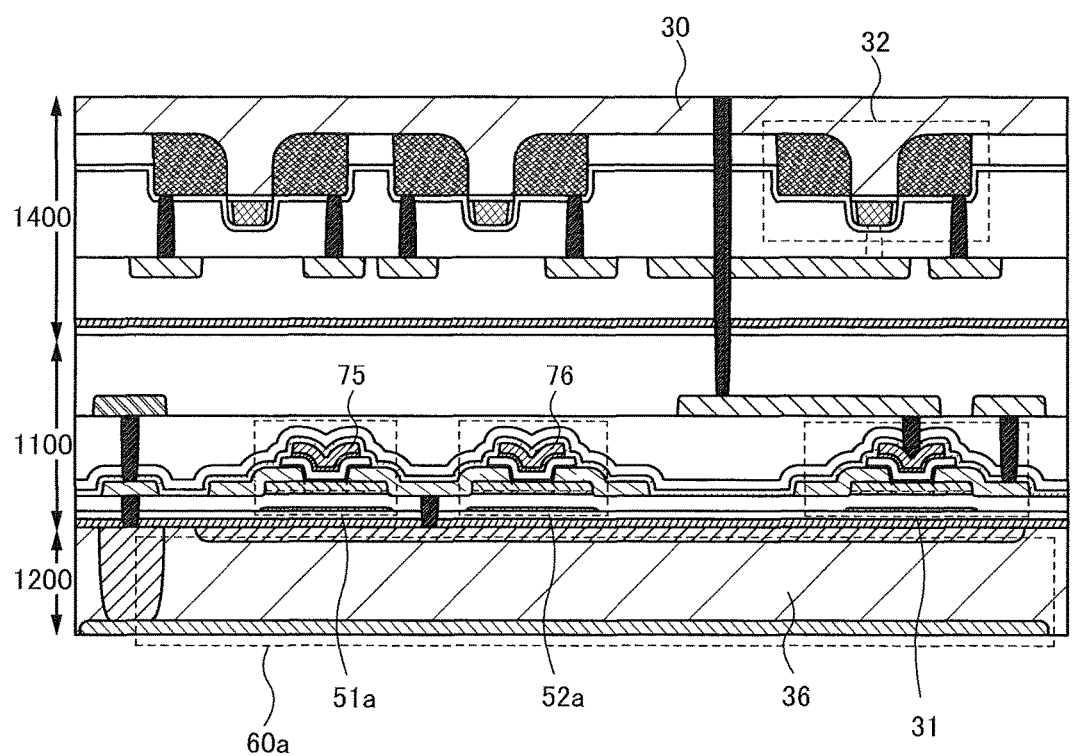
FIG. 27 is a cross-sectional view illustrating the structure of an imaging device.

FIG. 26 and FIG. 27 each show a modification example of FIG. 25, in which a circuit includes an OS transistor and a Si transistor. Such a structure is suitable for increasing the effective area of the photodiode formed on the silicon substrate 36. Furthermore, the integration degree of the circuit formed on the silicon substrate 30 can be improved using miniaturized Si transistors; thus, a high-performance semiconductor device can be provided.

The structure illustrated in FIG. 26 is effective in the case where an image processing circuit or the like is formed because a nonvolatile memory can be formed using an OS transistor and a Si transistor on the silicon substrate 30. In the case of the structure illustrated in FIG. 26, a CMOS circuit can be formed using the OS transistor and the Si transistor on the silicon substrate 30. Since the off-state current of the OS transistor is extremely low, the static leakage current of the CMOS circuit can be extremely low.

The structure illustrated in FIG. 27 is effective in the case where an image processing circuit or the like is formed because a nonvolatile memory can be formed using an OS transistor over the silicon substrate 36 and a Si transistor on the silicon substrate 30. In the case of the structure illustrated in FIG. 27, a CMOS circuit can be formed using the OS transistor over the silicon substrate 36 and the Si transistor on the silicon substrate 30.

Note that the structure of the transistor and the photoelectric conversion element included in each of the imaging devices described in this embodiment is only an example. Therefore, for example, one or more of the transistors 51a to 54a may include silicon or the like in an active region or an active layer. Furthermore, one of or both the transistors 31 and 32 may include an oxide semiconductor layer as an active layer.

Figure 28A:
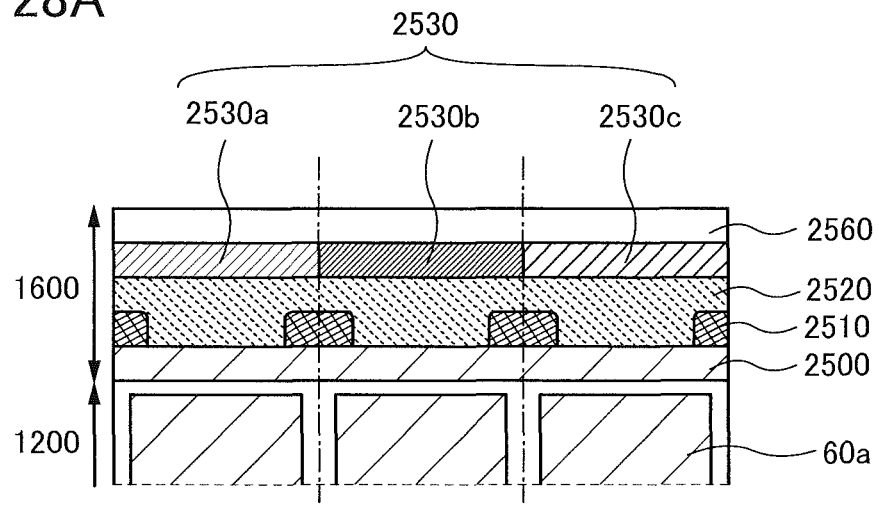
FIGS. 28A to 28C are cross-sectional views each illustrating the structure of an imaging device.

FIG. 28A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element 60a is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 28B:
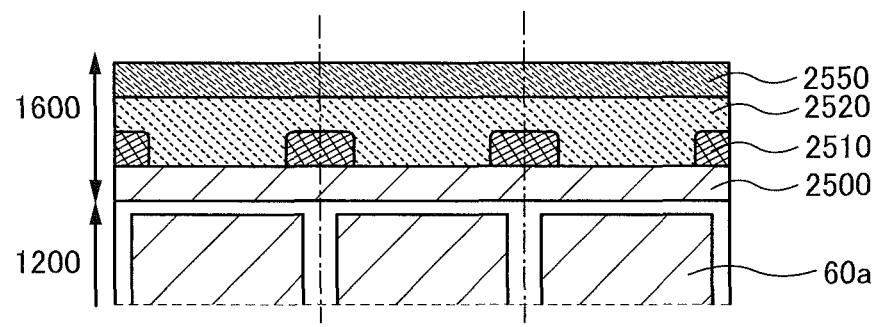

As illustrated in FIG. 28B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiation and is used for an X-ray imaging device or the like can be obtained. Radiation such as X-rays passes through a subject to enter a scintillator, and then is converted into light (fluorescence) such as visible light or ultraviolet light owing to a phenomenon known as photoluminescence. Then, the photoelectric conversion element 60a detects the light to obtain image data. Furthermore, the imaging device having the structure may be used in a radiation detector or the like.

A scintillator is formed of a substance that, when irradiated with radiation such as X-rays or gamma-rays, absorbs energy of the radial rays to emit visible light or ultraviolet light. For example, a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed can be used.

In the photoelectric conversion element 60a using a selenium-based material, radiation such as X-rays can be directly converted into charge; thus, the scintillator is not necessarily used.

A microlens array 2540 may be provided over the color filters 2530a, 2530b, and 2530c. Light penetrating lenses included in the microlens array 2540 goes through the color filters positioned thereunder to reach the photoelectric conversion element 60a. Note that a region other than the layer 1200 in FIGS. 28A to 28C is referred to as a layer 1600.

Figure 28C:
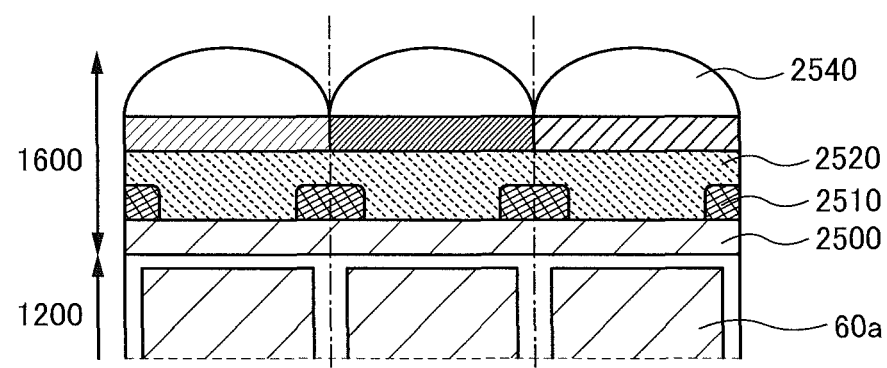
Figure 29:
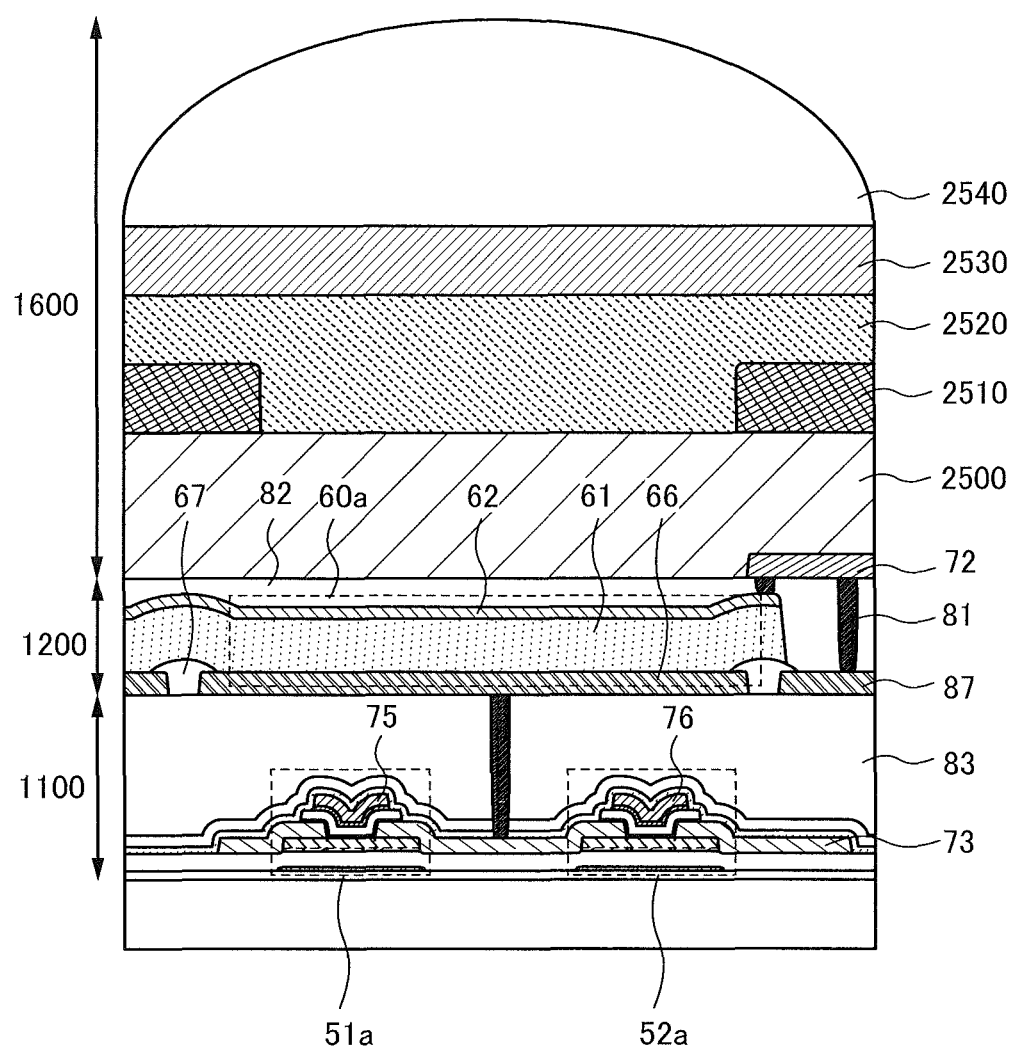
FIG. 29 is a cross-sectional view illustrating the structure of an imaging device.
Figure 30:
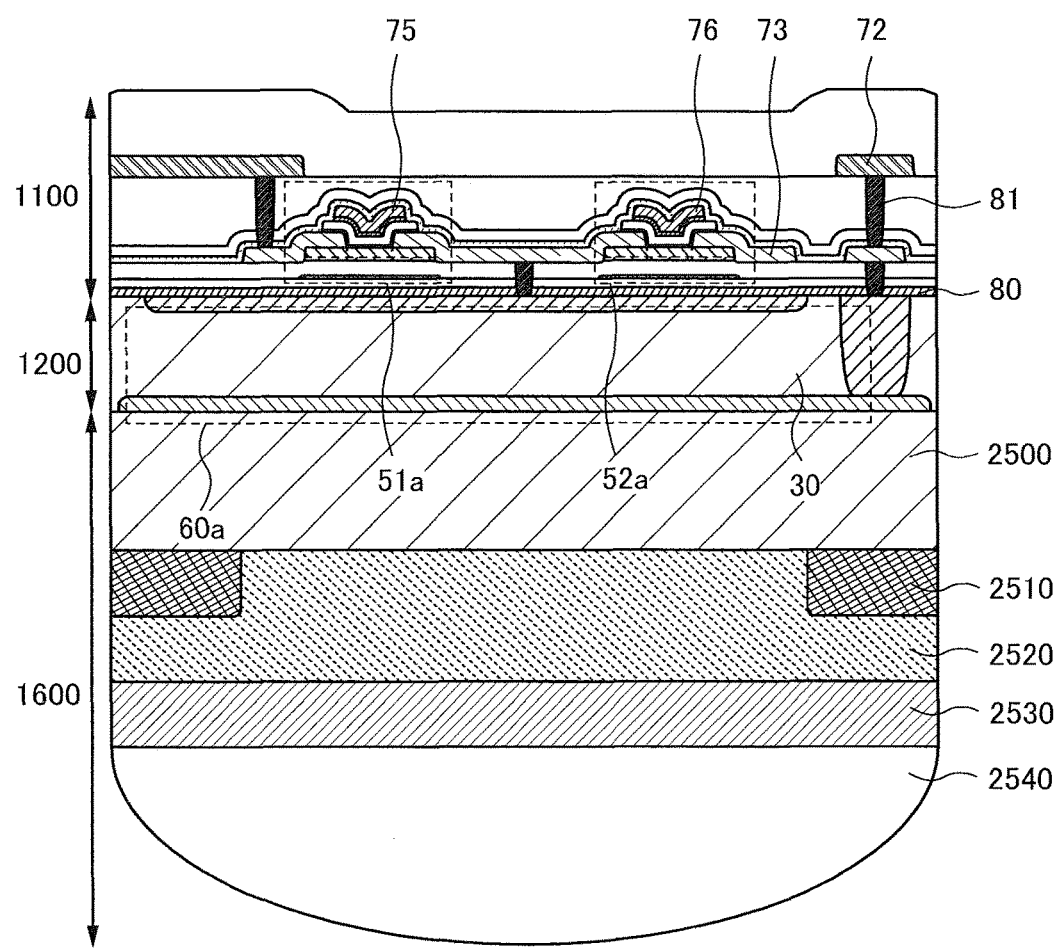
FIG. 30 is a cross-sectional view illustrating the structure of an imaging device.

The specific structure of the imaging device in FIG. 28C is illustrated in FIG. 29 by taking an example of the imaging device in FIG. 15A. In addition, the specific structure of the imaging device in FIG. 28C is illustrated in FIG. 30 by taking an example of the imaging device in FIG. 21.

Figure 31:
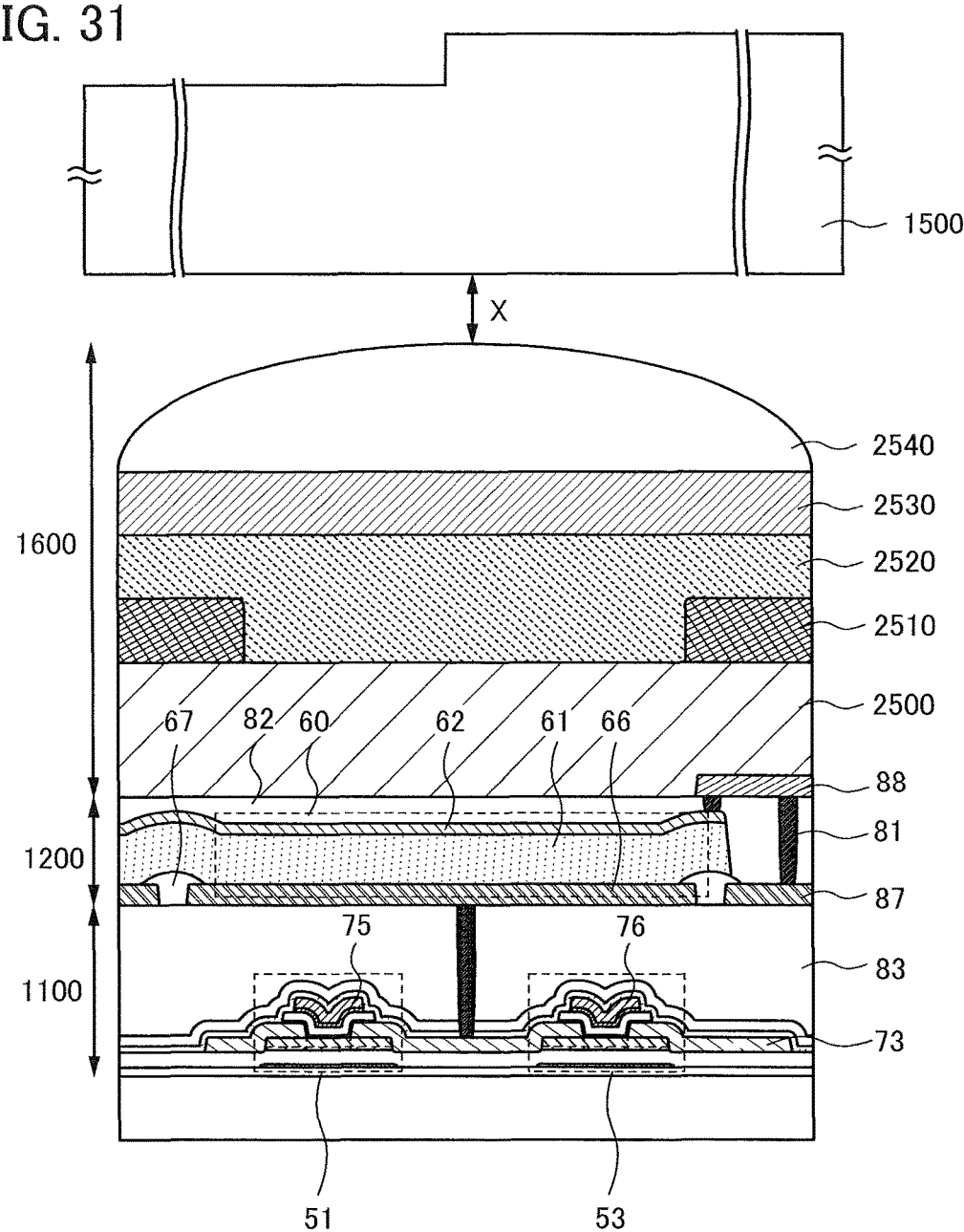
FIG. 31 is a cross-sectional view illustrating the structure of an imaging device.
Figure 32:
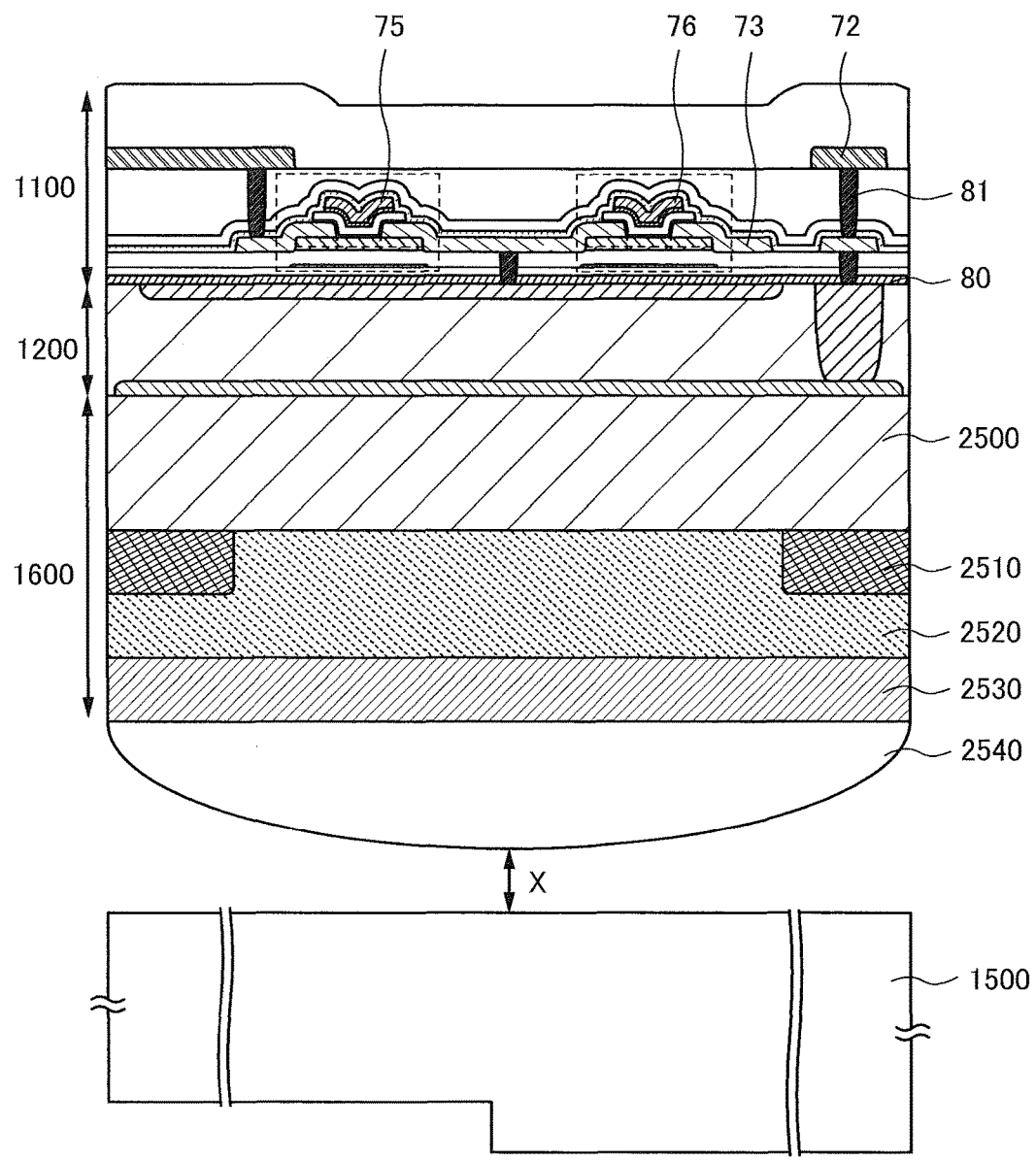
FIG. 32 is a cross-sectional view illustrating the structure of an imaging device.

The imaging device of one embodiment of the present invention may be combined with a diffraction grating 1500 as illustrated in FIG. 31 and FIG. 32. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

Figure 33:
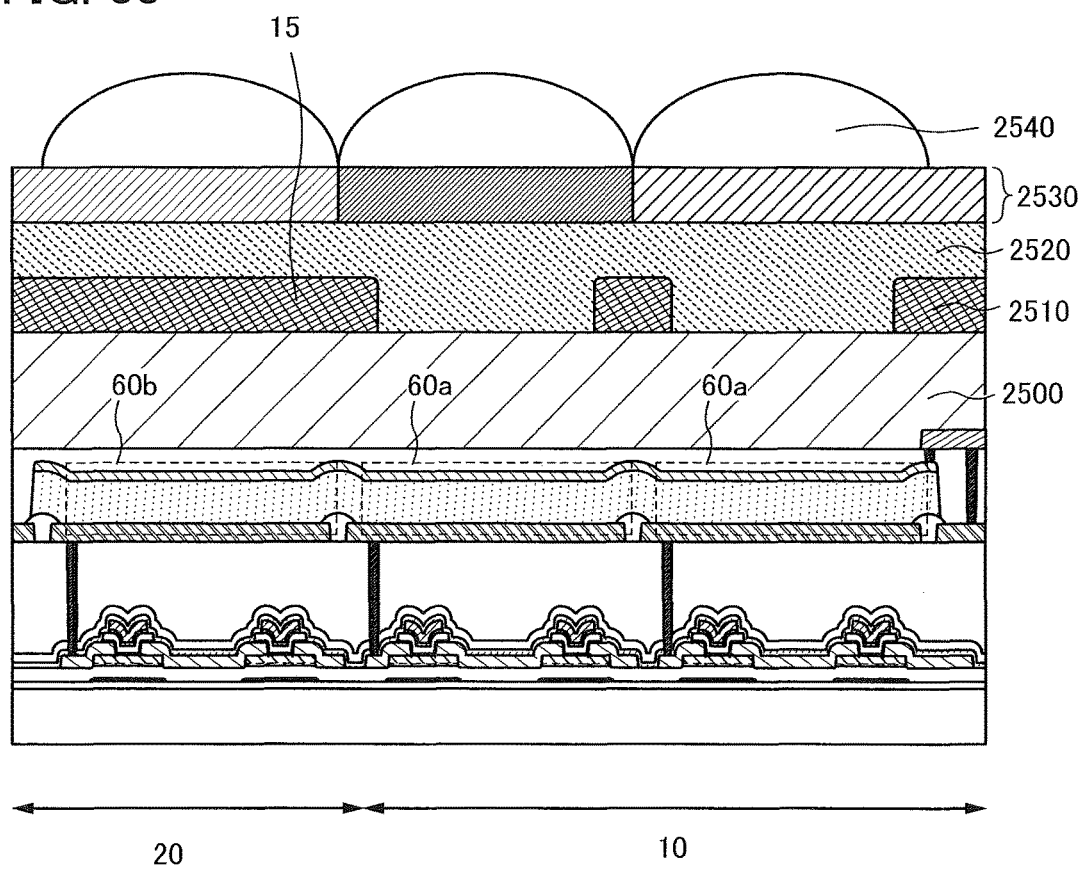
FIG. 33 is a cross-sectional view illustrating the structure of an imaging device.
Figure 34A:
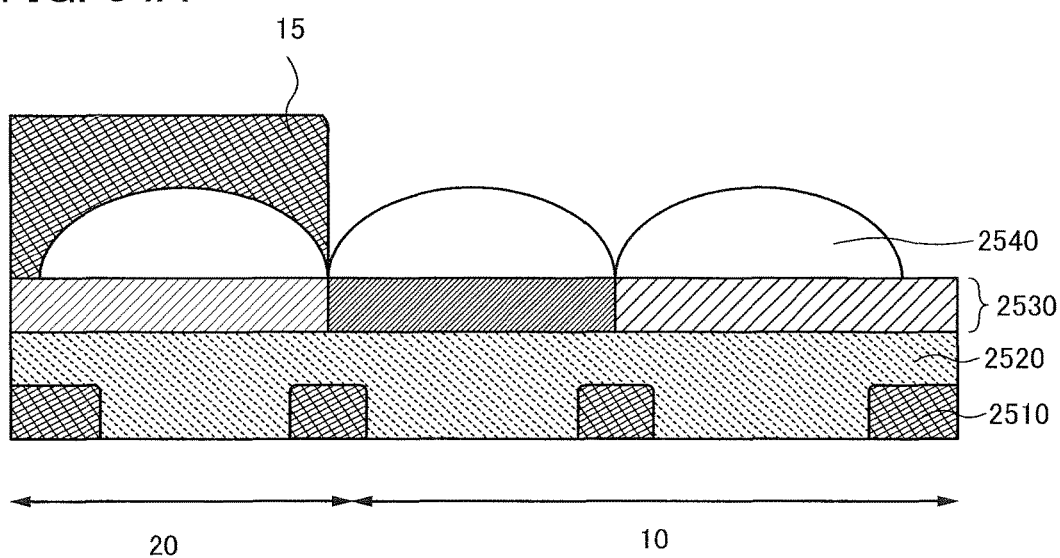
FIGS. 34A and 34B are cross-sectional views each illustrating the structure of an imaging device.
Figure 34B:
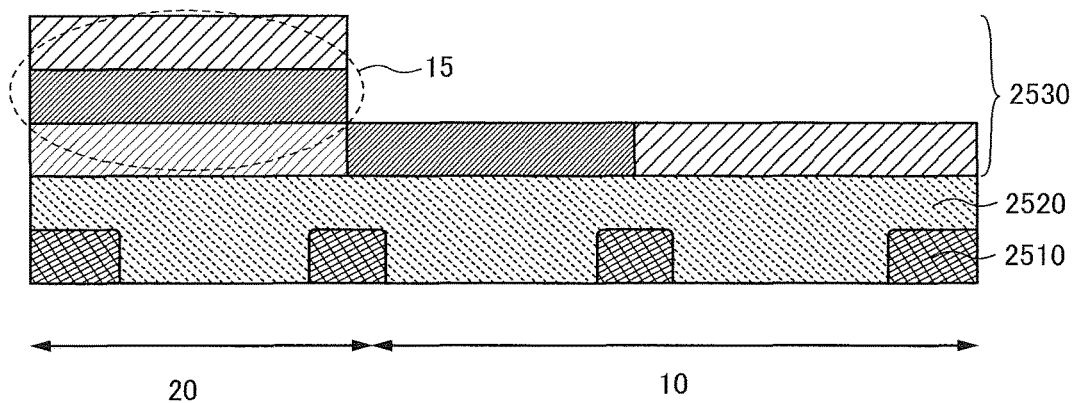

FIG. 33 is a cross-sectional view illustrating the positional relationship between the circuit 10, the circuit 20, and the light-blocking layer 15. The circuit 20 is covered with the light-blocking layer 2510 as illustrated in FIG. 33; thus, the light-blocking layer 2510 can partly function as the light-blocking layer 15. Alternatively, a metal layer, a black resin, or the like may be provided as the light-blocking layer 15 over part of the microlens array 2540 as illustrated in FIG. 34A. Further alternatively, as illustrated in FIG. 34B, stacked color filters of different colors may be provided as the light-blocking layer 15 over the circuit 20. Note that the structure of FIG. 33, the structure of FIG. 34A, and the structure of FIG. 34B may be combined as appropriate.

As illustrated in FIGS. 35A1 and 35B1, the imaging device may be bent. FIG. 35A1 illustrates a state in which the imaging device is bent in the direction of dashed-two dotted line X1-X2. FIG. 35A2 is a cross-sectional view illustrating a portion indicated by dashed-two dotted line X1-X2 in FIG. 35A1. FIG. 35A3 is a cross-sectional view illustrating a portion indicated by dashed-two dotted line Y1-Y2 in FIG. 35A1.

FIG. 35B1 illustrates a state where the imaging device is bent in the direction of dashed-two dotted line X3-X4 and the direction of dashed-two dotted line Y3-Y4. FIG. 35B2 is a cross-sectional view illustrating a portion indicated by dashed-two dotted line X3-X4 in FIG. 35B1. FIG. 35B3 is a cross-sectional view illustrating a portion indicated by dashed-two dotted line Y3-Y4 in FIG. 35B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In Embodiment 1, one embodiment of the present invention has been described. Other embodiments of the present invention will be described in Embodiments 2 to 5. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. For example, depending on circumstances or conditions, one of or both the transistors 51a and 52a do not necessarily include an oxide semiconductor in the active layer.

This embodiment can be implemented in appropriate combination with any of the structures described in the other embodiments.

Embodiment 2

In this embodiment, a transistor including an oxide semiconductor that can be used in one embodiment of the present invention will be described with reference to drawings. In the drawings in this embodiment, some components are enlarged, reduced in size, or omitted for easy understanding.

Figure 38A:
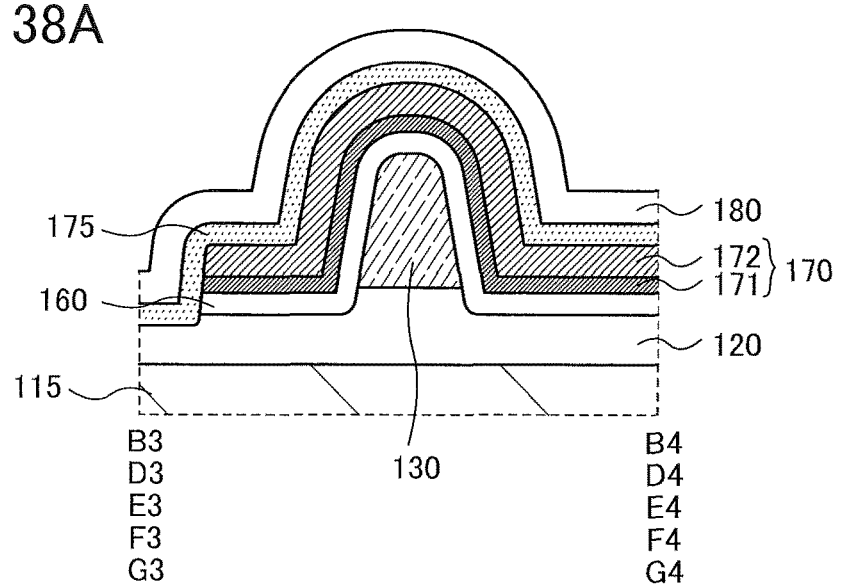
FIGS. 38A to 38D each illustrate a cross section of a transistor in a channel width direction.
Figure 38B:
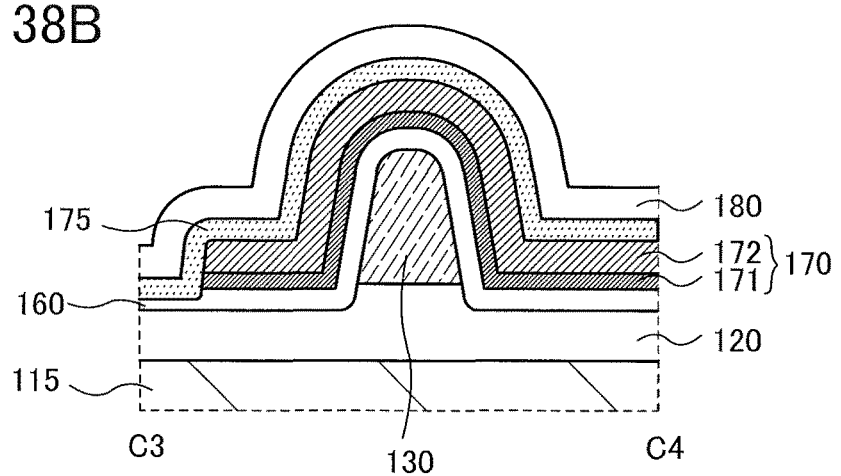

FIGS. 36A and 36B are a top view and a cross-sectional view illustrating a transistor 101 of one embodiment of the present invention. FIG. 36A is the top view, and FIG. 36B illustrates a cross section taken along dashed-dotted line B1-B2 in FIG. 36A. A cross section in the direction of dashed-dotted line B3-B4 in FIG. 36A is illustrated in FIG. 38A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 36B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

The transistor in one embodiment of the present invention may have a structure illustrated in FIGS. 36C and 36D. FIG. 36C is a top view of a transistor 102. A cross section in the direction of dashed-dotted line C1-C2 in FIG. 36C is illustrated in FIG. 36D. A cross section in the direction of dashed-dotted line C3-C4 in FIG. 36C is illustrated in FIG.

38B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

The transistor in one embodiment of the present invention may have a structure illustrated in FIGS. 36E and 36F. FIG. 36E is a top view of a transistor 103. A cross section in the direction of dashed-dotted line D1-D2 in FIG. 36E is illustrated in FIG. 36F. A cross section in the direction of dashed-dotted line D3-D4 in FIG. 36E is illustrated in FIG. 38A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 36F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 37A:
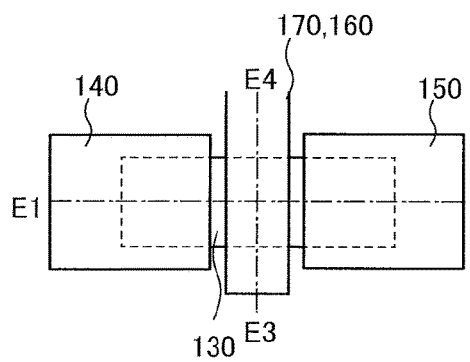
FIGS. 37A to 37F are top views and cross-sectional views illustrating transistors.
Figure 37B:
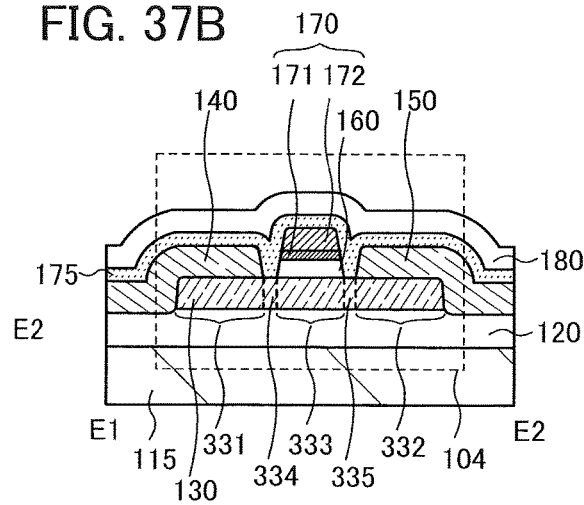

The transistor in one embodiment of the present invention may have a structure illustrated in FIGS. 37A and 37B. FIG. 37A is a top view of a transistor 104. A cross section in the direction of dashed-dotted line E1-E2 in FIG. 37A is illustrated in FIG. 37B. A cross section in the direction of dashed-dotted line E3-E4 in FIG. 37A is illustrated in FIG. 38A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 37B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 37C:
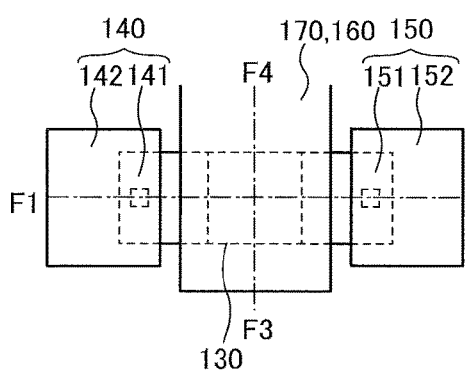
Figure 37D:
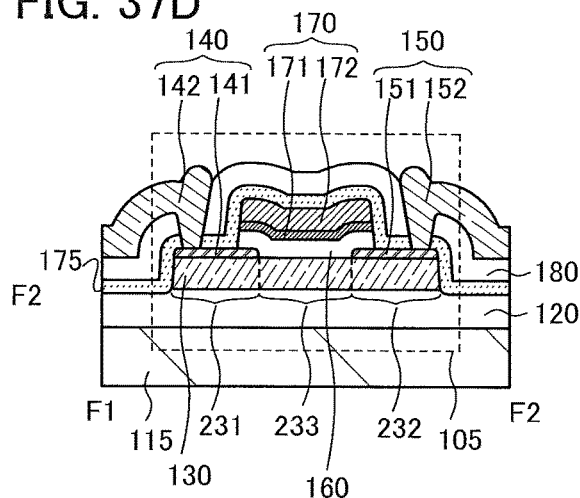

The transistor in one embodiment of the present invention may have a structure illustrated in FIGS. 37C and 37D. FIG. 37C is a top view of a transistor 105. A cross section in the direction of dashed-dotted line F1-F2 in FIG. 37C is illustrated in FIG. 37D. A cross section in the direction of dashed-dotted line F3-F4 in FIG. 37C is illustrated in FIG. 38A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 37E:
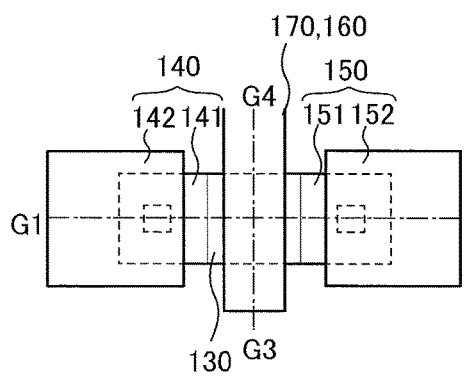
Figure 37F:
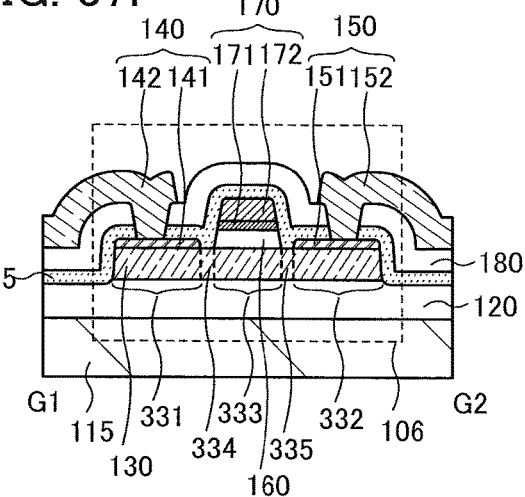

The transistor in one embodiment of the present invention may have a structure illustrated in FIGS. 37E and 37F. FIG. 37E is a top view of a transistor 106. A cross section in the direction of dashed-dotted line G1-G2 in FIG. 37E is illustrated in FIG. 37F. A cross section in the direction of dashed-dotted line G3-G4 in FIG. 37A is illustrated in FIG. 38A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 38C:
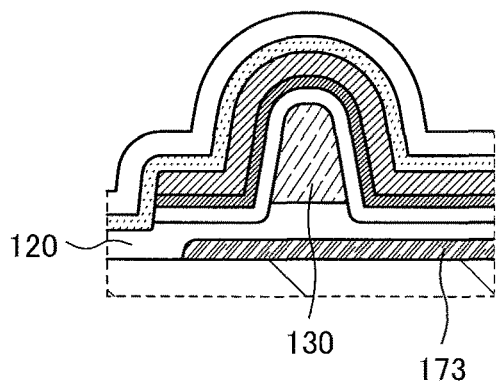
Figure 38D:
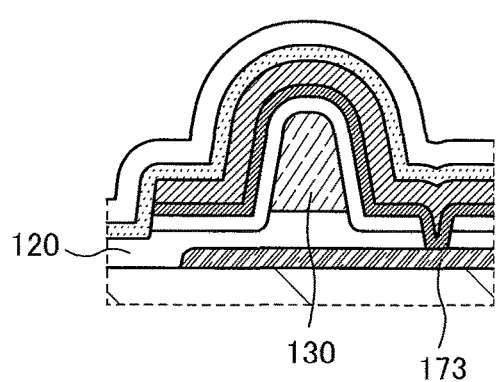
Figure 39A:
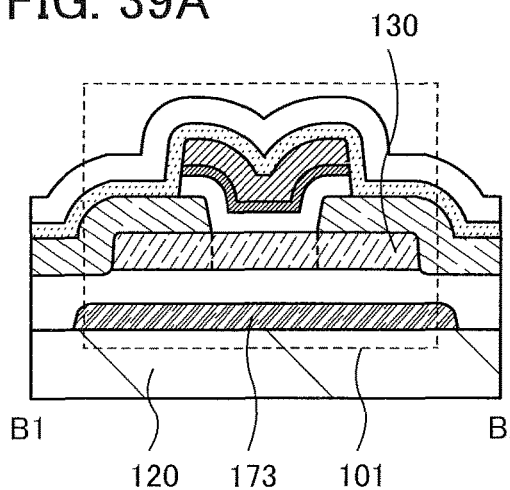
FIGS. 39A to 39F each illustrate a cross section of a transistor in a channel length direction.
Figure 39B:
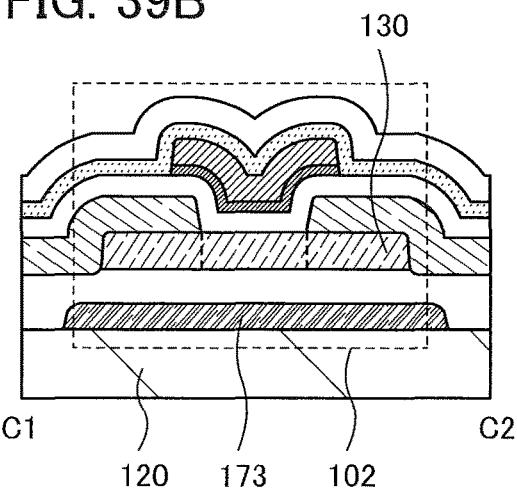
Figure 39C:
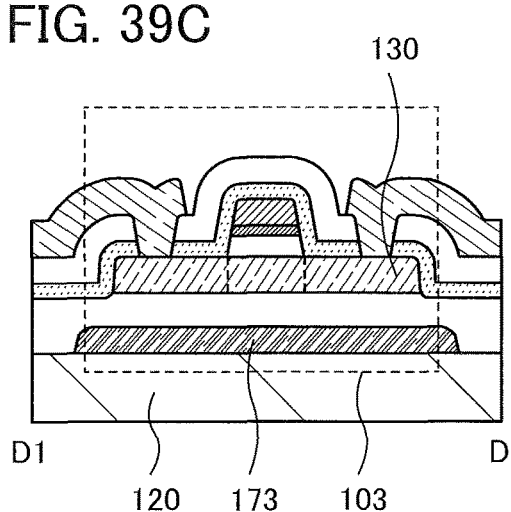
Figure 39D:
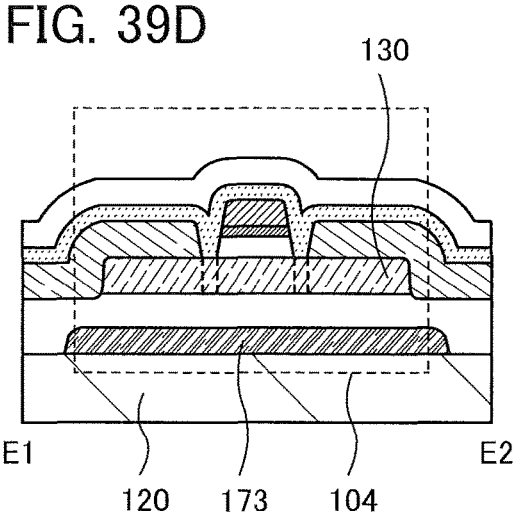
Figure 39E:
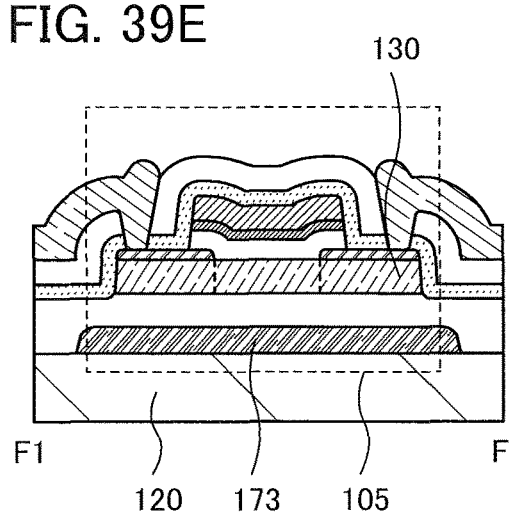
Figure 39F:
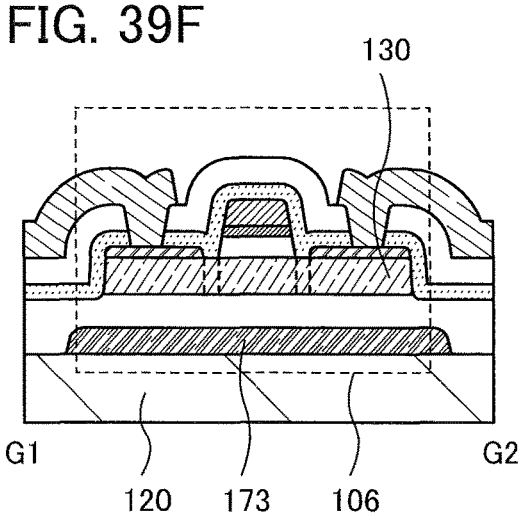

The transistor in one embodiment of the present invention may include a conductive layer 173 between the oxide semiconductor layer 130 and the substrate 115 as illustrated in cross-sectional views in the channel length direction in FIGS. 39A to 39F and cross-sectional views in the channel width direction in FIGS. 38C and 38D. When the conductive layer 173 is used as a second gate electrode layer (back gate), the on-state current can be increased or the threshold voltage can be controlled. In the cross-sectional views in FIGS. 39A to 39F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 38D, the conductive layers 170 and 173 may be electrically connected to each other through a contact hole.

Although the transistors 101 to 106 in FIGS. 36A to 36F and FIGS. 37A to 37F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 40B and 40C or FIGS. 40D and 40E.

Figure 40A:
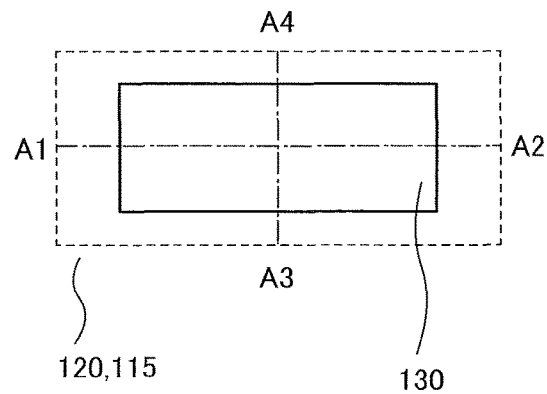
FIGS. 40A to 40E are a top view and cross-sectional views illustrating semiconductor layers.
Figure 40B:
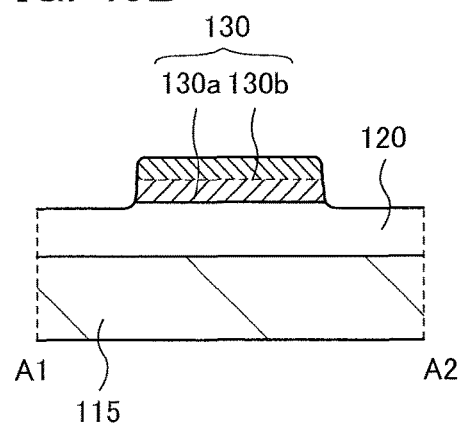
Figure 40D:
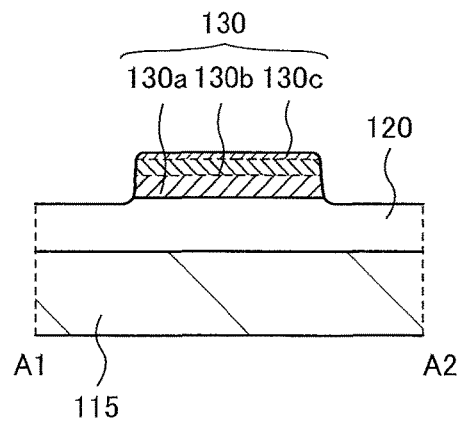
Figure 40C:
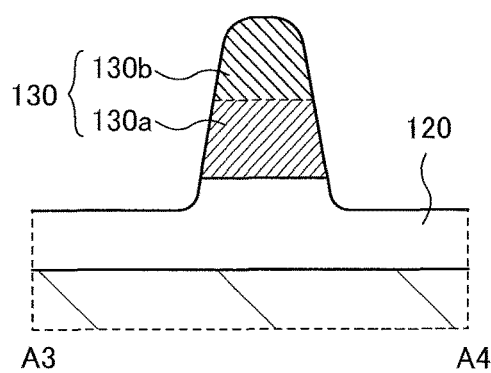
Figure 40E:
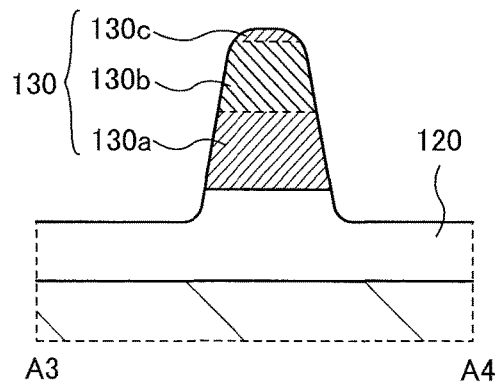

FIG. 40A is a top view of the oxide semiconductor layer 130, and FIGS. 40B and 40C are cross-sectional views of the oxide semiconductor layer 130 with a two-layer structure. FIGS. 40D and 40E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 41A:
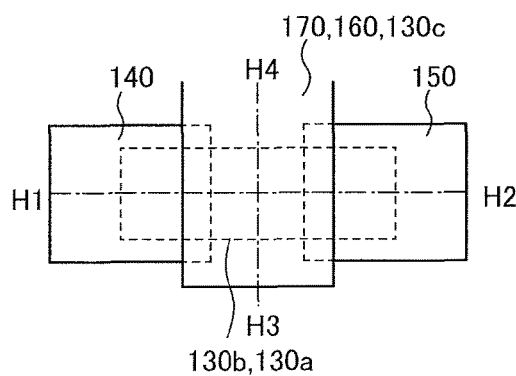
FIGS. 41A to 41F are top views and cross-sectional views illustrating transistors.
Figure 41B:
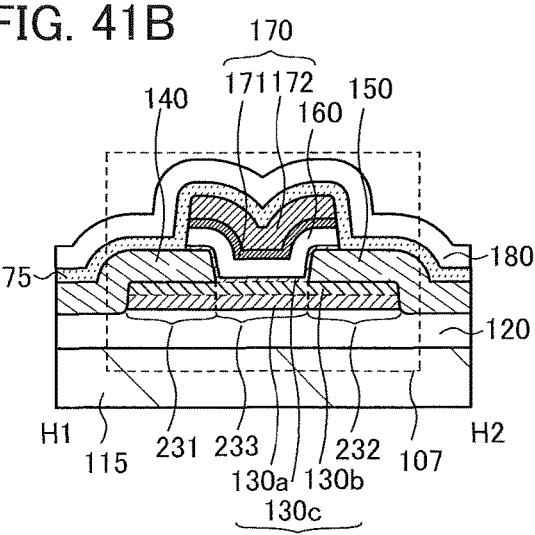
Figure 43A:
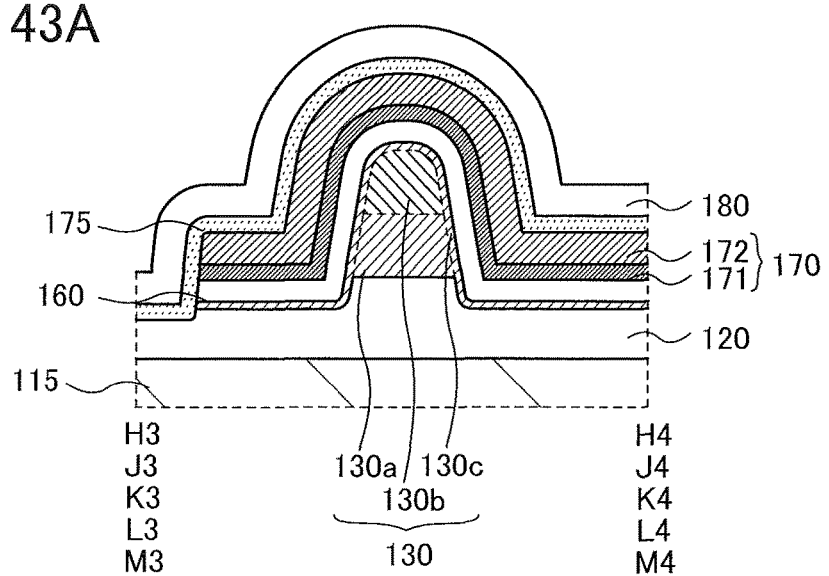
FIGS. 43A to 43D each illustrate a cross section of a transistor in a channel width direction.

The transistor in one embodiment of the present invention may have a structure illustrated in FIGS. 41A and 41B. FIG. 41A is a top view of a transistor 107. A cross section in the direction of dashed-dotted line H1-H2 in FIG. 41A is illustrated in FIG. 41B. A cross section in the direction of dashed-dotted line H3-H4 in FIG. 41A is illustrated in FIG. 43A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 41C:
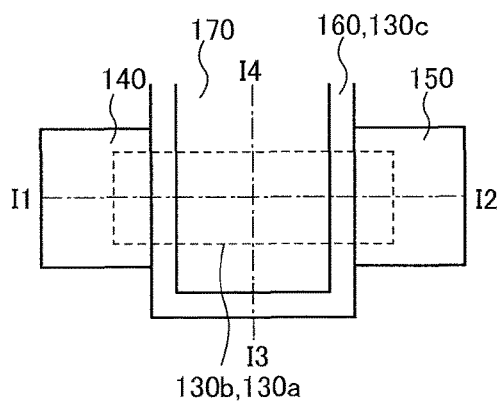
Figure 41D:
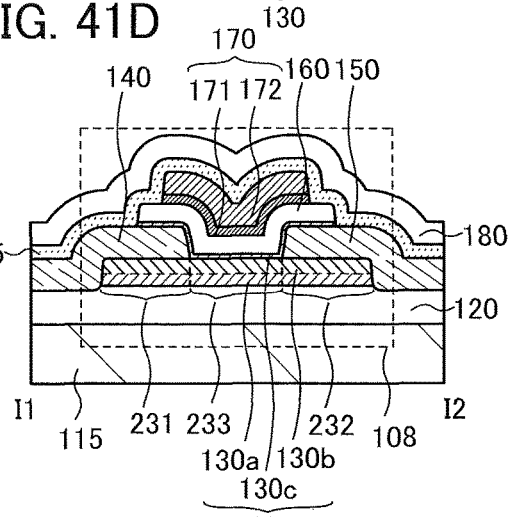
Figure 43B:
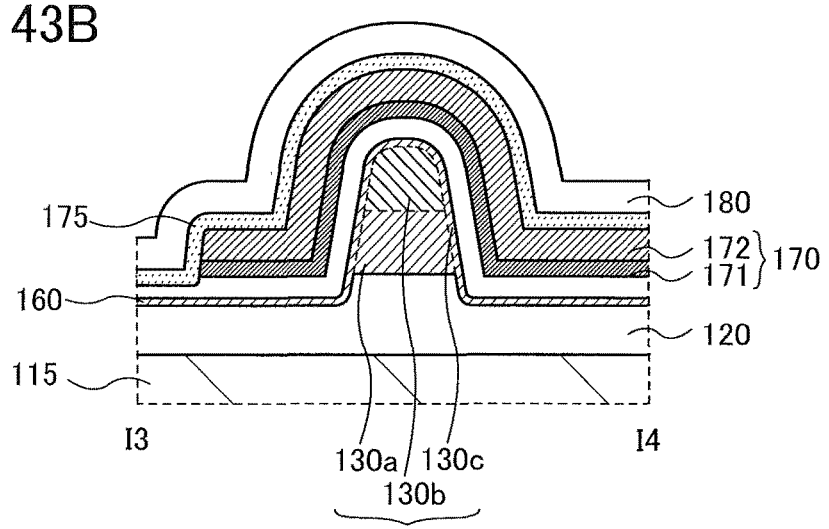

The transistor in one embodiment of the present invention may have a structure illustrated in FIGS. 41C and 41D. FIG. 41C is a top view of a transistor 108. A cross section in the direction of dashed-dotted line I1-I2 in FIG. 41C is illustrated in FIG. 41D. A cross section in the direction of dashed-dotted line I3-I4 in FIG. 41C is illustrated in FIG. 43B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 41E:
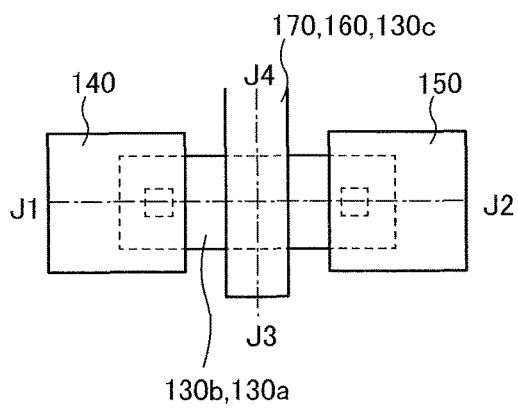
Figure 41F:
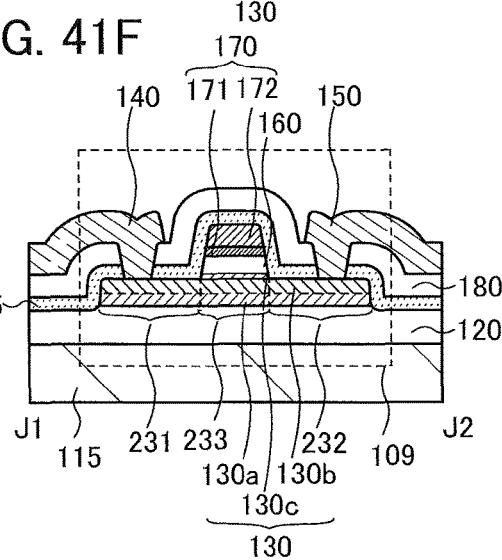

The transistor in one embodiment of the present invention may have a structure illustrated in FIGS. 41E and 41F. FIG. 41E is a top view of a transistor 109. A cross section in the direction of dashed-dotted line J1-J2 in FIG. 41E is illustrated in FIG. 41F. A cross section in the direction of dashed-dotted line J3-J4 in FIG. 41E is illustrated in FIG. 43A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 42A:
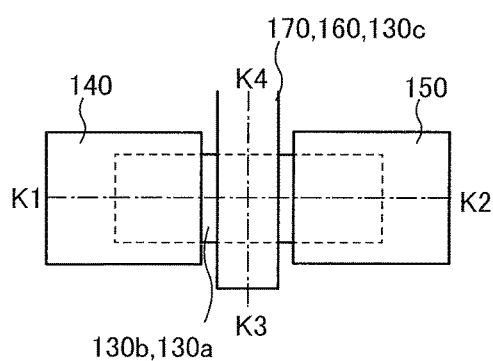
FIGS. 42A to 42F are top views and cross-sectional views illustrating transistors.
Figure 42B:
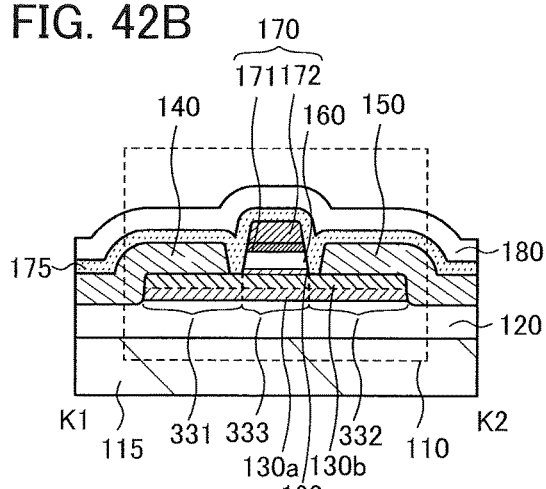

The transistor in one embodiment of the present invention may have a structure illustrated in FIGS. 42A and 42B. FIG. 42A is a top view of a transistor 110. A cross section in the direction of dashed-dotted line K1-K2 in FIG. 42A is illustrated in FIG. 42B. A cross section in the direction of dashed-dotted line K3-K4 in FIG. 42A is illustrated in FIG. 43A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 42C:
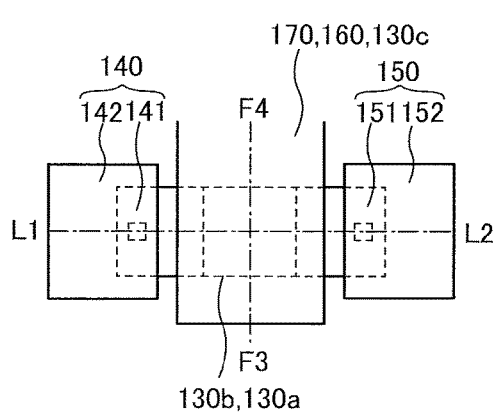
Figure 42D:
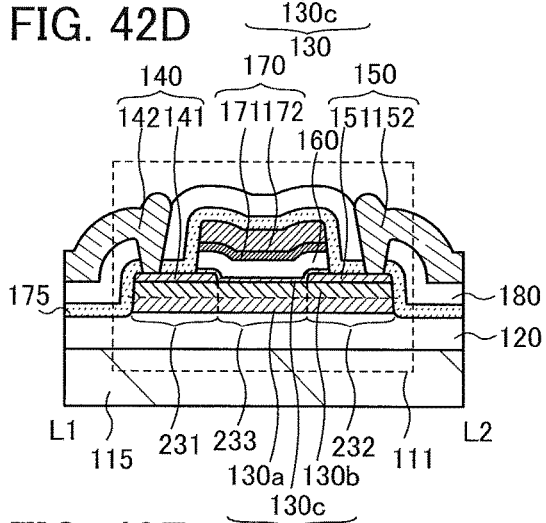

The transistor in one embodiment of the present invention may have a structure illustrated in FIGS. 42C and 42D. FIG. 42C is a top view of a transistor 111. A cross section in the direction of dashed-dotted line K1-K2 in FIG. 42C is illustrated in FIG. 42D. A cross section in the direction of dashed-dotted line K3-K4 in FIG. 42C is illustrated in FIG. 43A. The direction of dashed-dotted line K1-K2 is referred to as a channel length direction, and the direction of dashed-dotted line K3-K4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 42E:
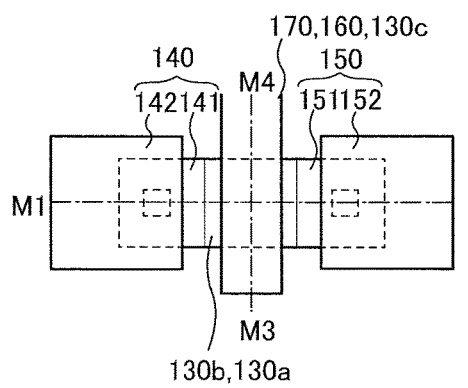
Figure 42F:
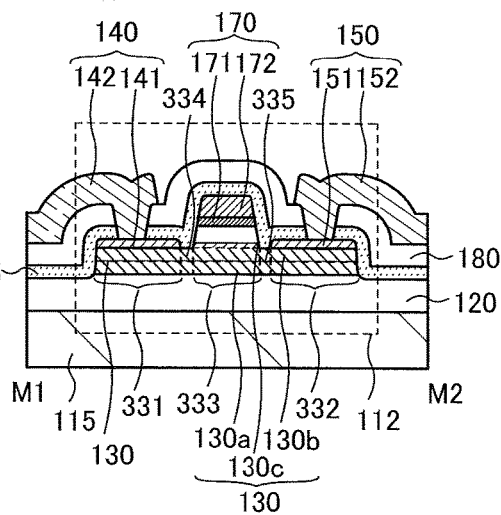

The transistor in one embodiment of the present invention may have a structure illustrated in FIGS. 42E and 42F. FIG. 42E is a top view of a transistor 112. A cross section in the direction of dashed-dotted line M1-M2 in FIG. 42E is illustrated in FIG. 42F. A cross section in the direction of dashed-dotted line M3-M4 in FIG. 42E is illustrated in FIG. 43A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 43C:
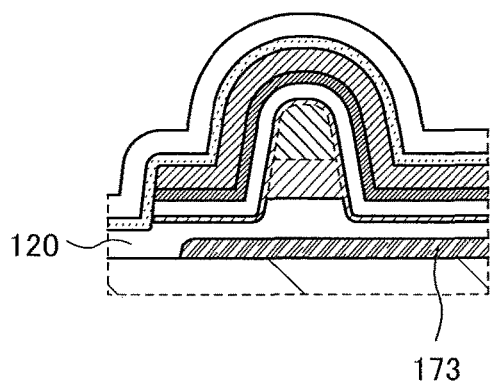
Figure 43D:
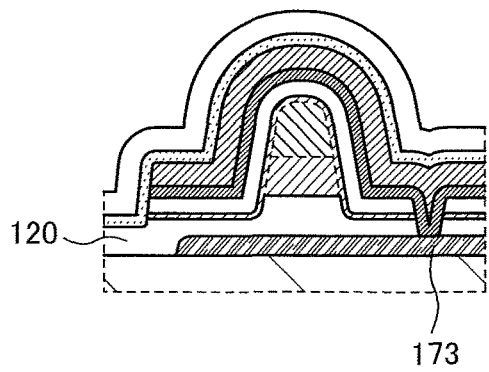
Figure 44A:
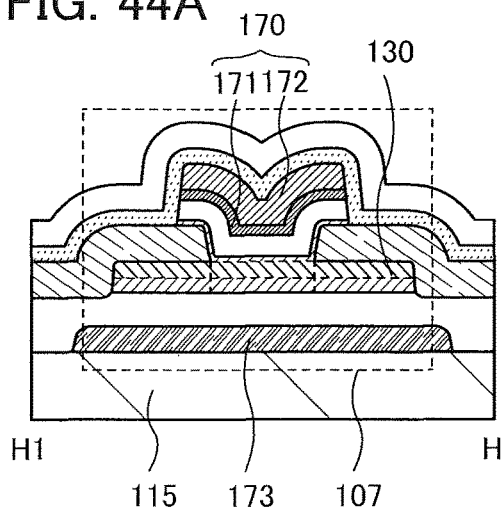
FIGS. 44A to 44F each illustrate a cross section of a transistor in a channel length direction.
Figure 44B:
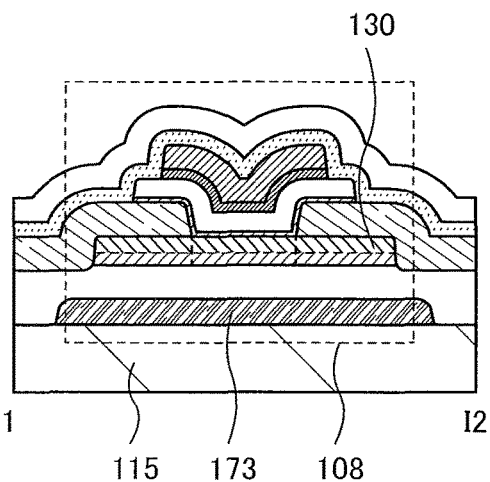
Figure 44C:
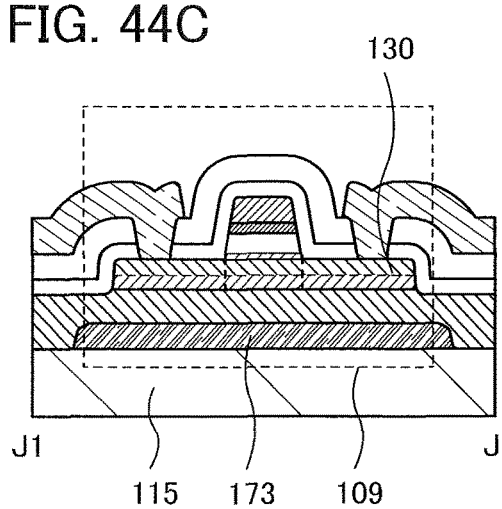
Figure 44D:
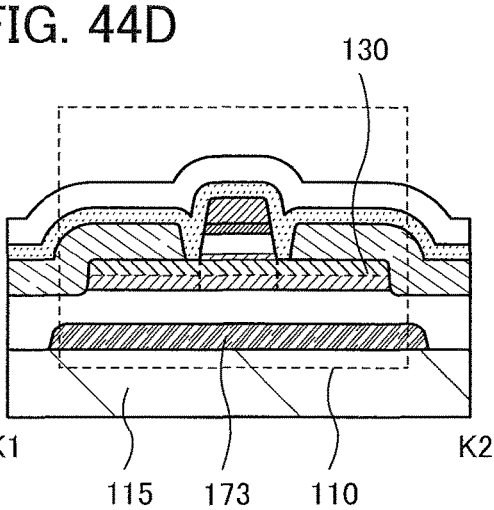
Figure 44E:
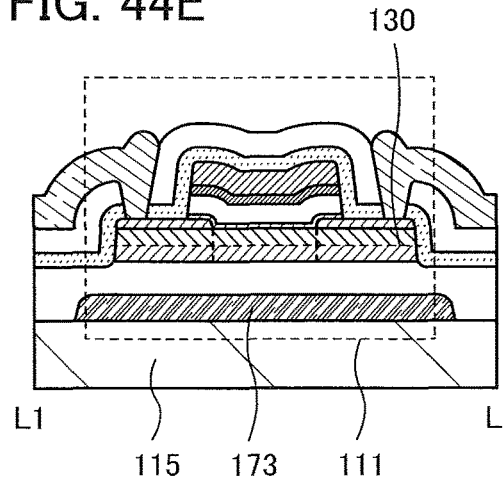
Figure 44F:
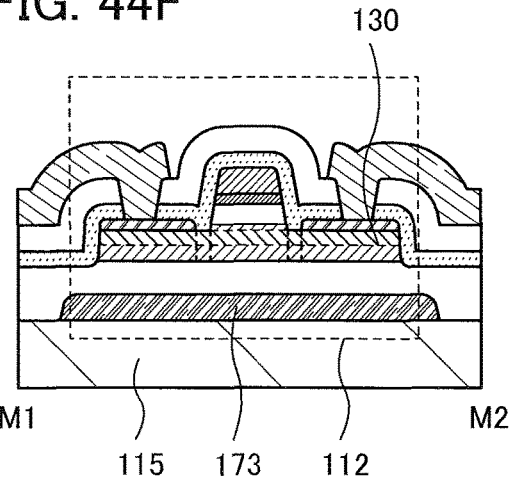

The transistor in one embodiment of the present invention may include the conductive layer 173 between the oxide semiconductor layer 130 and the substrate 115 as illustrated in cross-sectional views in the channel length direction in FIGS. 44A to 44F and cross-sectional views in the channel width direction in FIGS. 43C and 43D. When the conductive layer is used as a second gate electrode layer (back gate), the on-state current can be further increased or the threshold voltage can be controlled. In the cross-sectional views in FIGS. 44A to 44F, the width of the conductive layer 173 may be shorter than that of the oxide semiconductor layer 130. Moreover, the width of the conductive layer 173 may be shorter than that of the conductive layer 170.

Figure 45A:
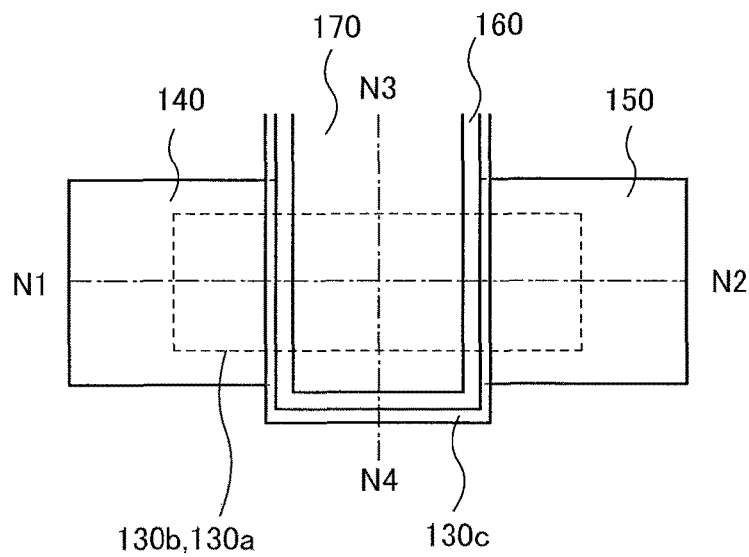
FIGS. 45A and 45B are a top view and cross-sectional views illustrating a transistor.
Figure 45B:
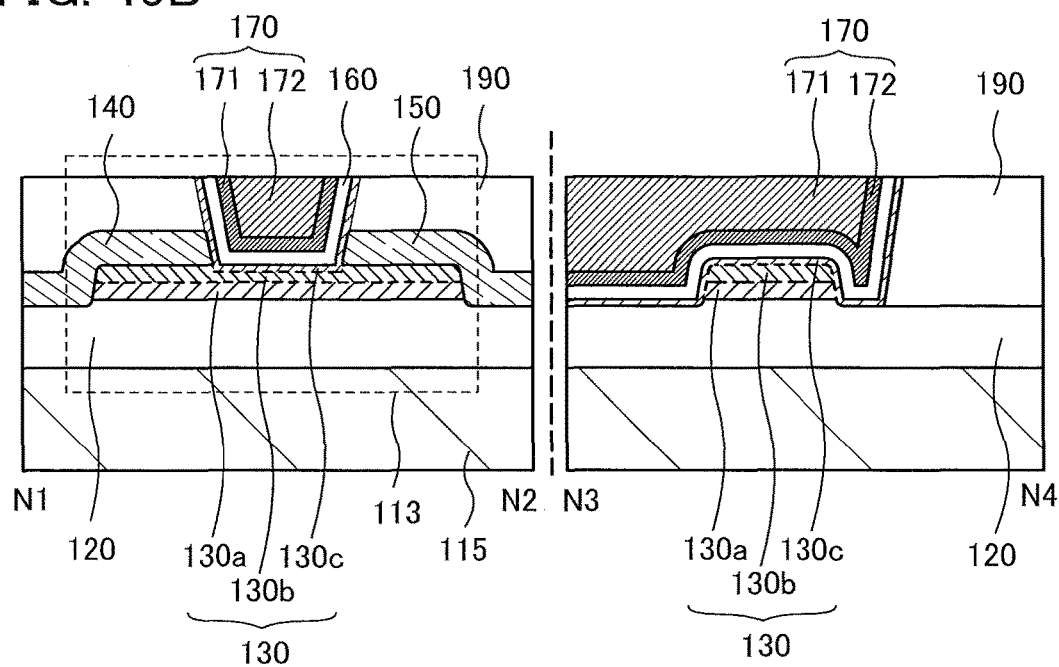

The transistor in one embodiment of the present invention may have a structure illustrated in FIGS. 45A and 45B. FIG. 45A is a top view and FIG. 45B is a cross-sectional view taken along dashed-dotted line N1-N2 and dashed-dotted line N3-N4 in FIG. 45A. Note that for simplification of the drawing, some components are not illustrated in the top view in FIG. 45A.

A transistor 113 illustrated in FIGS. 45A and 45B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 which are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening which is provided in the insulating layer 190 over the transistor 113 and reaches the oxide semiconductor layers 130a and 130b and the insulating layer 120.

The transistor 113 has a smaller region in which a conductor serving as a source electrode or a drain electrode overlaps with a conductor serving as a gate electrode than the other transistors described above; thus, the parasitic capacitance in the transistor 113 can be reduced. Therefore, the transistor 113 is preferable as a component of a circuit for which high-speed operation is needed. As illustrated in FIG. 45B, a top surface of the transistor 113 is preferably planarized by a chemical mechanical polishing (CMP) method or the like, but is not necessarily planarized.

Figure 46A:
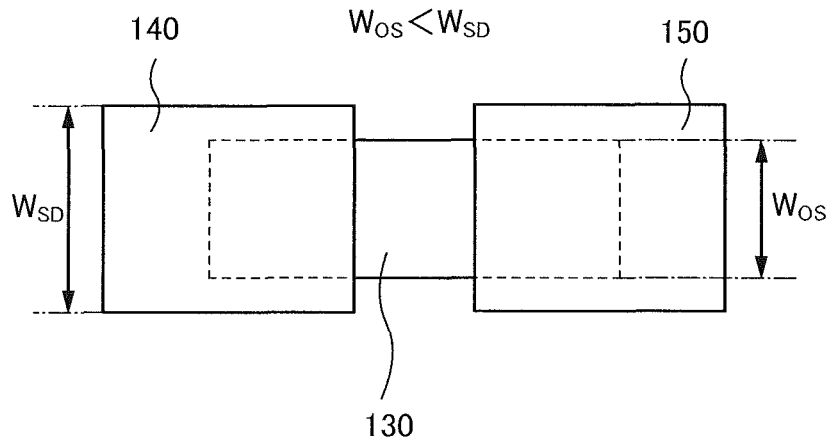
FIGS. 46A to 46C are top views each illustrating a transistor.
Figure 46B:
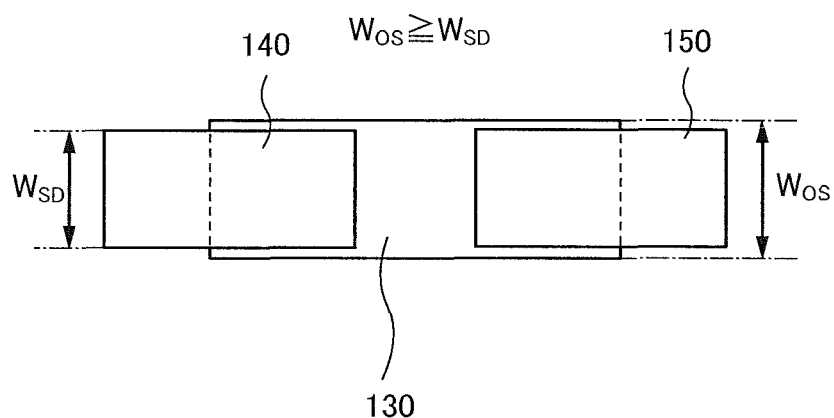
Figure 46C:
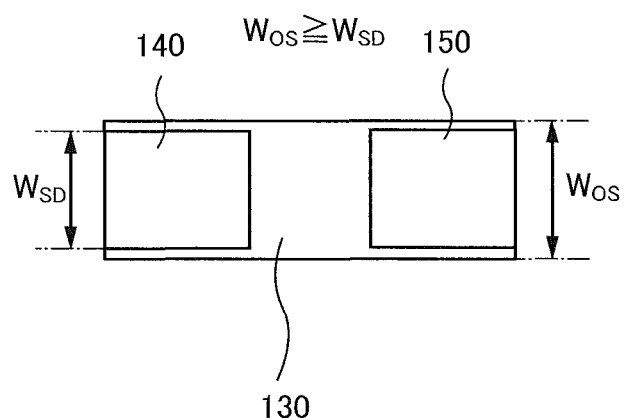

As shown in the top views in FIGS. 46A and 46B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 46C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Thus, increasing the thickness of the oxide semiconductor layer 130b improves the on-state current in some cases.

A semiconductor device including a transistor with any of the above structures can have favorable electrical characteristics.

The structures described in this embodiment can be used in appropriate combination with any of the structures described in the other embodiments.

Embodiment 3

In this embodiment, components of the transistors described in Embodiment 2 will be described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n$^-$-type conductivity is preferably used. Alternatively, an SOI substrate including an n$^-$-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm$^3$ or more in thermal desorption spectroscopy (TDS) analysis performed such that the surface temperature of the film is higher than or equal to 100° C. and lower than or equal to 700° C., preferably higher than or equal to 100° C. and lower than or equal to 500° C. In the case where the substrate 115 is provided with another device, the insulating layer 120 also has a function as an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b described in this embodiment are sequentially stacked from the insulating layer 120 side is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, further preferably 3 times or more as large as that in the oxide semiconductor layer 130b.

Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 130a to 130c is an In—M—Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, more preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, more preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1 \times 10^{15}/cm^3$, preferably lower than $1 \times 10^{13}/cm^3$, further preferably lower than $8 \times 10^{11}/cm^3$, still further preferably lower than $1 \times 10^8/cm^3$, and higher than or equal to $1 \times 10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably and lower than or equal to $5 \times 10^{18}$ atoms/cm$^3$ and is higher than or equal to $1 \times 10^{17}$ atoms/cm$^3$. In addition, the oxide semiconductor layer is controlled to have a region in which the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$ and is higher than or equal to $5 \times 10^{16}$ atoms/cm$^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1 \times 10^{19}$ atoms/cm$^3$, preferably lower than $5 \times 10^{18}$ atoms/cm$^3$ and is higher than or equal to $1 \times 10^{18}$ atoms/cm$^3$. Furthermore, the oxide semiconductor layer is controlled to have a region in which the concentration of carbon is lower than $1 \times 10^{19}$ atoms/cm$^3$, preferably lower than $5 \times 10^{18}$ atoms/cm$^3$, more preferably lower than $1 \times 10^{18}$ atoms/cm$^3$ and is higher than or equal to $6 \times 10^{17}$ atoms/cm$^3$.

As described above, a transistor in which a highly purified oxide semiconductor film is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, or 3:1:2 can be used for the oxide semiconductor layer 130b. In the case where each of the oxide semiconductor layers 130a to 130c is formed using the above oxide as a sputtering target, the obtained oxide semiconductor layers 130a to 130c do not necessarily have the same atomic ratio.

The oxide semiconductor layer 130b of the oxide semiconductor layer 130 serves as a well, so that a channel is formed in the oxide semiconductor layer 130b. Since the conduction band minimums are continuous, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in the positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an interface state is less likely to be formed. In the transistor in one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn'O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 4

A structure of an oxide semiconductor film that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an $InGaZnO_4$ crystal by an out-of-plane method, another peak may appear when 2θ is around 36°, in addition to the peak at 2θ of around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have low carrier density. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics.

In a transistor using the CAAC-OS film, change in electric characteristics of the transistor due to irradiation with visible light or ultraviolet light is small.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a crystal grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method with an XRD apparatus using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Furthermore, in a nanobeam electron diffraction pattern of the nc-OS film, circumferentially distributed spots are observed in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

Note that an oxide semiconductor film may be a stacked film including two or more films of an amorphous oxide semiconductor film, an a-like OS film, a microcrystalline oxide semiconductor film, and a CAAC-OS film, for example.

The structures described in this embodiment can be used in appropriate combination with any of the structures described in the other embodiments.

Embodiment 5

An imaging device of one embodiment of the present invention or a semiconductor device including the imaging device can be used for display devices, personal computers, or image reproducing devices provided with recording media (typically, devices that reproduce the content of recording media such as digital versatile discs (DVD) and have displays for displaying the reproduced images). Further, as electronic devices that can include the imaging device of one embodiment of the present invention or the semiconductor device including the imaging device, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 47A to 47F illustrate specific examples of these electronic devices.

Figure 47A:
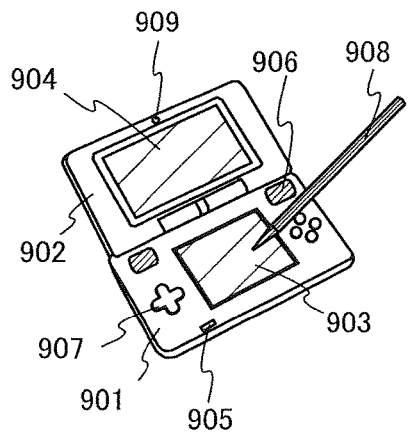
FIGS. 47A to 47F illustrate electronic devices.

FIG. 47A illustrates a portable game machine, which includes a housing 901, a housing 902, a display portion 903, a display portion 904, a microphone 905, speakers 906, an operation key 907, a stylus 908, a camera 909, and the like. Although the portable game machine in FIG. 47A has the two display portions 903 and 904, the number of display portions in the portable game machine is not limited to two. The imaging device of one embodiment of the present invention can be used for the camera 909.

Figure 47B:
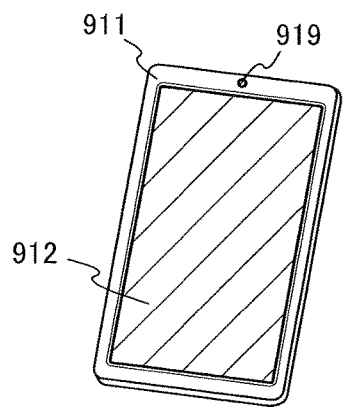

FIG. 47B illustrates a portable information terminal, which includes a first housing 911, a display portion 912, a camera 919, and the like. The touch panel function of the display portion 912 enables input and output of information. The imaging device of one embodiment of the present invention can be used for the camera 919.

Figure 47C:
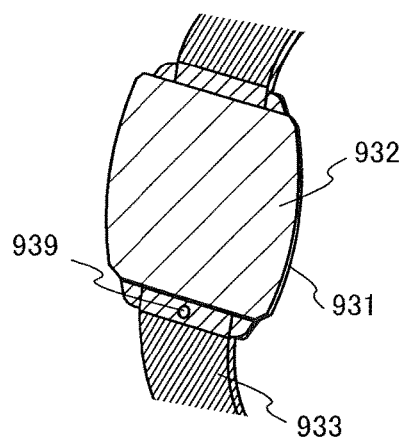

FIG. 47C illustrates a wrist-watch-type information terminal, which includes a housing 931, a display portion 932, a wristband 933, a camera 939, and the like. The display portion 932 may be a touch panel. The imaging device of one embodiment of the present invention can be used for the camera 939.

Figure 47D:
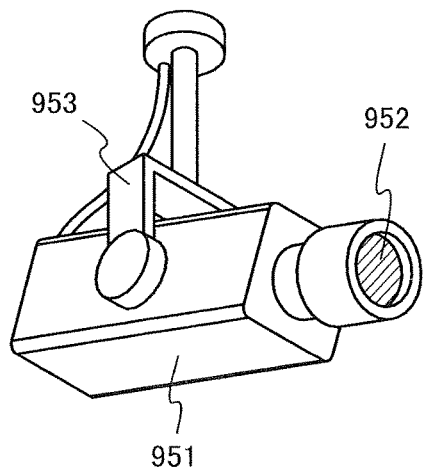

FIG. 47D illustrates a monitoring camera, which includes a housing 951, a lens 952, a support portion 953, and the like. The imaging device of one embodiment of the present invention can be provided in a focus position of the lens 952.

Figure 47E:
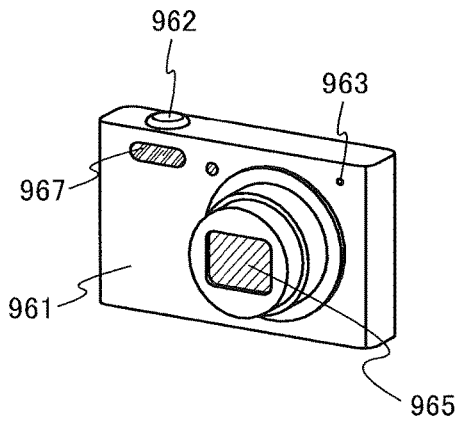

FIG. 47E illustrates a digital camera, which includes a housing 961, a shutter button 962, a microphone 963, a light-emitting portion 967, a lens 965, and the like. The imaging device of one embodiment of the present invention can be provided in a focus position of the lens 965.

Figure 47F:
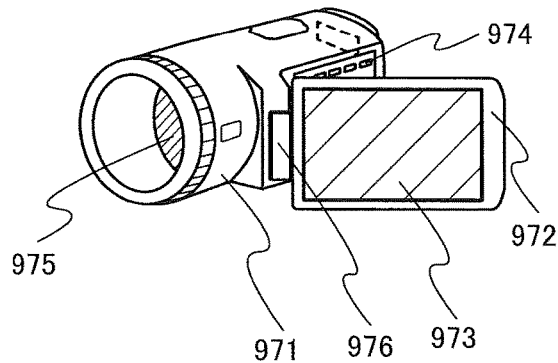

FIG. 47F illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The first housing 971 and the second housing 972 are connected to each other with the joint 976, and an angle between the first housing 971 and the second housing 972 can be changed with the joint 976. Images displayed on the display portion 973 may be switched in accordance with the angle between the first housing 971 and the second housing 972 at the joint 976. The imaging device of one embodiment of the present invention can be provided in a focus position of the lens 975.

This embodiment can be combined with any of the other embodiments in this specification as appropriate.

This application is based on Japanese Patent Application serial no. 2015-060317 filed with Japan Patent Office on Mar. 24, 2015, the entire contents of which are hereby incorporated by reference.

What is claimed is:

1. An imaging device comprising:
   a first circuit; and
   a second circuit,
   wherein the first circuit comprises:
      a first transistor; and
      a first photoelectric conversion element,
   wherein one of electrodes of the first photoelectric conversion element is electrically connected to one of a source electrode and a drain electrode of the first transistor,
   wherein the second circuit comprises:
      a second transistor;
      a second photoelectric conversion element; and a node directly connected to one of electrodes of the second photoelectric conversion element, one of a source electrode and a drain electrode of the second transistor, and a gate electrode of the second transistor, wherein each of the first photoelectric conversion element and the second photoelectric conversion element is configured to convert received light into an electrical signal, and wherein a gate electrode of the first transistor is electrically connected to the gate electrode of the second transistor.

2. The imaging device according to claim 1, wherein the second circuit is shielded from light.

3. The imaging device according to claim 1, wherein the first transistor and the second transistor each include an oxide semiconductor in an active layer, wherein the oxide semiconductor contains In, Zn, and M, and wherein M is Al, Ti, Ga, Sn, Y, Zr, La, Ce, Nd, or Hf.

4. The imaging device according to claim 1, wherein the first photoelectric conversion element and the second photoelectric conversion element each include a material containing selenium.

5. An electronic device comprising:
the imaging device according to claim 1; and
a display device.

6. An imaging device comprising:
a first circuit; and
a second circuit,
wherein the first circuit comprises:
    a first transistor; and
    a first photoelectric conversion element,
wherein one of electrodes of the first photoelectric conversion element is electrically connected to one of a source electrode and a drain electrode of the first transistor,
wherein the second circuit comprises:
    a second transistor;
    a second photoelectric conversion element; and
    a node directly connected to one of electrodes of the second photoelectric conversion element, one of a source electrode and a drain electrode of the second transistor, and a gate electrode of the second transistor,
wherein each of the first photoelectric conversion element and the second photoelectric conversion element is configured to convert received light into an electrical signal,
wherein a gate electrode of the first transistor is electrically connected to the gate electrode of the second transistor, and
wherein the first transistor and the second transistor each include an oxide semiconductor in an active layer.

7. The imaging device according to claim 6, wherein the second circuit is shielded from light.

8. The imaging device according to claim 6, wherein the oxide semiconductor contains In and Zn.

9. The imaging device according to claim 6, wherein the first photoelectric conversion element and the second photoelectric conversion element each include a material containing selenium.

10. An electronic device comprising:
the imaging device according to claim 6; and
a display device.

11. The imaging device according to claim 6, wherein the oxide semiconductor contains In, Zn, and M, and
wherein M is Al, Ti, Ga, Sn, Y, Zr, La, Ce, Nd, or Hf.

12. An imaging device comprising:
a plurality of first circuits; and
a plurality of second circuits,
wherein each of the plurality of first circuits comprises:
    a first transistor; and
    a first photoelectric conversion element,
wherein one of electrodes of the first photoelectric conversion element is electrically connected to one of a source electrode and a drain electrode of the first transistor,
wherein each of the plurality of second circuits comprises:
    a second transistor;
    a second photoelectric conversion element; and
    a node directly connected to one of electrodes of the second photoelectric conversion element, one of a source electrode and a drain electrode of the second transistor, and a gate electrode of the second transistor,
wherein each of the first photoelectric conversion element and the second photoelectric conversion element is configured to convert received light into an electrical signal,
wherein a gate electrode of the first transistor of the first circuit arranged in the k-th row is electrically connected to the gate electrode of the second transistor of the second circuit arranged in the k-th row,
wherein the plurality of first circuits and the plurality of second circuits are arranged in a matrix of m rows and n columns,
wherein the plurality of first circuits are positioned in the second column to the (n−1)-th column,
wherein the plurality of second circuits are positioned in the first column, and
wherein m is a natural number greater than or equal to 1, n is a natural number greater than or equal to 3, and k is a natural number greater than or equal to 1 and smaller than or equal to m.

13. The imaging device according to claim 12, wherein the plurality of second circuits are shielded from light.

14. The imaging device according to claim 12, wherein the first transistor and the second transistor each include an oxide semiconductor in an active layer, wherein the oxide semiconductor contains In, Zn, and M, and
wherein M is Al, Ti, Ga, Sn, Y, Zr, La, Ce, Nd, or Hf.

15. The imaging device according to claim 12, wherein the first photoelectric conversion element and the second photoelectric conversion element each include a material containing selenium.

16. An electronic device comprising:
the imaging device according to claim 12; and
a display device.

* * * * *